US011128179B2

(12) United States Patent
Hajimiri et al.

(10) Patent No.: US 11,128,179 B2
(45) Date of Patent: Sep. 21, 2021

(54) LARGE-SCALE SPACE-BASED SOLAR POWER STATION: POWER TRANSMISSION USING STEERABLE BEAMS

(71) Applicant: California Institute of Technology, Pasadena, CA (US)

(72) Inventors: Seyed Ali Hajimiri, La Canada, CA (US); Harry A. Atwater, South Pasadena, CA (US); Sergio Pellegrino, Pasadena, CA (US); Behrooz Abiri, Pasadena, CA (US); Florian Bohn, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 331 days.

(21) Appl. No.: 14/712,856

(22) Filed: May 14, 2015

(65) Prior Publication Data

US 2016/0380486 A1 Dec. 29, 2016

Related U.S. Application Data

(60) Provisional application No. 61/993,016, filed on May 14, 2014, provisional application No. 61/993,025, (Continued)

(51) Int. Cl.
*B64G 1/10* (2006.01)
*B64G 1/42* (2006.01)
(Continued)

(52) U.S. Cl.
CPC ............ *H02J 50/80* (2016.02); *B64G 1/1085* (2013.01); *B64G 1/222* (2013.01); *B64G 1/428* (2013.01);
(Continued)

(58) Field of Classification Search
CPC .......... B64G 1/44; B64G 1/401; B64G 1/403; B64G 1/405; B64G 1/406; B64G 1/407;
(Continued)

(56) References Cited

U.S. PATENT DOCUMENTS 2,599,944 A 6/1952 Salisbury et al.
3,152,260 A 10/1964 Cummings
(Continued)

FOREIGN PATENT DOCUMENTS

CA 2833826 A1 11/2012
CA 2833862 A1 5/2014
(Continued)

OTHER PUBLICATIONS

International Search Report and Written Opinion for International Application No. PCT/US2015/030895, completed Nov. 27, 2015, dated Nov. 30, 2015,14 Pgs.
(Continued)

*Primary Examiner* — Patrick C Chen
(74) *Attorney, Agent, or Firm* — KPPB LLP

(57) ABSTRACT

A space-based solar power station, a power generating satellite module and/or a method for collecting solar radiation and transmitting power generated using electrical current produced therefrom is provided. Power transmitters can be coordinated as a phased array and the power generated by the phased array is transmitted to one or more power receivers to achieve remote wireless power generation and delivery. In many embodiments, a reference signal is distributed within the space-based solar power station to coordinate the phased array. In several embodiments, determinations of the relative locations of the antennas in the array are utilized to evaluate the phase shift and/or amplitude modulation to apply the reference signal at each power transmitter.

20 Claims, 32 Drawing Sheets

Related U.S. Application Data filed on May 14, 2014, provisional application No. 61/993,957, filed on May 15, 2014, provisional application No. 61/993,037, filed on May 14, 2014, provisional application No. 62/006,604, filed on Jun. 2, 2014, provisional application No. 62/120,650, filed on Feb. 25, 2015, provisional application No. 62/161,076, filed on May 13, 2015.

(51) Int. Cl.

| | | |
|---|---|---|
| *H02S 20/30* | (2014.01) | |
| *H02S 40/00* | (2014.01) | |
| *H02S 40/30* | (2014.01) | |
| *H02J 50/90* | (2016.01) | |
| *H02J 50/80* | (2016.01) | |
| *B64G 1/44* | (2006.01) | |
| *B64G 1/66* | (2006.01) | |
| *B64G 1/22* | (2006.01) | |
| *H01L 31/042* | (2014.01) | |
| *H02S 30/20* | (2014.01) | |
| *H01L 31/041* | (2014.01) | |
| *H04B 7/185* | (2006.01) | |
| *H02J 50/23* | (2016.01) | |
| *H02J 50/40* | (2016.01) | |
| *H02J 3/38* | (2006.01) | |
| *H02J 3/46* | (2006.01) | |
| *B64G 1/40* | (2006.01) | |
| *B64G 1/28* | (2006.01) | |
| *B64G 1/36* | (2006.01) | |

(52) U.S. Cl.
CPC .............. *B64G 1/44* (2013.01); *B64G 1/443* (2013.01); *B64G 1/66* (2013.01); *H01L 31/041* (2014.12); *H01L 31/042* (2013.01); *H02J 3/383* (2013.01); *H02J 3/46* (2013.01); *H02J 50/23* (2016.02); *H02J 50/40* (2016.02); *H02J 50/90* (2016.02); *H02S 20/30* (2014.12); *H02S 30/20* (2014.12); *H02S 40/00* (2013.01); *H02S 40/30* (2014.12); *H04B 7/18515* (2013.01); *B64G 1/283* (2013.01); *B64G 1/286* (2013.01); *B64G 1/288* (2013.01); *B64G 1/36* (2013.01); *B64G 1/401* (2013.01); *B64G 1/403* (2013.01); *B64G 1/405* (2013.01); *B64G 1/406* (2013.01); *B64G 1/407* (2013.01); *B64G 2001/1092* (2013.01); *Y02E 10/52* (2013.01)

(58) Field of Classification Search
CPC ...... B64G 1/1085; B64G 1/222; B64G 1/428; B64G 1/443; B64G 1/66; B64G 1/283; B64G 1/286; B64G 1/288; B64G 1/36; H02J 50/23; H02J 50/90; H02J 50/40; H02J 50/80; H02J 3/46; H02J 3/383
USPC ........................................................ 307/104
See application file for complete search history.

(56) References Cited

U.S. PATENT DOCUMENTS

| | | |
|---|---|---|
| 3,419,433 A | 12/1968 | Slifer, Jr. |
| 3,427,200 A | 2/1969 | Lapin et al. |
| 3,433,677 A | 3/1969 | Robinson et al. |
| 3,437,527 A | 4/1969 | Webb |
| 3,457,427 A | 7/1969 | Tarneja et al. |
| 3,489,915 A | 1/1970 | Engelhardt et al. |
| 3,530,009 A | 9/1970 | Linkous et al. |
| 3,532,299 A | 10/1970 | Williamson et al. |
| 3,562,020 A | 2/1971 | Blevins |
| 3,611,652 A | 10/1971 | Rabenhorst et al. |
| 3,616,528 A | 11/1971 | Goldsmith et al. |
| 3,627,585 A | 12/1971 | Dollery et al. |
| 3,636,539 A | 1/1972 | Gaddy |
| 3,698,958 A | 10/1972 | Williamson et al. |
| 3,730,457 A | 5/1973 | Williams et al. |
| 3,735,943 A | 5/1973 | Fayet et al. |
| 3,758,051 A | 9/1973 | Williams |
| 3,781,647 A | 12/1973 | Glaser |
| 3,785,590 A | 1/1974 | Wentworth |
| 3,793,082 A | 2/1974 | Roger |
| 3,805,622 A | 4/1974 | Kinard |
| 3,809,337 A | 5/1974 | Andrews et al. |
| 3,817,477 A | 6/1974 | Luther et al. |
| 3,848,821 A | 11/1974 | Scheel |
| 3,863,870 A | 2/1975 | Andrews et al. |
| 3,952,324 A | 4/1976 | Wolff et al. |
| 3,989,994 A | 11/1976 | Brown |
| 4,078,747 A | 3/1978 | Minovitch |
| 4,116,258 A | 9/1978 | Slysh et al. |
| 4,133,501 A | 1/1979 | Pentlicki |
| 4,151,872 A | 5/1979 | Slysh et al. |
| 4,153,474 A | 5/1979 | Rex |
| 4,155,524 A | 5/1979 | Marello et al. |
| 4,166,919 A | 9/1979 | Carlson |
| 4,234,856 A | 11/1980 | Jung et al. |
| 4,282,394 A | 8/1981 | Lackey et al. |
| 4,328,389 A | 5/1982 | Stern et al. |
| 4,415,759 A | 11/1983 | Copeland et al. |
| 4,416,052 A | 11/1983 | Stern |
| 4,419,532 A | 12/1983 | Severns |
| 4,687,880 A | 8/1987 | Morris |
| 4,735,488 A | 4/1988 | Rancourt et al. |
| 4,780,726 A | 10/1988 | Archer et al. |
| 4,784,700 A | 11/1988 | Stern et al. |
| 4,789,989 A | 12/1988 | Stern et al. |
| 4,947,825 A | 8/1990 | Moriarty |
| 4,953,190 A | 8/1990 | Kukoleck et al. |
| 5,013,128 A | 5/1991 | Stern et al. |
| 5,114,101 A | 5/1992 | Stern et al. |
| 5,131,955 A | 7/1992 | Stern et al. |
| 5,154,777 A | 10/1992 | Blackmon et al. |
| 5,177,396 A | 1/1993 | Gielen et al. |
| 5,180,441 A | 1/1993 | Cornwall et al. |
| 5,226,107 A | 7/1993 | Stern et al. |
| 5,280,441 A | 1/1994 | Wada et al. |
| 5,309,925 A | 5/1994 | Policastro |
| 5,310,141 A | 5/1994 | Homer et al. |
| 5,337,980 A | 8/1994 | Homer et al. |
| 5,344,496 A | 9/1994 | Stern et al. |
| 5,404,868 A | 4/1995 | Sankrithi |
| 5,428,483 A | 6/1995 | Sato et al. |
| 5,487,791 A | 1/1996 | Everman et al. |
| 5,496,414 A | 3/1996 | Harvey et al. |
| 5,502,451 A | 3/1996 | Rainville et al. |
| 5,512,913 A | 4/1996 | Staney |
| 5,520,747 A | 5/1996 | Marks |
| 5,569,332 A | 10/1996 | Glatfelter et al. |
| 5,623,119 A | 4/1997 | Yater et al. |
| 5,653,222 A | 8/1997 | Newman |
| 5,666,127 A * | 9/1997 | Kochiyama ............ H01Q 1/288 343/700 MS |
| 5,785,280 A | 7/1998 | Baghdasarian |
| 5,885,367 A | 3/1999 | Brown et al. |
| 5,909,299 A | 6/1999 | Sheldon, Jr. et al. |
| 5,909,860 A | 6/1999 | Lee et al. |
| 5,969,695 A | 10/1999 | Bassily et al. |
| 5,984,484 A | 11/1999 | Kruer |
| 6,017,002 A | 1/2000 | Burke et al. |
| 6,031,178 A | 2/2000 | Kester |
| 6,043,425 A | 3/2000 | Assad |
| 6,050,526 A | 4/2000 | Stribling |
| 6,060,790 A | 5/2000 | Craig, Jr. |
| 6,091,017 A | 7/2000 | Stern |
| 6,118,067 A | 9/2000 | Lashley et al. |
| 6,150,995 A | 11/2000 | Gilger |
| 6,188,012 B1 | 2/2001 | Ralph |
| 6,194,790 B1 | 2/2001 | Griffin et al. |
| 6,195,067 B1 | 2/2001 | Gilger |
| 6,284,967 B1 | 9/2001 | Hakan et al. |

(56) References Cited

U.S. PATENT DOCUMENTS

| | | |
|---|---|---|
| 6,300,558 B1 | 10/2001 | Takamoto et al. |
| 6,343,442 B1 | 2/2002 | Marks |
| 6,366,255 B1 | 4/2002 | Chiang |
| 6,366,256 B1 | 4/2002 | Ramanujam et al. |
| 6,369,545 B1 | 4/2002 | Williams et al. |
| 6,394,395 B1 | 5/2002 | Poturalski et al. |
| 6,423,895 B1 | 7/2002 | Murphy et al. |
| 6,429,368 B1 | 8/2002 | Summers |
| 6,528,716 B2 | 3/2003 | Collette et al. |
| 6,534,705 B2 | 3/2003 | Berrios et al. |
| 6,541,916 B2 | 4/2003 | Decker |
| 6,547,190 B1 | 4/2003 | Thompson et al. |
| 6,555,740 B2 | 4/2003 | Roth et al. |
| 6,557,804 B1 | 5/2003 | Carroll |
| 6,560,942 B2 | 5/2003 | Warren et al. |
| 6,565,044 B1 | 5/2003 | Johnson et al. |
| 6,577,130 B1 | 6/2003 | Adamo et al. |
| 6,587,263 B1 | 7/2003 | Iacovangelo et al. |
| 6,590,150 B1 | 7/2003 | Kiefer |
| 6,635,507 B1 | 10/2003 | Boutros et al. |
| 6,655,638 B2 | 12/2003 | Deel |
| 6,660,927 B2 | 12/2003 | Zwanenburg |
| 6,660,928 B1 | 12/2003 | Patton et al. |
| 6,689,952 B2 | 2/2004 | Kawaguchi |
| 6,690,252 B2 | 2/2004 | Scoltock, Jr. et al. |
| 6,713,670 B2 | 3/2004 | Stern et al. |
| 6,735,838 B1 | 5/2004 | Triller et al. |
| 6,735,920 B1 | 5/2004 | Cadogan |
| 6,768,048 B2 | 7/2004 | Woll et al. |
| 6,784,359 B2 | 8/2004 | Clark et al. |
| 6,799,742 B2 | 10/2004 | Nakamura et al. |
| 6,882,072 B2 | 4/2005 | Wingett et al. |
| 6,897,730 B2 | 5/2005 | Dupuis et al. |
| 6,903,261 B2 | 6/2005 | Habraken et al. |
| 6,904,749 B2 | 6/2005 | Joshi et al. |
| 6,909,042 B2 | 6/2005 | Geyer et al. |
| 6,936,760 B2 | 8/2005 | Spirnak et al. |
| 6,983,914 B2 | 1/2006 | Stribling et al. |
| 7,006,039 B2 | 2/2006 | Miyamoto et al. |
| 7,053,294 B2 | 5/2006 | Tuttle et al. |
| 7,077,361 B1 | 7/2006 | Rabinowitz |
| 7,138,960 B2 | 11/2006 | Carroll et al. |
| 7,163,179 B1 | 1/2007 | Taylor |
| 7,211,722 B1 | 5/2007 | Murphy |
| 7,271,333 B2 | 9/2007 | Fabick et al. |
| 7,301,095 B2 | 11/2007 | Murphy et al. |
| 7,303,166 B2 | 12/2007 | Geery |
| 7,319,189 B2 | 1/2008 | Ruelle et al. |
| 7,354,033 B1 | 4/2008 | Murphey et al. |
| 7,392,011 B1 | 6/2008 | Jacomb-Hood |
| 7,464,895 B2 | 12/2008 | Palmer |
| 7,474,249 B1 | 1/2009 | Williams et al. |
| 7,486,431 B2 | 2/2009 | Rabinowitz |
| 7,564,149 B2 | 7/2009 | Siri et al. |
| 7,564,628 B2 | 7/2009 | Barth et al. |
| 7,568,479 B2 | 8/2009 | Rabinowitz |
| 7,612,284 B2 | 11/2009 | Rogers et al. |
| 7,736,007 B2 | 6/2010 | Rabinowitz |
| 7,866,836 B2 | 1/2011 | Rabinowitz |
| 7,878,667 B2 | 2/2011 | Rabinowitz |
| 7,895,795 B1 | 3/2011 | Murphey et al. |
| 7,960,641 B2 | 6/2011 | Rabinowitz |
| 8,071,873 B2 | 12/2011 | Rabinowitz |
| 8,146,867 B2 | 4/2012 | Jordan et al. |
| 8,215,298 B2 | 7/2012 | Klotz |
| 8,308,111 B2 | 11/2012 | Lu et al. |
| 8,439,511 B2 | 5/2013 | Stern et al. |
| 8,616,502 B1 | 12/2013 | Stribling et al. |
| 8,636,253 B1 | 1/2014 | Spence et al. |
| 8,683,755 B1 | 4/2014 | Spence et al. |
| 8,872,018 B1 | 10/2014 | Breen et al. |
| 9,004,410 B1 | 4/2015 | Steele et al. |
| 9,079,673 B1 | 7/2015 | Steele et al. |
| 9,120,583 B1 | 9/2015 | Spence et al. |
| 9,156,568 B1 | 10/2015 | Spence et al. |
| 9,248,922 B1 | 2/2016 | Baghdasarian et al. |
| 9,276,148 B2 | 3/2016 | Jaffe et al. |
| 9,346,566 B2 | 5/2016 | Spence et al. |
| 9,444,394 B1 | 9/2016 | Thomas et al. |
| 9,709,349 B2 | 7/2017 | Raman et al. |
| 10,144,533 B2 | 12/2018 | Atwater et al. |
| 10,340,698 B2 | 7/2019 | Pellegrino et al. |
| 10,454,565 B2 | 10/2019 | Pellegrino et al. |
| 10,696,428 B2 | 6/2020 | Pellegrino et al. |
| 2002/0007845 A1 | 1/2002 | Collette et al. |
| 2002/0029796 A1 | 3/2002 | Mikami et al. |
| 2002/0029797 A1 | 3/2002 | Mikami et al. |
| 2002/0032992 A1 | 3/2002 | Roth et al. |
| 2002/0134423 A1* | 9/2002 | Eller .................. B64G 1/222 |
| | | 136/245 |
| 2003/0098057 A1* | 5/2003 | Mizuno ............... B64G 1/428 |
| | | 136/244 |
| 2003/0098058 A1 | 5/2003 | Takada et al. |
| 2003/0192586 A1 | 10/2003 | Takada et al. |
| 2003/0196298 A1 | 10/2003 | Hinkley et al. |
| 2004/0011395 A1 | 1/2004 | Nicoletti et al. |
| 2004/0140930 A1 | 7/2004 | Harles |
| 2004/0187912 A1 | 9/2004 | Takamoto et al. |
| 2004/0231718 A1 | 11/2004 | Umeno et al. |
| 2005/0046977 A1 | 3/2005 | Shifman |
| 2005/0178921 A1 | 8/2005 | Stribling et al. |
| 2005/0241691 A1 | 11/2005 | Wakefield |
| 2005/0257823 A1 | 11/2005 | Zwanenburg |
| 2006/0038083 A1 | 2/2006 | Criswell |
| 2006/0109053 A1 | 5/2006 | Kim et al. |
| 2006/0157103 A1 | 7/2006 | Sheats et al. |
| 2006/0186274 A1 | 8/2006 | Wang et al. |
| 2006/0234694 A1* | 10/2006 | Kawasaki ............ H01Q 3/267 |
| | | 455/423 |
| 2007/0029446 A1 | 2/2007 | Mosher et al. |
| 2007/0087704 A1* | 4/2007 | Gilberton ........... H03F 1/3241 |
| | | 455/114.3 |
| 2008/0000232 A1 | 1/2008 | Rogers et al. |
| 2008/0055177 A1 | 3/2008 | Dixon |
| 2008/0088409 A1* | 4/2008 | Okada ............... G07C 9/00309 |
| | | 340/5.2 |
| 2008/0149162 A1 | 6/2008 | Martinelli et al. |
| 2008/0173349 A1 | 7/2008 | Liu et al. |
| 2008/0185039 A1 | 8/2008 | Chan |
| 2008/0251113 A1 | 10/2008 | Horne et al. |
| 2008/0283109 A1 | 11/2008 | Mankins et al. |
| 2009/0126792 A1 | 5/2009 | Gruhlke et al. |
| 2009/0133738 A1 | 5/2009 | Shiao et al. |
| 2009/0151769 A1 | 6/2009 | Corbin |
| 2009/0199893 A1 | 8/2009 | Bita et al. |
| 2009/0223554 A1 | 9/2009 | Sharps |
| 2009/0250094 A1 | 10/2009 | Robison et al. |
| 2009/0301544 A1 | 12/2009 | Minelli |
| 2009/0308451 A1 | 12/2009 | Oesterle et al. |
| 2010/0170560 A1 | 7/2010 | Sapienza et al. |
| 2010/0180946 A1 | 7/2010 | Gruhlke et al. |
| 2010/0224231 A1 | 9/2010 | Hoke |
| 2010/0263709 A1 | 10/2010 | Norman et al. |
| 2010/0269885 A1 | 10/2010 | Benitez et al. |
| 2010/0276547 A1 | 11/2010 | Rubenchik et al. |
| 2010/0289342 A1* | 11/2010 | Maness ................. B64G 1/007 |
| | | 307/104 |
| 2010/0300507 A1 | 12/2010 | Heng et al. |
| 2010/0319774 A1 | 12/2010 | Schwartz |
| 2011/0041894 A1 | 2/2011 | Liao |
| 2011/0049992 A1 | 3/2011 | Sant'Anselmo et al. |
| 2011/0061718 A1 | 3/2011 | Fork et al. |
| 2011/0080135 A1 | 4/2011 | Bland |
| 2011/0100425 A1 | 5/2011 | Osamura et al. |
| 2011/0120524 A1 | 5/2011 | Wares et al. |
| 2011/0122016 A1* | 5/2011 | Lomes ................ H01Q 3/267 |
| | | 342/174 |
| 2011/0203574 A1 | 8/2011 | Harding |
| 2011/0210209 A1 | 9/2011 | Taylor et al. |
| 2011/0232718 A1 | 9/2011 | Nawab |
| 2011/0300664 A1* | 12/2011 | Chung ............. H01L 31/02013 |
| | | 438/80 |
| 2011/0315192 A1 | 12/2011 | Swatek et al. |

(56) References Cited

U.S. PATENT DOCUMENTS

| | | |
|---|---|---|
| 2012/0019942 A1 | 1/2012 | Morgan et al. |
| 2012/0024362 A1 | 2/2012 | Gossman |
| 2012/0031393 A1 | 2/2012 | Linderman et al. |
| 2012/0125415 A1 | 5/2012 | Tischler |
| 2012/0138749 A1 | 6/2012 | Ellinghaus |
| 2012/0138997 A1 | 6/2012 | Tasaki et al. |
| 2012/0160299 A1 | 6/2012 | Reid et al. |
| 2012/0243252 A1 | 9/2012 | Kim |
| 2013/0009851 A1 | 1/2013 | Danesh |
| 2013/0032673 A1 | 2/2013 | Kobayashi |
| 2013/0093287 A1 | 4/2013 | Biso et al. |
| 2013/0099599 A1 | 4/2013 | Jaffe et al. |
| 2013/0133730 A1 | 5/2013 | Pan et al. |
| 2013/0220399 A1 | 8/2013 | Gruhlke et al. |
| 2013/0233974 A1 | 9/2013 | Maiboroda et al. |
| 2013/0234645 A1 | 9/2013 | Goei et al. |
| 2013/0319504 A1 | 12/2013 | Yang et al. |
| 2013/0319505 A1 | 12/2013 | Yang et al. |
| 2013/0332093 A1 | 12/2013 | Adest et al. |
| 2014/0041705 A1 | 2/2014 | Kang et al. |
| 2014/0083479 A1 | 3/2014 | Takayama et al. |
| 2014/0102686 A1 | 4/2014 | Yu et al. |
| 2014/0131023 A1 | 5/2014 | Raman et al. |
| 2014/0148197 A1 | 5/2014 | Shields |
| 2014/0150865 A1 | 6/2014 | Kwon et al. |
| 2014/0158197 A1 | 6/2014 | Rubenstein et al. |
| 2014/0159636 A1 | 6/2014 | Yang et al. |
| 2014/0261621 A1 | 9/2014 | Gruhlke et al. |
| 2014/0261622 A1 | 9/2014 | Floyd et al. |
| 2014/0263844 A1 | 9/2014 | Cook, Jr. et al. |
| 2014/0263847 A1 | 9/2014 | Eskenazi et al. |
| 2014/0326833 A1 | 11/2014 | Spence et al. |
| 2014/0356613 A1 | 12/2014 | Weisenberger et al. |
| 2015/0022909 A1 | 1/2015 | O'Neill |
| 2015/0053253 A1 | 2/2015 | O'Neill |
| 2015/0130293 A1 | 5/2015 | Hajimiri et al. |
| 2015/0144740 A1 | 5/2015 | Turse et al. |
| 2015/0155413 A1 | 6/2015 | Pokharna et al. |
| 2015/0217876 A1 | 8/2015 | Halsband |
| 2015/0244304 A1 | 8/2015 | Ozeki et al. |
| 2016/0056321 A1 | 2/2016 | Atwater et al. |
| 2016/0065006 A1 | 3/2016 | Woods |
| 2016/0122041 A1 | 5/2016 | Abrams et al. |
| 2016/0164451 A1 | 6/2016 | McEnaney et al. |
| 2016/0376037 A1 | 12/2016 | Pellegrino et al. |
| 2016/0380580 A1 | 12/2016 | Atwater et al. |
| 2017/0021947 A1 | 1/2017 | Pellegrino et al. |
| 2017/0025992 A1 | 1/2017 | Atwater et al. |
| 2017/0047463 A1 | 2/2017 | Hajimiri et al. |
| 2017/0047886 A1 | 2/2017 | Atwater et al. |
| 2017/0047889 A1 | 2/2017 | Atwater et al. |
| 2017/0047987 A1 | 2/2017 | Pellegrino et al. |
| 2017/0063296 A1 | 3/2017 | Cruijssen et al. |
| 2018/0315877 A1 | 11/2018 | Kelzenberg et al. |

FOREIGN PATENT DOCUMENTS

| | | |
|---|---|---|
| CN | 104158471 A | 11/2014 |
| EP | 0541052 A1 | 5/1993 |
| EP | 0977273 A1 | 2/2000 |
| EP | 0996170 A2 | 4/2000 |
| EP | 1501132 A2 | 1/2005 |
| EP | 976655 B1 | 9/2005 |
| EP | 1852919 A2 | 11/2007 |
| EP | 1852919 A3 | 2/2009 |
| EP | 2318045 A1 | 5/2011 |
| EP | 3149777 A1 | 4/2017 |
| EP | 3325347 A1 | 5/2018 |
| EP | 3334655 A1 | 6/2018 |
| FR | 2956774 A1 | 8/2011 |
| GB | 2247564 A | 3/1992 |
| JP | 6298781 A | 5/1987 |
| JP | S63254772 A | 10/1988 |
| JP | H0369258 U | 7/1991 |
| JP | H05107328 A | 4/1993 |
| JP | H06253477 A | 9/1994 |
| JP | 06327173 A | 11/1994 |
| JP | 082500 A | 9/1996 |
| JP | 2000114571 A | 4/2000 |
| JP | 2001088799 A | 4/2001 |
| JP | 2001309581 A | 11/2001 |
| JP | 2002095189 A | 3/2002 |
| JP | 2002362500 A | 12/2002 |
| JP | 2003164077 A | 6/2003 |
| JP | 2003164078 A | 6/2003 |
| JP | 2003191899 A | 7/2003 |
| JP | 2004090817 A | 3/2004 |
| JP | 2004196051 A | 7/2004 |
| JP | 2004253471 A | 9/2004 |
| JP | 2004296658 A | 10/2004 |
| JP | 2009184603 A | 8/2009 |
| JP | 2010259301 A | 11/2010 |
| JP | 6640116 B2 | 1/2020 |
| JP | 6693889 B2 | 4/2020 |
| JP | 6715317 B2 | 6/2020 |
| WO | 2004049538 A2 | 6/2004 |
| WO | 2008073905 A2 | 6/2008 |
| WO | 2009124098 A2 | 10/2009 |
| WO | 2010033632 A2 | 3/2010 |
| WO | 2011006506 A1 | 1/2011 |
| WO | 2011062785 A2 | 5/2011 |
| WO | 2011067772 A1 | 6/2011 |
| WO | 2011109275 A1 | 9/2011 |
| WO | 2011062785 A3 | 11/2011 |
| WO | 2015175839 | 11/2015 |
| WO | 2015175839 A1 | 11/2015 |
| WO | 2015179213 A2 | 11/2015 |
| WO | 2015179214 A2 | 11/2015 |
| WO | 2015187221 A2 | 12/2015 |
| WO | 2015187739 | 12/2015 |
| WO | 2017015508 | 1/2017 |
| WO | 2017015605 | 1/2017 |
| WO | 2017027615 | 2/2017 |
| WO | 2017027617 | 2/2017 |
| WO | 2017027629 | 2/2017 |
| WO | 2017027633 | 2/2017 |

OTHER PUBLICATIONS

International Search Report and Written Opinion for International Application No. PCT/US2015/030909, completed Nov. 27, 2015, dated Nov. 27, 2015, 13 Pgs.

International Search Report and Written Opinion for International Application PCT/US2015/030900, Completed Aug. 11, 2015, dated Aug. 13, 2015, 11 pgs.

International Search Report and Written Opinion for International Application PCT/US2015/033841, Completed Sep. 10, 2015, dated Sep. 11, 2015, 11 pgs.

Arya et al., "Wrapping Thick Membranes with Slipping Folds", American Institute of Aeronautics and Astronautics, date unknown, pp. 1-17.

Delapierre et al., "Spin-Stabilized Membrane Antenna Structures", American Institute of Aeronautics and Astronautics, date unknown, pp. 1-15.

NASA TV, "Solar Power, Origami-Style", printed Aug. 14, 2014 from http://www.nasa.gov/jpl/news/origami-style-power-20140814, 4 pgs.

International Preliminary Report on Patentability for International Application PCT/US2015/030900, dated Nov. 15, 2016, dated Nov. 24, 2016, 9 Pgs.

International Preliminary Report on Patentability for International Application PCT/US2015/033841, dated Dec. 6, 2016, dated Dec. 15, 2016, 8 Pgs.

International Preliminary Report on Patentability for International Application PCT/US2015/030909, dated Nov. 15, 2016, dated Nov. 24, 2016, 11 Pgs.

International Search Report and Written Opinion for International Application No. PCT/US2016/043424, completed Nov. 15, 2016, dated Nov. 15, 2016, 14 Pgs.

International Search Report and Written Opinion for International Application No. PCT/US2016/043677, completed Oct. 21, 2016, dated Oct. 21, 2016, 8 Pgs.

(56) References Cited

OTHER PUBLICATIONS

International Search Report and Written Opinion for International Application No. PCT/US2016/046389, completed Nov. 22, 2016, dated Nov. 22, 2016, 11 Pgs.
International Search Report and Written Opinion for International Application No. PCT/US2016/046394, completed Nov. 17, 2016, dated Nov. 17, 2016, 12 Pgs.
International Search Report and Written Opinion for International Application No. PCT/US2016/046415, completed Nov. 17, 2016, dated Nov. 17, 2016, 10 Pgs.
International Search Report and Written Opinion for International Application No. PCT/US2016/046421, completed Nov. 17, 2016, dated Nov. 17, 2016, 10 Pgs.
Aieta et al., "Multiwavelength achromatic metasurfaces by dispersive phase compensation", Science, vol. 347, Issue 6228, DOI:10.1126/science.aaa2494, Mar. 20, 2015, pp. 1342-1345.
Aoki et al., "A Fully Integrated Quad-Band GSM/GPRS Power Amplifier", IEEE Journal of Solid-State Circuits, vol. 43, Issue 12, Dec. 12, 2008, pp. 2747-2758.
Bakr et al., "Impact of phase and amplitude errors on array performance", UC Berkeley Technical Report No. UCB/EECS-2009-1. Retrieved from http://www.eecs.berkeley.com/Pubs/TechRpts/2009/EECS-2009-1.html, Jan. 1, 2009, 12 pgs.
Bohn et al., "Fully Integrated Frequency and Phase Generation for a 6-18GHz Tunable Multi-Band Phased-Array Receiver in CMOS", Radio Frequency Integrated Circuits Symposium (RFIC), Apr. 17-Jun. 17, 2008. IEEE, pp. 439-442.
Brongersma et al., "Light management for photovoltaics using high-index nanostructures", Nature Materials, vol. 13, No. 25, May 2014, pp. 451-460.
Callahan et al., "Light trapping in ultrathin silicon photonic crystal superlattices with randomly-textured dielectric incouplers", Optics Express, vol. 21, Issue 25, DOI: 10.1364/OE.21.030315, 2013, pp. 30315-30326.
Campbell et al., "A Pixel Readout Chip for Mrad in Standard 0.25um CMOS", IEEE Transactions on Nuclear Science, vol. 46, issue: 3, Jun. 1999, pp. 156-160.
Cao et al., "A 4.5MGy TID-Tolerant CMOS Bandgap Reference Circuit Using a Dynamic Base Leakage Compensation Technique", IEEE Transactions on Nuclear Science, vol. 60, issue 4, Aug. 2013, pp. 2819-2824.
Geisz et al., "Infrared Reflective and Transparent Inverted Metamorphic Triple Junction Solar Cells", AIP Conference Proceedings, vol. 1277, Issue 11, pp. 11-15, Oct. 14, 2010.
Kaltenbrunner et al., "Flexible high power-per-weight perovskite solar cells with chromium oxide—metal contacts for improved stability in air", Nature Materials, vol. 14, doi:10.1038/nmat4388, Aug. 24, 2015, pp. 1032-1039.
Lacoe, R. C., "Improving Integrated Circuit Performance Through the Application of Hardness-by-Design Methodology", IEEE Transactions on Nuclear Science, vol. 55, issue: 4, Aug. 2008, pp. 1903-1925.
Lamoureux et al., "Dynamic kirigami structures for integrated solar tracking", Nature Communications, DOI:10.1038/ncomms9092, Sep. 8, 2015, pp. 1-6.
Lohmeyer et al., "Correlation of GEO communication satellite anomalies and space weather phenomena: Improved satellite performance and risk mitigation", paper presented at 30th AIAA International Communications Satellite Systems Conference (ICSSC), Ottawa, Canada, pp. 1-20, Jul. 13, 2012.
Messenger et al., "Status of Implementation of Displacement Damage Dose Method for Space Solar Cell Degradation Analyses", 2008 Dd EOL Calc via SPENVIS manuscript SRM2, Jan. 2008, 8 pgs.
Narita et al., "Development of high accuracy phase control method for space solar power system", Proc. IEEE International Microwave Workshop Series on Innovative Wireless Power Transmission: Technologies, Systems, and Applications, May 12-13, 2011, p. 227-230.
Nishioka et al., "Evaluation of temperature characteristics of high-efficiency InGaP/InGaAs/Ge triple-junction solar cells under concentration", Solar Energy Materials and Solar Cells, vol. 85, Issue 3, Jan. 31, 2005, pp. 429-436.
O'Brien et al., "The AE9/AP9 Radiation Specification Development", Aerospace Corporation, Sep. 15, 2009, Report No. TOR-2009(3905)-8, 29 pgs.
Petrovic et al., "Design Methodology for Fault Tolerant ASICs", IEEE 15th International Symposium, Design and Diagnostics of Electronic Circuits & Systems (DDECS), Apr. 18-20, 2012, pp. 8-12.
Rephaeli et al., "Ultrabroadband Photonic Structures to Achieve High-Performance Daytime Radiative Cooling", Nano Letters, vol. 13, Mar. 5, 2013, pp. 1457-1461.
Sato et al., "Modeling of degradation behavior of InGaP/GaAs/Ge triple-junction space solar cell exposed to charged particles", Journal of Applied. Physics, vol. 105, 2009, pp. 044504-1-044504-6.
Silverman et al., "Outdoor Performance of a Thin-Film Gallium-Arsenide Photovoltaic Module", presented at the 39th IEEE Photovoltaic Specialist Conference, Conference Jun. 16-21, 2013, Tampa, Florida, USA, 6 pgs.
Snoeys et al., "Integrated Circuits for Particle Physics Experiments", IEEE Journal Solid-State Circuits, vol. 35, issue 12, Dec. 2000, pp. 2018-2030.
Wang et al., "A Broadband Self-Healing Phase Synthesis Scheme", Radio Frequency Integrated Circuits Symposium (RFIC), IEEE, Jun. 5-7, 2011, 4 pgs.
O'Hara, "Mechanical properties of silicone rubber in a closed volume", Technical Report, Army Armament Research and Development Center, (Dec.), 1983, 21 pgs.
Pellegrino, "AAReST telescope architecture", obtained from http://www.pellegrino.caltech.edu/aarest2/, printed Jul. 5, 2017, 4 pgs.
Penjuri, et al., "Simulation and Testing of Deployable CFRP Booms for Large Space Structures", PhD thesis, Aug. 2011, 118 pgs.
Pors et al., "Analog Computing Using Reflective Plasmonic Metasurfaces", Nano Lett., Dec. 18, 2014, vol. 15, pp. 791-797.
Radford et al., "Measurement of Manufacturing Distortion in Flat Composite Laminates", International Conference on Composite Materials, Jul. 1999, 9 pgs.
Radford et al., "Separating Sources of Manufacturing Distortion in Laminated Composites", Journal of Reinforced Plastics and Composites, first published May 1, 2000, vol. 19, No. Aug. 2000, pp. 621-641.
Rakic et al., "Algorithm for the determination of intrinsic optical constants of metal films: application to aluminum", Applied Optics, Aug. 1, 1995, vol. 34, No. 22, pp. 4755-4767.
Rakic et al., "Optical Properties of Metallic Films for Vertical-Cavity Optoelectronic Devices", Applied Optics, Aug. 1, 1998, vol. 37, No. 22, pp. 5271-5283.
Raman et al., "Passive radiative cooling below ambient air temperature under direct sunlight", Nature, Nov. 27, 2014, vol. 515, pp. 540-544.
Reha et al., "A Dual-Band Rectangular CPW Folded Slot Antenna for GNSS Applications", International Journal of Advanced Research in Electrical, Electronics and Instrumentation Engineering, Aug. 2014. pp. 11055-11061.
Rephaeli et al., "Absorber and emitter for solar thermo-photovoltaic systems to achieve efficiency exceeding the Shockley-Queisser limit", Optics. Express, Aug. 11, 2009, vol. 17, No. 17, pp. 15145-15159.
Santer et al., "Composite Tube Flexures at Nanosatellite Scale", 4th AIAA Space-craft Structures Conference, Jan. 9-13, 2017, 12 pgs.
Sasaki, "How Japan plans to build an orbital solar farm", printed from https://energy.gov/articles/space-based-solar-power, published Apr. 24, 2014.
Seffen et al., "Deployment dynamics of tape springs", Proceedings of the Royal Society of London A: Mathematical, Physical and Engineering Sciences, Mar. 9, 1999, vol. 455, pp. 1003-1048.
Shaltout et al., "Time-varying metasurfaces and Lorentz non-reciprocity", Optical Materials Express, Nov. 1, 2015, vol. 5, No. 11, pp. 2459-2467.

(56) References Cited

OTHER PUBLICATIONS

Shin-Etsu, "Meeting the increasingly diverse and sophisticated needs of industry with the unique properties of silicone rubbers", Characteristic properties of Silicone Rubber Compounds, 2013, 16 pgs.
Sickinger et al., "Lightweight deployable booms: Design, manufacture, verification, and smart materials application", 55th International Astronautical Congress, Vancouver, Canada, Oct. 4-8, 2004, pp. 1-11.
Sihn et al., "Experimental studies of thin-ply laminated composites", Composites Science and Technology, May 1, 2007, vol. 67, pp. 996-1008.
Silva et al., "Performing Mathematical Operations with Metamaterials", Science, Jan. 10, 2014, vol. 343, No. 6167, pp. 160-163.
Stabile et al., "Coiling dynamic analysis of thin-walled composite deployable boom", Composite Structures, Mar. 29, 2014, vol. 113, pp. 429-436.
Steeves, "Multilayer Active Shell Mirrors", Thesis of John Steeves, May 5, 2015, 164 pgs.
Streyer et al., "Strong absorption and selective emission from engineered metals with dielectric coatings", Optics Express, Apr. 8, 2013, vol. 21, No. 7, pp. 9113-9122.
Stuart et al., "Absorption enhancement in silicon-on-insulator waveguides using metal island films,", Appl. Phys. Lett., Oct. 14, 1996, vol. 69, No. 16, pp. 2327-2329.
Stuart et al., "Island size effects in nanoparticle-enhanced photodetectors", Appl. Phys. Lett., Dec. 28, 1998, vol. 73, No. 26, pp. 3815-3817.
Svanberg et al., "An experimental investigation on mechanisms for manufacturing induced shape distortions in homogeneous and balanced laminates", Composites—Part A: Applied Science and Manufacturing, Jun. 1, 2001, vol. 32, pp. 827-838.
Walker et al., "An investigation of tape spring fold curvature", Proceedings of the 6th International Conference on Dynamics and Control of Systems and Structures in Space, Citeseer, 2004, 10 pgs.
Walters et al., "Spenvis implementation of end-of-life solar cell calculations using the displacement damage dose methodology", in the Proceedings of the 19th Space Photovoltaic Research and Technology Conference, Feb. 1, 2007, 9 pgs.
Weinberg et al., "Radiation and temperature effects in gallium arsenide, indium phosphide, and silicon solar cells", National Aeronautics and Space Administration Technical Memorandum 89870, May 4-8, 1987, 14 pgs., published Feb. 1, 1987.
Wells et al., "Metamaterials-based Salisbury screens with reduced angular sensitivity", Appl. Phys. Lett., Oct. 21, 2014, vol. 105, pp. 161105-1-161105-4.
White et al., "Cure Cycle Optimization for the Reduction of Processing-Induced Residual Stresses in Composite Materials", Journal of Composite Materials, Dec. 1, 1993, vol. 27, No. 14, pp. 1352-1378.
Whorton et al., "Nanosail-D: the first flight demonstration of solar sails for nanosatellites", 22nd AIAA/USU Conference on Small Satellites, Aug. 11, 2008, pp. 1-6.
Wood, "Space-based solar power", printed Jul. 5, 2017 from https://energy.gov/articles/space-based-solar-power, Mar. 6, 2014, 7 pgs.
Wu et al., "Retarding the crystallization of Pbl2 for highly reproducible planar-structured perovskite solar cells via sequential deposition", Energy & Environmental Science 7, Jun. 24, 2014, pp. 2934-2938.
Yamaguchi, "Radiation-resistant solar cells for space use", Solar Energy Materials & Solar Cells, 2001. vol. 68, pp. 31-53.
Yamaguchi et al., "Correlations for damage in diffused-junction InP solar cells induced by electron and proton irradiation", Journal of Applied Physics, May 1, 1997, vol. 81, No. 9, 6013-6018.
Yamaguchi et al., "Mechanism for the anomalous degradation of Si solar cells induced by high fluence 1 MeV electron irradiation", Applied Physics Letters, May 27, 1996, vol. 68, No. 22, pp. 3141-3143.
Yu et al., "A Broadband, Background-Free Quarter-Wave Plate Based on Plasmonic Metasurfaces", Nano Letters, Nov. 3, 2012, vol. 12, No. 12, pp. 6328-6333.
Yu et al., "Flat optics with designer metasurfaces", Nature Materials, published online Feb. 2014, vol. 13, pp. 139-150.
Zhang et al., "Infrared Refractive Index and Extinction Coefficient of Polyimide Films", International Journal of Thermophysics, May 1, 1998, vol. 19, No. 3, pp. 905-916.
Zheng et al., "Metasurface holograms reaching 80% efficiency", Nature Nanotechnology, published online Feb. 23, 2015, pp. 1-6.
Zhu et al., "Radiative cooling of solar cells", Optica, Jul. 22, 2014, vol. 1, pp. 32-38.
Zhu et al., "Radiative cooling of solar absorbers using a visibly transparent photonic crystal thermal blackbody", PNAS, Oct. 6, 2015, vol. 112, pp. 12282-12287.
ATI Industrial, Multi-Axis Force / Torque Sensor, ATI Industrial Automation, Jul. 23, 2014, pp. 1-44.
DuPont Kapton, Mar. 2012, 26 pgs.
Extended European Search Report for European Application No. 15803447.0, Search completed Oct. 17, 2017, dated Oct. 25, 2017, 10 Pgs.
Smooth on, Mold Max® XLS® II, Jan. 15, 2016, 2 pgs.
"AZ Technology | Materials, Paint and Coatings: AZ-93 White Thermal Control, Electrically Conductive Paint / Coating (AZ's Z-93P)", Available http://www.aztechnology.com/materials-coatings-az-93.html, Accessed: Dec. 19, 2016, 2 pgs.
"Corona Resistant Kapton CR Takes Electrical Insulation Design and Reliability to New Levels", Kapton, DuPont Films, H-54506-1, 4 pages.
"DuPont Kapton 100CRC: Technical Data Sheet", kapton.dupont.com, Jul. 2014, K-28402, 2 pages.
"DuPont Kapton 120FWN616B", kapton.dupont.com, K-28459, Sep. 2014, 1 page.
"DuPont Kapton 150FCRC019", kapton.dupont.com, K-28402, Jun. 2014, 2 pages.
"DuPont Kapton 150FWN019: Magnet Wire Insulation", www.kapton.dupont.com, H-78319-01, Mar. 2005, 2 pages.
"DuPont Kapton 150FWR019: Insulation Substrate", www.dupont.com/kapton, H-78312, Nov. 2001, 2 pages.
"DuPont Kapton 150PRN411", kapton.com, K-28731, Dec. 2014, 2 pages.
"DuPont Kapton 200FWR919: Insulation Substrate", www.dupont.com/kapton, H-78313, Nov. 2001, 2 pages.
"DuPont Kapton 200RS100", kapton.com, K-15354-2, Sep. 2014, 1 page.
"DuPont Kapton B: Technical Bulletin", kapton.dupont.com, K-25099-1, Jul. 2013, 1 page.
"DuPont Kapton FCR: Advanced Magnet Wire Insulation", Jun. 2005, H-99888, 4 pages.
"DuPont Kapton FN: Polyimide Film", kapton.com, K-15347-2, Jun. 2015, 2 pages.
"DuPont Kapton FPC: Polyimide Film", kapton.dupont.com, K-15361, Mar. 2006, 5 pages.
"DuPont Kapton GS Polyimide Film: Technical Data Sheet", kapton.dupont.com, K-26875-1, Jul. 2014, 2 pages.
"DuPont Kapton HN: Polyimide Film", kapton.dupont.com, K-15345-1, Apr. 2011, 5 pages.
"DuPont Kapton HPP-ST: Polyimide Film", kapton.dupont.com, K-15357, Mar. 2006, 5 pages.
"DuPont Kapton MT: Technical Data Sheet", kapton.dupont.com, H-38497-3, Apr. 2014, 1 page.
"DuPont Kapton PST: Polyimide Film", kapton.dupont.com, K-10790, Nov. 2005, 4 pages.
"DuPont Kapton PV9100 Series: Polyimide Films", kapton.dupont.com, K-260281_A4, Oct. 2012, 2 pages.
"DuPont Kapton: Polyimide Film", kapton.dupont.com, Mar. 2012, H-38479-9, 7 pgs.
"ESA. Composite material structures.", printed Jun. 29, 2017 from http://www.esa.int/Our_Activities/Space_Engineering_Technology/Structures/Composite_Materials_structures, Oct. 20, 2014, 2 pgs.
"Orbital ATK", Coilable Boom Systems. Technical report, Oct. 18, 1989, 2 pgs.

(56) References Cited

OTHER PUBLICATIONS

"Space solar power limitless clean energy from space", National Space Society, printed Jun. 29, 2017 from http://www.nss.org/settlement/ssp/, May 2017, 11 pgs.
Aguirre-Martinez et al., "Development of a Continuous Manufacturing Method for a Deployable Satellite Mast in Cfrp", 15th Reinforced Plastics Congress 1986, Sep. 1986, pp. 107-110.
Aieta et al., "Aberration-Free Ultrathin Flat Lenses and Axicons at Telecom Wavelengths Based on Plasmonic Metasurfaces", Nano Lett., Web publication date Aug. 2, 2012, vol. 12, No. 9, pp. 4932-4936.
Amacher et al., "Thin ply composites: Experimental characterization and modeling of size-effects", Composites Science and Technology, Jul. 11, 2014, vol. 101, pp. 121-132.
Andryieuski et al., "Rough metal and dielectric layers make an even better hyperbolic metamaterial absorber", Optics Express, Jun. 11, 2014, vol. 22, No. 12, pp. 14975-14980.
Arai, "Pitch-based carbon fiber with low modulus and high heat conduction", Nippon Steel Technical Report No. 84, Jul. 11, 2001, pp. 12-17.
Arbabi et al., "Multiwavelength polarization insensitive lenses based on dielectric metasurfaces with meta-molecules", Optics, Jan. 22, 2016, vol. 3, Issue 6, pp. 628-633.
Arbabi et al., "Subwavelength-thick lenses with high numerical apertures and large efficiency based on high-contrast transmitarrays", Nature Communications, May 5, 2015, vol. 6, pp. 7069, doi:10.1038/ncomms8069.
Arbabi et al., "Dielectric Metasurfaces for Complete Control of Phase and Polarization with Subwavelength Spatial Resolution and High Transmission", Nature Nanotechnology, Aug. 31, 2015, 27 pgs., doi:10.1038/nnano.2015.186.
Arya, "Packaging and Deployment of Large Planar Spacecraft Structures", Thesis of Manan Arya, May 2, 2016, 131 pgs.
Arya et al., "Ultralight Structures for Space Solar Power Satellites", American Institute of Aeronautics and Astronautics, 2016, pp. 1-18.
Banik et al., "Performance Validation of the Triangular Rollable and Collapsible Mast", Proceedings of the 24th Annual AIAA/USU Conference on Small Satellites, Logan, UT, Aug. 9, 2010, 8 pgs.
Bapanapalli et al., "The Effect of Tool-Part Interactions on the Geometry of Laminated Composites", Washington State University, Jul. 10, 2016.
Biddy et al., "LightSail-1 solar sail design and qualification", Proceedings of the 41st Aerospace Mechanisms Symposium, May 16, 2012, pp. 451-463.
Cahill et al., "Nanoscale thermal transport. II. 2003-2012", Applied Physics Review, Jan. 14, 2014, vol. 1, No. 1, pp. 011305-1-011305-45.
Calladine et al., "The theory of thin shell structures 1888-1988", Proceedings of the Institution of Mechanical Engineers, Part A: Journal of Power and Energy, vol. 202, No. 3, Jan. 7, 1988, pp. 141-149.
Castle Jr., "Heat conduction in carbon materials", 1st Biennial Conference of the American Carbon Society, pp. 13-19, Nov. 2, 1953.
Chen et al., "Planar Heterojunction Perovskite Solar Cells via Vapor-Assisted Solution Process", Journal of the American Chemical Society 136, Dec. 20, 2013, pp. 622-625.
Cheng et al., "Optical metasurfaces for beam scanning in space", Optics Letters, May 1, 2014, vol. 39, No. 9, pp. 2719-2722.
David, "Extraterrestrial mining could reap riches and spur exploration", http://www.space.com/16273-extraterrestrial-mining-asteroids-moon.html, Jun. 25, 2012, 7 pgs.
Du Toit et al., "Advances in the design of Jaumann absorbers", in Antennas and Propagation Society International Symposium, 1990. AP-S. Merging Technologies for the 90's. Digest., May 7, 1990, vol. 3, pp. 1212-1215.
Elfiky et al., "Study the effects of proton irradiation on GaAs/Ge solar cells", 35th IEEE Photovoltaic Specialist Conference, Jul. 2010, pp. 002528-002532.
Emerson, "Electromagnetic wave absorbers and anechoic chambers through the years", IEEE Trans. Antennas Propag., vol. 21, No. 4, Jul. 1973, pp. 484-490.
Eperon et al., "Morphological Control for High Performance, Solution-Processed Planar Heterojunction Perovskite Solar Cells", Advanced Functional Materials 24, first published Sep. 9, 2013, pp. 151-157.
Ersoy et al., "An experimental method to study the frictional processes during composites manufacturing", Composites Part A: Applied Science and Manufacturing, Feb. 19, 2005, vol. 36, No. 11, pp. 1536-1544.
Estvanko et al., "Numerical analysis of a tape spring hinge folded about two axes", Earth and Space 2012 © Engineering, Science, Construction, and Operations in Challenging Environments, ASCE, Jul. 11, 2012, pp. 714-721.
Fallahi et al., "Thin wideband radar absorbers", Transactions on Antennas and Propagation, Nov. 30, 2010, vol. 58, No. 12, pp. 4051-4058.
Fante et al., "Reflection properties of the Salisbury screen", IEEE Transactions on Antennas and Propagation, Oct. 1988, vol. 36, No. 10, pp. 1443-1454.
Fernandez, "Advanced Deployable Shell-Based Composite Booms for Small Satellite Structural Applications Including Solar Sails", International Symposium on Solar Sailing, Jan. 17-20, 2017, Kyoto, Japan, 19 pgs.
Fernlund, "Experimental and numerical study of the effect of cure cycle, tool surface, geometry, and lay-up on the dimensional fidelity of autoclave-processed composite parts", Composites—Part A: Applied Science and Manufacturing, 33(3):341-351, 2002.
Herbeck et al., "Development and test of deployable ultra-lightweight CFRP-booms for a Solar Sail", European Space Agency, (Special Publication) ESA SP, 49(468):107-112, 2001.
Hillebrandt et al., "The Boom Design of the De-Orbit Sail Satellite", European Conference on Spacecraft Structures, Materials and Mechanical Testing, European Conference on Spacecraft Structures, Materials & Environmental Testing, Apr. 1-4, 2014, Braunschweig, Germany., 8 pgs.
Huang et al., "Gate-tunable conducting oxide metasurfaces", Nano Letters, vol. 16, No. 9., web publication date Aug. 26, 2016, pp. 5319-5325.
Irwin et al., "Low-Mass Deployable Spacecraft Booms", AIAA Space 2010 Conference & Exposition, pp. 1-11, Aug. 30, 2010.
Jang et al., "Tunable large resonant absorption in a midinfrared graphene Salisbury screen", Physical Review. B, Oct. 8, 2014, vol. 90, No. 16, pp. 165409-1-165409-5.
Kelly, "On Kirchhoff's law and its generalized application to absorption and emission by cavities", Journal of Research of the National Bureau of Standards—B. Mathematics and Mathematical Physics, Jul.-Sep. 1965, vol. 69B, No. 3, pp. 165-171.
Kildishev et al., "Planar Photonics with Metasurfaces", Science, Mar. 15, 2013, vol. 339, No. 6125, pp. 1232009-1-1232009-6.
Knott et al., "Performance Degradation of Jaumann Absorbers Due to Curvature", IEEE Transactions on Antennas and Propagation, Jan. 1980, vol. AP28, No. 1, pp. 137-139.
Kryder et al., "Heat Assisted Magnetic Recording", Proceeding of the IEEE, current version published Dec. 2, 2008, vol. 96, No. 11, pp. 1810-1835.
Leclerc et al., "Characterization of Ultra-Thin Composite Triangular Rollable and Collapsible Booms", 4th AIAA Spacecraft Structures Conference, AIAA SciTech Forum, Jan. 2017, 15 pgs.
Lee et al., "Non-Destructive Wafer Recycling for Low-Cost Thin-Film Flexible Optoelectronics", Advanced Functional Materials, Apr. 2, 2014, vol. 24, pp. 4284-4291.
Liang et al., "Additive Enhanced Crystallization of Solution-Processed Perovskite for Highly Efficient Planar-Heterojunction Solar Cells", Advanced Materials, Mar. 14, 2014, vol. 26, pp. 3748-3754.
Liu et al., "Microstructure, thermal shock resistance and thermal emissivity of plasma sprayed LaMAl11 O19(M=Mg, Fe) coatings for metallic thermal protection systems", Applied Surface Science, vol. 271, Feb. 6, 2013, pp. 52-59.
Luukkonen et al., "A thin electromagnetic absorber for wide incidence angles and both polarizations", IEEE Transactions on Anten-

(56) References Cited

OTHER PUBLICATIONS nas and Propagation, IEEE Transactions on Antennas and Propagation Jul. 28, 2009, pp. 3119-3125.
Mankins, "A technical overview of the "SunTower" solar power satellite concept", Acta Astronautica, 50(6):369-377, Mar. 1, 2002.
Messenger et al., "Quantifying low energy proton damage in multijunction solar cell", in the proceedings of the 19th Space photovoltaic research and technology conference, 2005, NASA/CP-2007-214-494, pp. 8-17.
Miyazawa et al., "Evaluation of radiation tolerance of perovskite solar cell for use in space", Photovoltaic Specialist Conference (PVSC), 2015 IEEE 42nd, New Orleans, LA, USA, Dec. 17, 2015, pp. 1-4, published Jun. 1, 2015.
Mizuno et al., "A black body absorber from vertically aligned single-walled carbon nanotubes", Proc. Natl. Acad. Sci., Apr. 14, 2009, vol. 106, No. 15, pp. 6044-6047.
Narimanov et al., "Reduced reflection from roughened hyperbolic metamaterial". Optics Express, Jun. 17, 2013, vol. 21, No. 12, pp. 14956-14961.
Ni et al., "Metasurface holograms for visible light", Nature Communications, Nov. 15, 2013, vol. 4, pp. 1-6.
NTPT, "NTPT Thin prepreg 402", Data sheet, Version 1.6, May 11, 2017, 5 pgs.
Extended European Search Report for European Application No. 15795587.3, Search completed Feb. 5, 2018, dated Feb. 12, 2018, 7 Pgs.
International Preliminary Report on Patentability for International Application PCT/US2016/043424, Report completed Dec. 2, 2017, dated Dec. 15, 2017, 153 Pgs.
International Preliminary Report on Patentability for International Application PCT/US2016/043677, Report dated Jan. 23, 2018, dated Feb. 1, 2018, 6 Pgs.
International Preliminary Report on Patentability for International Application PCT/US2016/046389, Report dated Feb. 13, 2018, dated Feb. 22, 2018, 9 Pgs.
International Preliminary Report on Patentability for International Application PCT/US2016/046394, Report dated Feb. 13, 2018, dated Feb. 22, 2018, 10 Pgs.
International Preliminary Report on Patentability for International Application PCT/US2016/046415, Report dated Feb. 13, 2018, dated Feb. 22, 2018, 8 Pgs.
International Preliminary Report on Patentability for International Application PCT/US2016/046421, Report dated Feb. 13, 2018, dated Feb. 22, 2018, 8 Pgs.
Torayca, "T800H Technical Data Sheet", Technical report No. CFA-007, 2 pgs.
Vaccaro et al., "In-flight experiment for combined planar antennas and solar cells (SOLANT)", IET Microwaves Antennas & Propaga, vol. 3, No. 8, Dec. 1, 2009 (Dec. 1, 2009), pp. 1279-1287.
Jaffe et al., "Development of a Sandwich Module Prototype for Space Solar Power", 2012 IEEE Aerospace Conference, Mar. 3-10, 2012, Big Sky, MT, USA, pp. 1-9 , DOI: 10.1109/AERO.2012.6187077.
Jaffe et al., "Energy Conversion and Transmission Modules for Space Solar Power", Proceedings of the IEEE, Jun. 2013, vol. 101, No. 6, pp. 1424-1437, DOI: 10.1109/JPROC.2013.2252591.
Mankins, "SPS-ALPHA: The First Practical Solar Power Satellite via Arbitrarily Large Phased Array (A 2011-2012 NASA NIAC Phase 1 Project)", Artemis Innovation Management Solutions LLC, Sep. 15, 2012, NIAC Phase 1 Final Report, 113 pgs.
Rubenchik et al., "Solar Power Beaming: From Space to Earth", U.S. Department of Energy Office of Scientific and Technical Information, Apr. 14, 2009, Technical Report LLNL-TR-412782, 16 pgs. DOI: 10.2172/952766.
Sasaki et al., "A new concept of solar power satellite: Tethered-SPS", Acta Astronautica, 2006, vol. 60, pp. 153-165, doi:10.1016/j.actaastro.2006.07.010.
International Preliminary Report on Patentability for International Application PCT/US2016/043424, Report dated May 15, 2018, dated May 24, 2018, 12 Pgs.
Borriello et al., "Ab initio investigation of hybrid organic-inorganic perovskites based on tin halides", Physical Review B, Jun. 23, 2008, vol. 77, 235214, 9 pgs.
Conings et al., "Intrinsic thermal instability of methylammonium lead trihalide perovskite", Advanced Energy Materials, Jun. 2, 2015, DOI: 10.1002/aenm.201500477, 8 pgs.
Preston et al., "From plasmon spectra of metallic to vibron spectra of dielectric nanoparticles", Accounts of Chemical Research, Jan. 9, 2012, vol. 45, No. 9, pp. 1501-1510.
Scholl et al., "Quantum plasmon resonances of individual metallic nanoparticles", Nature, Mar. 22, 2012, vol. 483, doi:10.1038/nature10904, pp. 421-428.
Tsai et al., "High-efficiency two-dimensional Ruddlesden-Popper perovskite solar cells", Nature, Aug. 18, 2016, vol. 536, doi:10.1038/nature18306, 15 pgs.
Weinberg et al., "Radiation and temperature effects in gallium arsenide, indium phosphide, and silicon solar cells", NASA Technical Memorandum 89870, Washington, D.C., May 4-8, 1987, 14 pgs.
Zhang et al., "Intrinsic instability of the hybrid halide perovskite semiconductor CH3NH3PbI3", Chinese Physics Letters, Jun. 3, 2015, vol. 35, No. 3, 036104, 11 pgs.
Extended European Search Report for European Application No. 16828571.6, Search completed Mar. 18, 2019, dated Mar. 22, 2019, 17 Pgs.
Extended European Search Report for European Application No. 16835856.2, Search completed Feb. 22, 2019, dated Mar. 1, 2019, 8 Pgs.
Romeo et al., "Unique space telescope concepts using CFRP composite thin-shelled mirrors and structures", 2007.

* cited by examiner

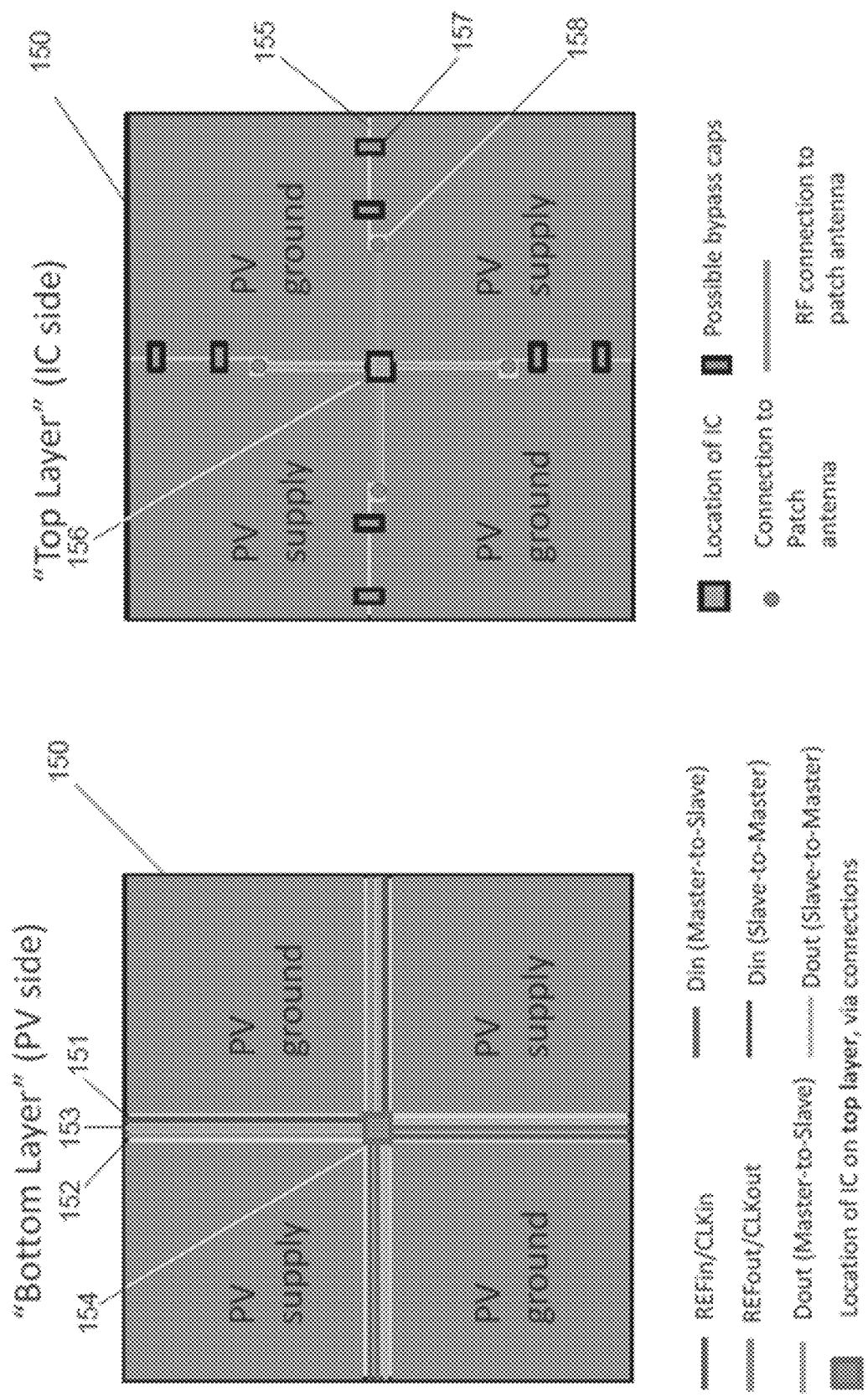

LARGE-SCALE SPACE-BASED SOLAR POWER STATION: POWER TRANSMISSION USING STEERABLE BEAMS

RELATED APPLICATION

This application claims priority to U.S. provisional patent application Ser. No. 61/993,016 entitled "Large-Scale Space-Based Array: Packaging, Deployment and Stabilization of Lightweight Structures," filed on May 14, 2014; U.S. provisional patent application Ser. No. 61/993,025 entitled "Large-Scale Space-Based Array: Multi-Scale Modular Space Power System," filed on May 14, 2014; U.S. provisional patent application Ser. No. 61/993,957 entitled "Large-Scale Space-Based Array: Modular Phased Array Power Transmission," filed May 15, 2014; U.S. provisional patent application Ser. No. 61/993,037 entitled "Large-Scale Space-Based Array: Space-Based Dynamic Power Distribution System," filed May 14, 2014; U.S. provisional patent application Ser. No. 62/006,604 entitled "Large-Scale Space-Based Array: Efficient Photovoltaic Structures for Space," filed Jun. 2, 2014; U.S. provisional patent application Ser. No. 62/120,650 entitled "Large-Scale Space-Based Array: Packaging, Deployment and Stabilization of Lightweight Structures," filed Feb. 25, 2015; and U.S. provisional patent application Ser. No. 62/161,076 entitled "Large-Scale Space-Based Array: Power Transmission Using Steerable Beams," filed May 13, 2015, all of which are incorporated by reference herein in their entirety.

FIELD OF THE INVENTION

The present invention is related to a space-based solar power station including a plurality of solar power satellite modules, more specifically to a modular space-based power station with a plurality of compactable independent solar power satellite modules flown in an orbital formation that by themselves or in unison form an antenna array for power transmission from space to Earth, each module having a plurality of power generation tiles having integrated photovoltaic cells, antennas, thermal radiator and control circuits in varying configurations.

BACKGROUND

Space-based solar power (SBSP) describes the collection of solar power in space by a solar-power satellite or a satellite power system (SPS) and then the conversion and transmission of the power to a remote receiver for conversion back to electrical power. In an SBSP system, solar energy is collected as electrical energy on board, powering some manner of wireless power transmission to a receiver located remotely from the SBSP. The wireless power transmission application might include a microwave transmitter or laser emitter, which would direct its beam toward a collector, such as a power receiving rectenna at the remote location, such as, on the Earth's surface.

SBSP differs from ground-based solar collection methods in that the means used to collect energy resides on an orbiting satellite instead of on the Earth's surface. Basing such a system in space results in a higher collection rate for the solar energy due to the lack of a diffusing atmosphere. Space-based solar power systems convert solar energy to a far-field emission such as microwaves outside the atmosphere, avoiding these losses. In addition, SBSP systems have a longer collection period and the ability to collect solar energy continuously without the downtime (and cosine losses, for fixed flat-plate collectors) that result from the Earth's rotation away from the sun.

A general limitation for SBSP systems is the size of SPS required to generate sufficient electrical power from solar energy. For example, for a 500 MW system a 5 $km^2$ platform may be required. Such a platform would be formed of large satellites on the order to tens to hundreds of tonnes/satellite. The launch costs associated with placing such large structures into orbit reduces the economic viability of such SBSP systems.

SUMMARY

Systems and methods in accordance with various embodiments of the invention provide a space-based solar power (SBSP) system including a plurality of solar-power satellite modules. In a number of embodiments, the satellite modules include a plurality of modular power generation tiles combining at least one photovoltaic cell, a power transmitter and circuitry configured to perform a variety of control functions including (but not limited to) coordinating the participation of the power transmitter in an array. In several embodiments, satellite modules, panels and/or individual power generation tiles within the space-based solar power station are configured to wirelessly receive a reference signal and/or to distribute the reference signal to the power generation tiles within the space-based solar power station for the purposes of generating a coordinated wireless power transmission. In a number of embodiments, the space-based solar power station is capable of determining the locations of the individual antennas forming the antenna array and applying phase shifts and/or amplitude modulations to the reference signal received by the power generation tiles in a manner that accounts for the signal path of the reference signal to a specific power generation tile and the location of the antenna of the power generation tile. In certain embodiments, the process of determining the locations of power generation tiles is hierarchical and involves the space-based solar power station determining and providing its location to satellite modules, which in turn determine and provide their own locations to the panels that are included in a given module. The panels can themselves, in turn, determine and provide their locations to power generation tiles included in specific panels. In other embodiments, any of a variety of techniques for determining the location of different elements of a space-based solar power station can be utilized as appropriate to the requirements of specific applications.

One embodiment of the invention includes: a plurality of unconnected satellite modules disposed in space in an orbital array formation; a plurality of power generation tiles disposed on each of the plurality of satellite modules; at least one photovoltaic cell disposed on each of the power generation tiles; and at least one power transmitter collocated with the at least one photovoltaic cell on each of the power generation tiles and in signal communication therewith such that an electrical current generated by the collection of solar radiation by the at least one photovoltaic cell powers the at least one power transmitter. In addition, each of the at least one power transmitters includes: an antenna; and control electronics that controls at least the phase of a radio frequency power signal that feeds the antenna so that the power transmitter is coordinated with power transmitters on other power generation tiles to form a phased array.

In a further embodiment, the control electronics further controls the amplitude of the radio frequency power signal that feeds the antenna so that the power transmitter is coordinated with power transmitters on other power generation tiles.

In another embodiment, the power transmitter is configured to receive a reference signal, and the control electronics controls the phase of the radio frequency power signal by applying a phase shift with respect to the received reference signal.

In a still further embodiment, at least one of the satellite modules comprises a receiver to wirelessly receive the reference signal.

In still another embodiment, the receiver of the at least one of the satellite module is configured to wirelessly receive the reference signal from an Earth-based transmitter.

A yet further embodiment also includes a reference signal transmitter satellite comprising a transmitter that transmits the reference signal. In addition, the receiver of the at least one of the satellite module is configured to wirelessly receive the reference signal from transmitter on the reference signal transmitter satellite.

In a yet another embodiment the receiver to wirelessly receive the reference signal comprises an amplifier, and a cleanup phase locked loop.

In a further embodiment again, each of the at least one satellite module also includes transmission lines that route the reference signal to at least one power transmitter on a given satellite module.

In another embodiment again, the transmission lines comprise transmission lines that route the reference signal between immediately adjacent power transmitters that do not receive the reference signal from another power transmitter.

In a further additional embodiment, the control electronics determines a phase shift to apply with respect to a received reference signal based upon location information.

In another additional embodiment, the location information is selected from the group consisting of absolute location information, and relative location information.

In a still yet further embodiment, the location information defines a position in space and an orientation.

In still yet another embodiment, the control electronics is configured to receive the location information.

In a still further embodiment again, at least one of the satellite modules includes a receiver to receive at least one ranging signal and determine location information indicating the location of the space-based solar power station.

In still another embodiment again, at least one of the satellite modules comprises a receiver configured to: receive the location information indicating the location of the space-based solar power station; receive at least one ranging signal; and determine location information indicating the location of the satellite module.

In a still further additional embodiment, at least one satellite module comprises a plurality of power generation tiles that form a panel; and the panel includes a receiver configured to: receive the location information including information indicating the location of a given module in the at least one satellite module to which the panel belongs; receive at least one ranging signal; determine location information indicating the location of the panel; and provide the location information indicating the location of the panel to the power transmitters on the plurality of power generation tiles that form the panel.

In still another additional embodiment, the at least one ranging signal is transmitter from at least one Earth-based transmitter.

In a yet further embodiment again, the at least one ranging signal is transmitter from at least one space-based transmitter.

In yet another embodiment again, the control electronics is contained within an integrated circuit includes: an RF synthesizer configured to generate an RF signal based upon a received reference signal; a phase adjuster configured to phase shift an RF signal received from the RF synthesizer by an amount determined by a control signal; a power amplifier configured to amplify a phase shifted RF signal received from the phase adjuster; and a digital signal processor configured by software stored in memory to generate the control signal for the phase adjuster.

A yet further additional embodiment includes: a plurality of power generation tiles; at least one photovoltaic cell disposed on each of the power generation tiles; and at least one power transmitter collocated with the at least one photovoltaic cell on each of the power generation tiles and in signal communication therewith such that an electrical current generated by the collection of solar radiation by the at least one photovoltaic cell powers the at least one power transmitter. In addition, each of the at least one power transmitters includes: an antenna; and control electronics that controls at least the phase of a radio frequency power signal that feeds the antenna so that the power transmitter is coordinated with power transmitters on other power generation tiles to form a phased array.

Yet another additional embodiment includes: at least one photovoltaic cell; and at least one power transmitter collocated with the at least one photovoltaic cell and in signal communication therewith such that an electrical current generated by the collection of solar radiation by the at least one photovoltaic cell powers the at least one power transmitter. In addition, each of the at least one power transmitters includes: an antenna; and control electronics that controls at least the phase of a radio frequency power signal that feeds the antenna.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF DRAWINGS

The description will be more fully understood with reference to the following figures and data graphs, which are presented as various embodiments of the disclosure and should not be construed as a complete recitation of the scope of the disclosure, wherein:

FIGS. 4d and 4e conceptually illustrate wiring of a power generation tile, according to one embodiment.

DETAILED DESCRIPTION

Figure 1:
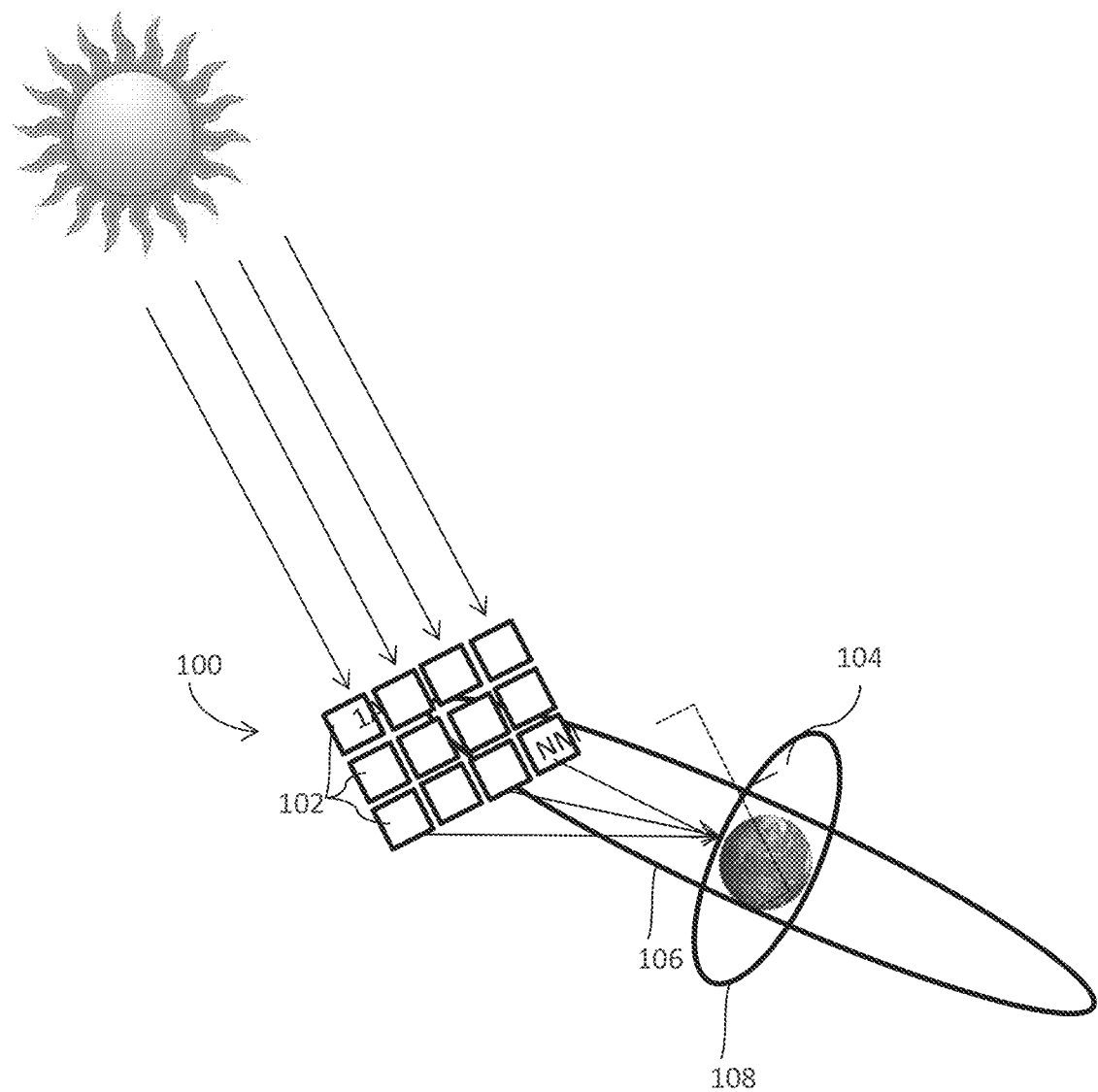
FIG. 1 conceptually illustrates a large-scale space-based solar power station with a plurality of power satellite modules in orbit about the Earth, according to one embodiment.

Turning now to the drawings, large-scale space-based solar power (SBSP) stations in accordance with various embodiments of the invention are illustrated. In many embodiments, the SBSP systems include arrays of independent satellite modules each incorporating arrays of independent solar electric power generation tiles. In several embodiments, the power generation tiles are each formed incorporating independent photovoltaic cells, power transmitters, and control circuits. The satellite modules and power generation tiles may be formed from compactible structures according to some embodiments. Methods for deploying, stabilizing, operating and constructing such large-scale space-based solar power systems in accordance with a number of embodiments of the invention are also described.

A large-scale space-based solar power station is a modular space-based construct that can be formed from a plurality of independent satellite modules placed into orbit within an orbital formation such that the position of each satellite module relative to each other is known. Each of the satellite modules can include a plurality of power generation tiles that capture solar radiation as electrical current and use the current to transmit the energy to one or more remote receivers using power transmitters. In many instances, the transmissions are generated using microwave power transmitters that are coordinated to act as a phased- and/or amplitude modulated array capable of generating a steerable beam and/or focused beam that can be directed toward one or more remote receivers. In other embodiments, any of a variety of appropriate power transmission technologies can be utilized including (but not limited to) optical transmitters such as lasers.

Embodiments relate to lightweight space structures used to construct the modular elements of the solar power station. Some lightweight space structures are used in the construction of the power generation tiles and/or satellite modules and may incorporate movable elements that allow the lightweight space structure to be compacted prior to deployment to reduce the area or dimensional length, height and/or width of the power generation tiles and/or satellite modules prior to deployment. The space structures may be made of any number, size and configuration of movable elements, and the elements may be configured to compact according to any suitable compacting mechanism or configuration, including one or two-dimensional compacting using, among others, z-folding, wrapping, rolling, fan-folding, double z-folding, Miura-ori, slip folding, wrapping, and combinations thereof. Some embodiments of movable elements are interrelated by hinges, such as, frictionless, latchable, ligament, and slippage hinges, among others. Some embodiments of structures are pre-stressed and/or provided with supportive frameworks to reduce out-of-plane macro- and micro-deformation of the lightweight structures. Structures and modules may include dynamic stabilizing movement (e.g., spinning) during deployment and/or operation. Deployment mechanisms to deploy the compactible lightweight structures into a deployed operational state may be incorporated into or associated with embodiments of the lightweight structures. Some deployment mechanisms may include (but are not limited to) expansive boom arms, centrifugal force mechanisms such as tip masses or module self-mass, among others.

Large-scale spaced-based solar power stations according to many embodiments utilize a distributed approach to capture solar radiation, and to use the energy thus captured to operate power transmitters, which transmit power to one or more remote receivers (e.g., using laser or microwave emissions). The satellite modules of the solar power station can be physically independent structures, each comprising an independent array of power generation tiles. The satellite modules are each placed into a specified flying formation within an array of such satellite modules in a suitable orbit about the Earth. The position of each of the independent satellite modules in space within the orbital array formation is controllable via a combination of station-keeping thrusters and controlled forces from absorption, reflection, and emission of electromagnetic radiation, as well as guidance controls. Using such controllers each of the independent satellite modules may be positioned and maintained within the controlled orbital array formation relative to each of the other satellite modules so that each satellite module forms an independent modular element of the large-scale space-based solar power station. The solar radiation received by each of the power generation tiles of each of the independent satellite modules is utilized to generate electricity, which powers one or more power transmitters on each of the power generation tiles. Collectively, the power transmitters on each of the power generation tiles can be configured as independent elements of an antenna array.

The power generation tiles and/or satellite modules may also include separate electronics to process and exchange timing and control information with other power generation tiles and/or satellite modules within the large-scale space-based solar power station. In many implementations, the separate electronics form part of an integrated circuit that possesses the ability to independently determine a phase offset to apply to a reference signal based upon the position of an individual tile and/or transmitter element. In this way, coordination of a phased array of antennas can be achieved in a distributed manner.

In embodiments of the distributive approach, different array elements of the phased array may be directed to transmit power with different transmission characteristics (e.g., phase) to one or more different remote power receiving collectors (e.g., ground based rectenna). Each satellite module of power generation tiles, or combinations of power generating tiles across one or more satellite modules, may thus be controlled to transmit energy to a different power receiving collector using the independent control circuitry and associated power transmitters.

A photovoltaic cell (PV) refers to an individual solar power collecting element on a power generation tile in a satellite module. The PV includes any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof.

A power transmitter or radiator refers to an individual radiative element on a power generation tile in a satellite module and its associated control circuitry. A power transmitter can include any device capable of converting power in the electrical current generated by the PV to a wireless signal, such as microwave radiation or light, including (but not limited to) a laser, a klystron, a traveling-wave tube, a gyrotron, or suitable transistor and/or diode. A power transmitter may also include suitable transmissive antennas, such as, dipole, patch, helical or spherical antennas, among others.

An array of antennas refers to an array of power transmitters in which the relative phases and/or amplitudes of the respective signals feeding the power transmitters are configured such that the effective radiation pattern of the power emission of the array is reinforced in a desired emission direction and suppressed in undesired directions. Arrays of antennas in accordance with embodiments may be dynamic or fixed, active or passive.

An orbital array formation refers to any size, number or configuration of independent satellite modules being flown in formation at a desired orbit in space such that the position of the satellite modules relative to each other is known such that power generation tiles on each of the satellite modules within the formation serves as an array element in the antenna array of the solar power station.

A power generation tile refers to an individual solar power collecting and transmitting element in the phased array of the large-scale space-based solar power station. In many embodiments a power generation tile is a modular solar radiation collector, converter and transmitter that collects solar radiation through at least one photovoltaic cell disposed on the tile, and uses the electrical current to provide power to at least one power transmitter collocated on the same tile that transmits the converted power to one or more remote power receiving collectors. Many of the power generation tiles incorporated within a space-based solar power station include separate control electronics that independently control the operation of the at least one power transmitter located on the power generation tile based upon timing, position, and/or control information that may be received from other tiles and/or other satellite modules within the large-scale space-based solar power station. In this way, the separate control electronics can coordinate (in a distributed manner) the transmission characteristics of each of the power generation tiles to form a phased array. Each power generation tile may also include other structures such as radiation collectors for focusing solar radiation on the photovoltaic, thermal radiators for regulating the temperature of the power generation tile, and radiation shielding, among other structures.

A satellite module refers to an array of power generation tiles collocated on a single integral space structure. The space structure of the satellite module may be a compactable structure such that the area occupied by the structure may be expanded or contracted depending on the configuration assumed. The satellite modules may include two or more power generation tiles. Each power generation tile may include at least one solar radiation collector and power transmitter. As discussed above, each of the power generation tiles may transmit power and may be independently controlled to form an array element of one or more phased arrays formed across the individual satellite module or several such satellite modules collectively. Alternatively, each of the power generation tiles collocated on a satellite module may be controlled centrally.

A lightweight space structure refers to integral structures of movably interrelated elements used in the construction of the power generation tiles and/or satellite modules that may be configurable between at least packaged and deployed positions wherein the area and or dimensions of the power generation tiles and/or satellite modules may be reduced or enlarged in at least one direction. The lightweight space structures may incorporate or be used in conjunction with deployment mechanisms providing a deploying force for urging the movable elements between deployed and compacted configurations.

A large-scale space-based solar power station or simply solar power station refers to a collection of satellite modules being flown in an orbital array formation designed to function as one or more phased arrays. In several embodiments, the one or more phased arrays may be operated to direct the collected solar radiation to one or more power receiving collectors.

Transmission characteristics of a power generation tile refer to any characteristics or parameters of the power transmitter of the power generation tile associated with transmitting the collected solar radiation to a power receiving collector via a far-field emission. The transmission characteristics may include, among others, the phase and operational timing of the power transmitter and the amount of power transmitted.

Structure of Large-Scale Space-Based Solar Power Station

A large-scale space-based solar power station including a plurality of satellite modules positioned in an orbital array formation in an orbit about the Earth in accordance with embodiments of the invention is illustrated in FIG. 1. The large-scale space-based solar power station 100 includes an array of independent satellite modules 102. The solar power station 100 is configured by placing a plurality of independent satellite modules 102 into a suitable orbital trajectory in an orbital array formation 104, according to one embodiment. The solar power station 100 may include a plurality of such satellite modules 1A through NM. In one embodiment, the satellite modules 1A through NM are arranged in a grid format as illustrated in FIG. 1. In other embodiments, the satellite modules are arranged in a non-grid format. For example, the satellite modules may be arranged in a circular pattern, zigzagged pattern or scattered pattern. Likewise, the orbit may be either geosynchronous 106, which is typically at an altitude of 35,786 km above the Earth, or low Earth 108, which is typically at an altitude of from 800 to 2000 km above the Earth, depending on the application of the solar power station. As can readily be appreciated, any orbit appropriate to the requirements of a specific application can be utilized by a space-based solar power station in accordance with various embodiments of the invention.

Figure 2:
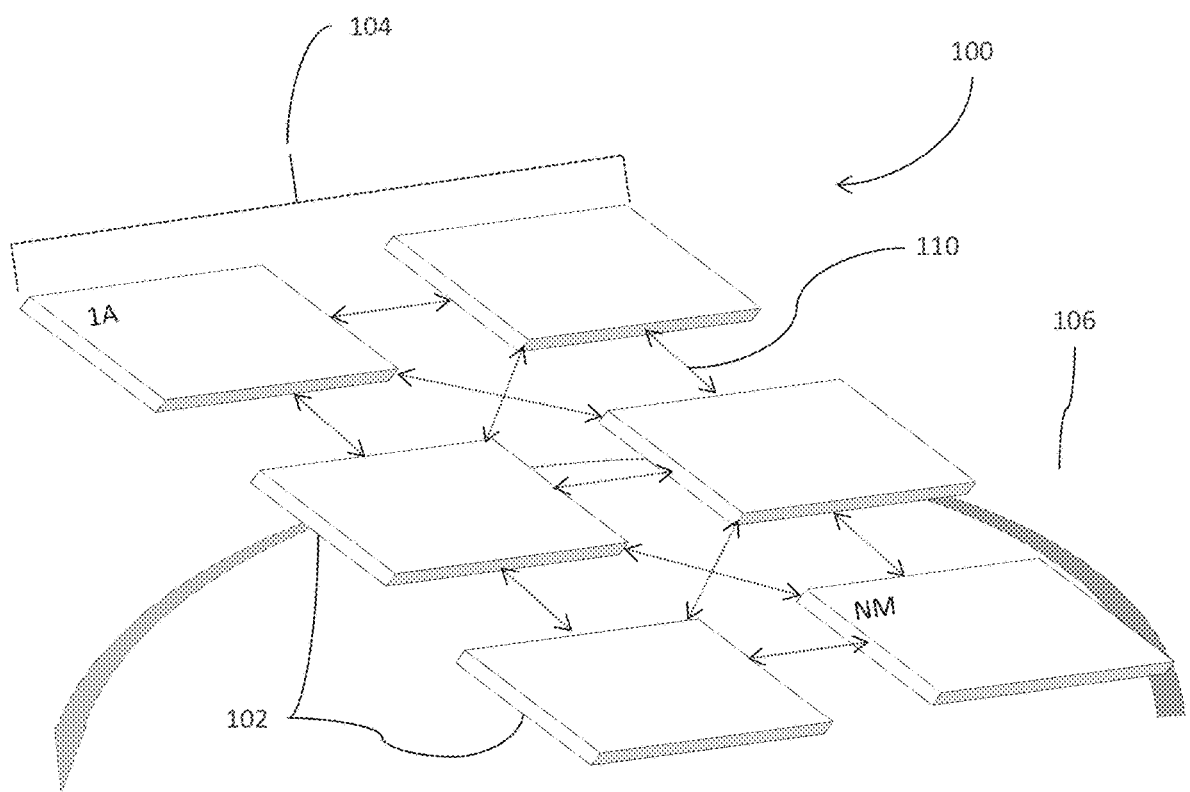
FIG. 2 conceptually illustrates a large-scale space-based solar power station with a plurality of power satellite modules flying in a rectangular orbital formation, according to one embodiment.

In many embodiments, the satellite modules in the solar power station are spatially separated from each other by a predetermined distance. By increasing the spatial separation, the maneuverability of the satellite modules in relation to each other is simplified. As discussed further below, the separation and relative orientation of the satellite modules can impact the ability of the power generation tile on each of the satellite modules to operate as elements within an antenna array. In one embodiment, each satellite module 1A through NM may include its own station keeping and/or maneuvering propulsion system, guidance control, and related circuitry. Specifically, as illustrated in FIG. 2, each of the satellite modules 102 of the solar power station 100 may include positioning sensors to determine the relative position 110 of the particular satellite module 1A through NM in relation to the other satellite modules 1A to NM, and guidance control circuitry and propulsion system to maintain the satellite module in a desired position within the arbitrary formation 104 of satellite modules during operation of the solar power station. Positioning sensors in accordance with many embodiments can include the use of external positioning data from global positions system (GPS) satellites or international ground station (IGS) network, as well as onboard devices such as inertial measurement units (e.g., gyroscopes and accelerometers), and combinations thereof. In several embodiments, the positioning sensors can utilize beacons that transmit information from which relative position can be determined that are located on the satellite modules and/or additional support satellites. The guidance control and propulsion system may likewise include any suitable combination of circuitry and propulsion system capable of maintaining each of the satellite modules in formation in the solar power station array 104. In many embodiments the propulsion system may utilize, among others, one or more of chemical rockets, such as biopropellant, solid-fuel, resistojet rockets, etc., electromagnetic thrusters, ion thrusters, electrothermal thrusters, solar sails, etc. Likewise, each of the satellite modules may also include attitudinal or orientational controls, such as, for example, reaction wheels or control moment gyroscopes, among others.

Figure 3:
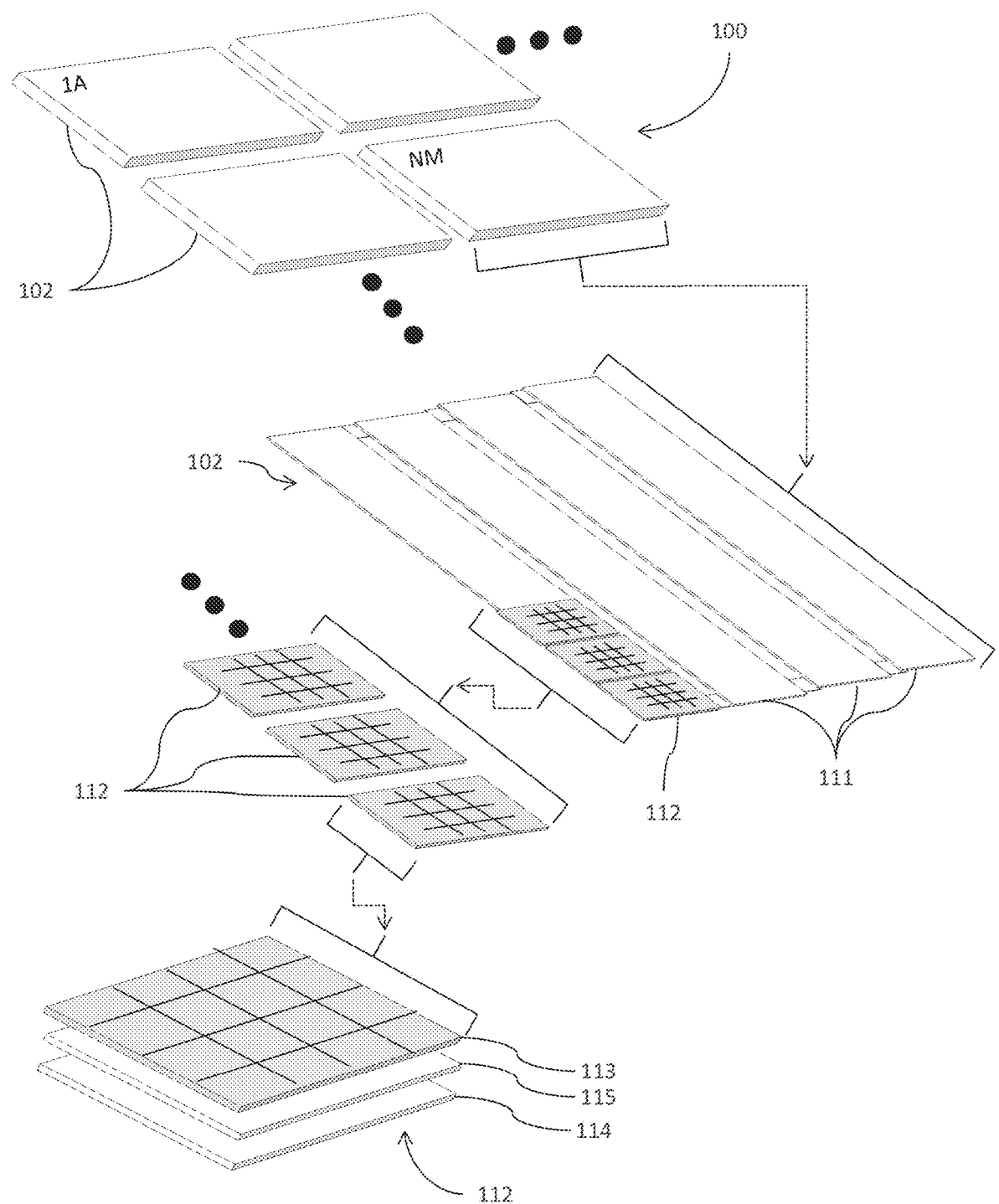
FIG. 3 conceptually illustrates a large-scale space-based solar power station, a satellite module, and a cross-sectional view of a modular power generation tile, according to one embodiment.

In many embodiments, as illustrated in FIG. 3, each satellite module 1A through NM of the solar power station 100 comprises a space structure comprised of one or more interconnected structural elements 111 having one or more power generation tiles 112 collocated thereon. Specifically, each of the satellite modules 1A through NM is associated with an array of power generation tiles 112 where each of the power generation tiles of the array each independently collect solar radiation and covert it to electric current. Power transmitters convert the electrical current to a wireless power transmission that can be received by a remote power receiving station. As discussed above, one or more power transmitters on each of a set of power generation tiles can be configured as an element in one or more phased arrays formed by collections of power generation tiles and satellite modules of the overall solar power station. In one embodiment, the power generation tiles in the satellite module are spatially separated from each other by a predetermined distance. In other embodiments, the construction of the satellite modules is such that the power generation tiles are separated by distances that can vary and the distributed coordination of the power generation tiles to form a phased array involves the control circuitry of individual power transmitters determining phase offsets based upon the relative positions of satellite modules and/or individual power generation tiles.

Power Generation Tiles

Figure 4A:
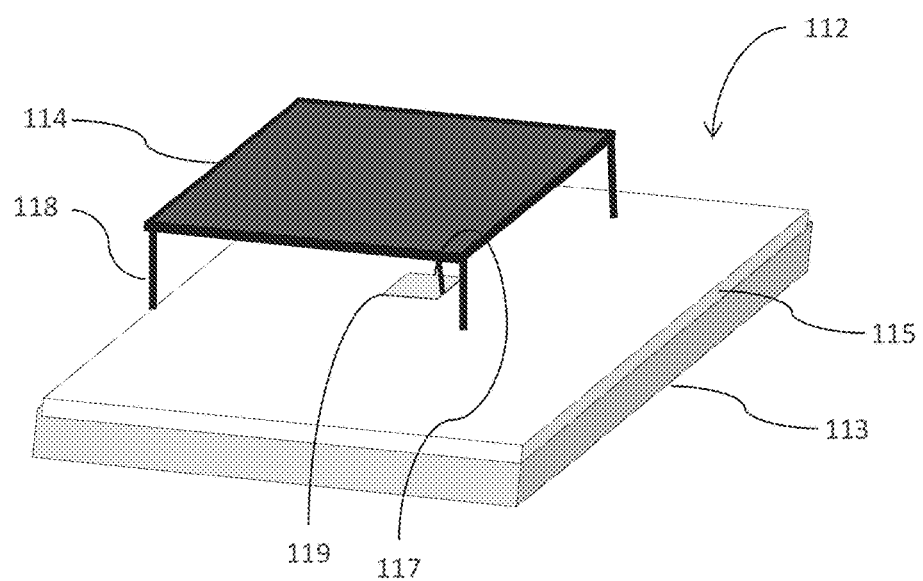
FIG. 4a conceptually illustrates a cross-sectional view of a modular power generation tile, according to one embodiment.
Figure 4A:
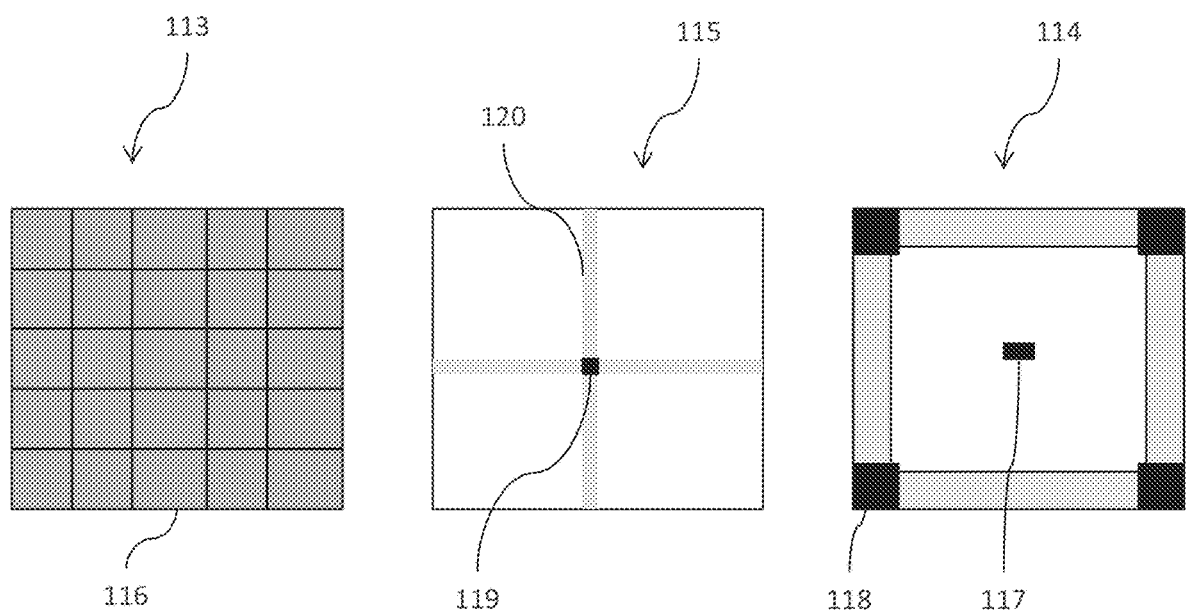

Power generation tiles 112 according to many embodiments include a multicomponent structure including a photovoltaic cell 113, a power transmitter 114, and accompanying control electronics 115 electrically interconnected as required to suit the needs of the power transmission application. As illustrated in FIG. 4a, in some embodiments photovoltaic cells 113, may comprise a plurality of individual photovoltaic elements 116 of a desired solar collection area that may be interconnected together to produce a desired electrical current output across the power generation tile. Some power transmitters 114 include one or more transmission antennas, which may be of any suitable design, including, among others, dipole, helical and patch. In the illustrated embodiment, a conventional patch antenna 114 incorporating a conductive feed 117 to conductively interconnect the RF power from the control electronics 115 to the antenna 114. As can readily be appreciated the specific antenna design utilized is largely dependent upon the requirements of a specific application. Some power transmitters 114 are physically separated from one or both of the photovoltaic cell 113 and/or the control electronics 115 such as by fixed or deployable spacer structures 118 disposed therebetween. Some control electronics 115 may include one or more integrated circuits 119 that may control some aspect of the power conversion (e.g., to a power emission such as collimated light or an radio frequency (RF) emission such as microwave radiation), movement and/or orientation of the satellite module, inter- and intra-satellite module communications, and transmission characteristics of the power generation tile and/or satellite module. Further conductive interconnections 120 may connect the control electronics 115 to the source power of the photovoltaic cell 113. Each of the power generation tiles may also include thermal radiators to control the operating temperature of each of the power generation tiles.

Figure 4B:
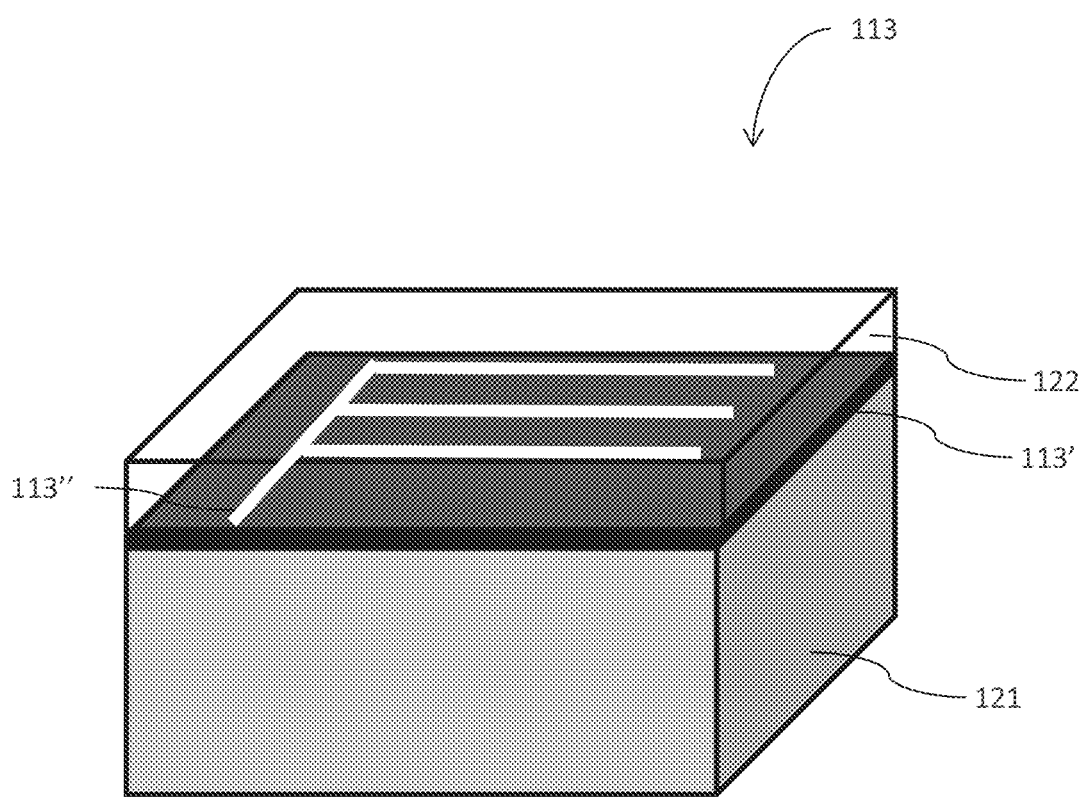
FIG. 4b conceptually illustrates a cross-sectional view of a photovoltaic cell, according to one embodiment.

In some embodiments, the PV 113 is a multi-layer cell, as illustrated in FIG. 4b, incorporating at least an absorber material 113' having one or more junctions 113" disposed between a back contact 121 on a back side of the absorber material and a top radiation shield 122 disposed on the surface of the absorber material in the direction of the incident solar radiation. The PV may include any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof. In some embodiments, the PVs are made from a thin film of GaInP/GaAs that is matched to the solar spectrum. Radiation shielding may include a solar radiation transparent material such as $SiO_2$, among others. The back contact may be made of any suitable conductive material such as a conductive material like aluminum, among others. The thickness of the back contact and top radiation shield may be of any thickness suitable to provide radiation shielding to the PV. Additional structures may be provided around the PV to increase the efficiency of the absorption and operation of the device including, for example, one or more concentrators that gather and focus incoming solar radiation on the PV, such as a Cassegrain, parabolic, nonparabolic, hyperbolic geometries or combinations thereof. The PV may also incorporate a temperature management device, such as a radiative heat sink. In some embodiments the temperature management device is integrated with the control electronics.

In a number of embodiments, the power transmitters that are components of power generation tiles are implemented using a combination of control circuitry and one or more antennas. The control circuitry can provide the power generation tile with the computational capacity to determine the location of the power generation tile antenna(s) relative to other antennas within the satellite module and/or the solar power station. As can readily be appreciated, the relative phase of each element within a phased array is determined based upon the location of the element and a desired beam direction and/or focal point location. The control circuitry on each power generation tile can determine an appropriate phased offset to apply to a reference signal using a determined location of the power generation tile antenna(s) and beam-steering information. Processes for determining the location of individual tile antennas and for determining phase offsets to apply based upon location in accordance with various embodiments of the invention are discussed further below.

Figure 4C:
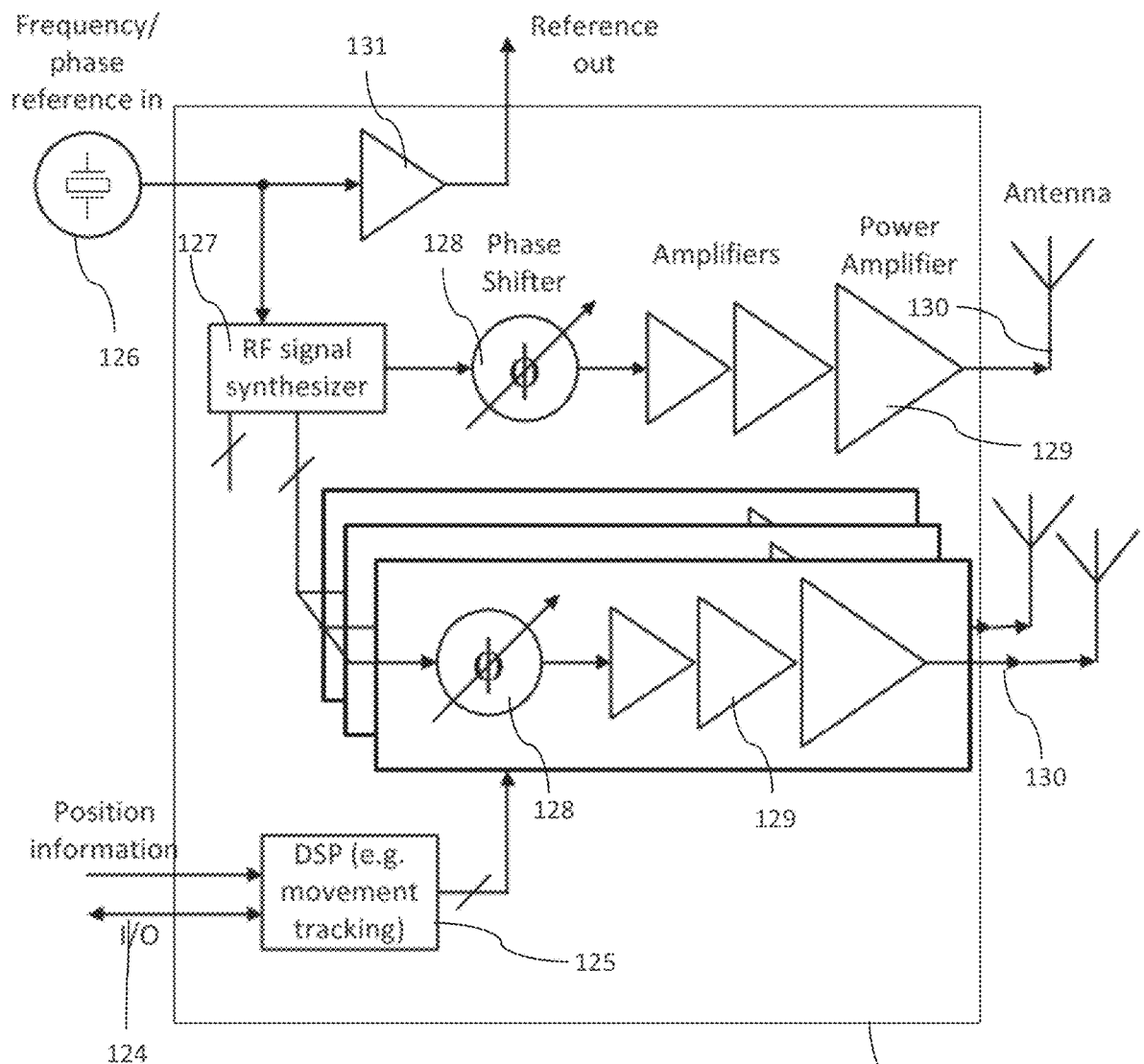
FIG. 4c conceptually illustrates a block-diagram for an integrated circuit suitable for utilization in a power transmitter forming part of a power generation tile, according to one embodiment.

In various embodiments, as illustrated conceptually in FIG. 4c, power generation tile control circuitry can be implemented using one or more integrated circuits. An integrated circuit 123 can include an input/output interface 124 via which a digital signal processing block 125 can send and receive information to communicate with other elements of a satellite module, which typically includes a processor and/or memory configured by a control application. In certain embodiments, the digital signal processing block 125 receives location information (see discussion above) that can be utilized to determine the location of one or more antennas. In many embodiments, the location information can include a fixed location and/or one or more relative locations with respect to a reference point. The digital signal processing block can utilize the received location information and/or additional information obtained from any of a variety of sensors including (but not limited to) temperature sensors, accelerometers, ranging radars, and/or gyroscopes to determine the position of one or more antennas and calculate temperature dependent delays. Based upon the determined positions of the one or more antennas, the digital signal processing block 125 can determine a phase offset to apply to a reference signal 126 used to generate the RF signal fed to a specific antenna. In the illustrated embodiment, the integrated circuit 123 receives a reference signal 126, which is provided to an RF synthesizer 127 to generate an RF signal having a desired frequency. The RF signal generated by the RF synthesizer 127 is provided to one or more phase offset devices 128, which are configured to controllably phase shift and/or amplitude modulate the RF signal received from the RF synthesizer. Circuits that can be utilized to implement RF synthesizers and to controllably phase shift and/or amplitude modulate the RF signal received from the RF synthesizer include the various circuits disclosed in U.S. patent application Ser. No. 14/552,414 entitled "Generator Unit for Wireless Power Transfer", filed Nov. 24, 2014, the relevant disclosure from which is hereby incorporated by reference in its entirety.

The digital signal processing block 125 can generate control signals that are provided to the phase offset device(s) 128 to introduce the appropriate phase shifts based upon the determined location(s) of the one or more antennas. In many embodiments, the amplitude of the generated signal can be modulated and/or varied alone or in conjunction with the phase appropriately upon the determined locations to form the power beam and/or focused transmission. The amplitude can be modulated in a variety of ways such as at the input of a power amplifier chain via a mixer or within an amplifier via its supply voltage, an internal gate or cascade biasing voltage. As can readily be appreciated, any of a variety of techniques appropriate to the requirements of a specific application can be utilized to amplitude modulate an RF signal in accordance with various embodiments of the invention. The phase shifted RF signals can then be provided to a series of amplifiers that includes a power amplifier 129. While the entire circuit is powered by the electric current generated by the PV component(s) of the power generation tile, the power amplifier is primarily responsible for converting the DC electric current into RF power that is transmitted via the RF signal. Accordingly, the power amplifier increases the amplitude of the received phase shifted RF signal and the amplified and phase shifted RF signal is provided to an output RF feed 130 connected to an antenna. In many embodiments, the RF signal generated by the RF synthesizer is provided to an amplifier 131 and distributed to the control circuitry of other tiles. The distribution of reference signals between tiles in a module in accordance with various embodiments of the invention is discussed further below.

The interconnection of components in a power generation tile and the pathways via which the power generation tile exchanges information with other elements of a space-based power station constructed in accordance with various embodiments of the invention is conceptually illustrated in the power generation tile wiring diagrams shown in FIGS. 4d and 4e. In the illustrated embodiment, the power generation tile wiring 150 includes at least two layers of wiring. The layers of wiring can be implemented using any of a variety of printed circuit board technologies suitable for use with high frequency signals and/or space applications such as (but not limited to) polyamide and/or KAPTON®, which is a registered Trademark of E. I. DuPont de Nemours and Company of Wilmington, Del. Below a first or "bottom" layer (FIG. 4d) is the PV (connecting the supply connection locally to PV ground and PV supply). Above a second or "top" layer (FIG. 4e) is the patch antenna layer. REFin/CLKin 151 is the reference/clock signal that can originate from a master tile (see discussion below). REFout/CLKout 152 are the buffered reference/clock signals generated from the input clock to be connected to REFin/CLKin signals of another power generation tile. The same connection logic applies to Din/Dout (data in, data out) pairs 153 for master-to-slave data connections. The connection direction is reversed for Din/Dout (Slave-to-master). It should be further noted that Din/Dout lines 153 can denote a general address and data bus of lines. While depicted as a single line, multiple lines can be run in parallel to enhance data throughput through the communication channel. As can readily be appreciated, via connections 154 can be utilized to connect the traces and supplies to the IC, for example to solder pads of a so-called flip-chip mounted IC.

The lines on the first or "bottom" layer (but not the supply connections) are assumed to be continuous between tiles (as the tiles are physically connected). If the tiles (or panels) are fabricated with interruptions, connectors including (but not limited to) a short ribbon cable type connection can be used for connection. The second or "top" layer (FIG. 4e) displays coplanar RF lines 155 connecting the RF output from an integrated circuit 156 similar to the integrated circuit described above and the RF antenna. The RF lines 155 can include (optionally) bypass capacitors 157. In operation, the RF bypass capacitors 157 can allow RF currents to flow, enabling the PV supply and PV ground metallization to act as a continuous ground shield for the patch antenna at RF frequencies of interest. Four connections 158 are shown here for differential RF signals for two polarizations. As can readily be appreciated, any of a variety of feeds appropriate to the specific antenna(s) utilized by a power generation tile can be utilized. The connection can be made with a ribbon connection and the impedance of the connection is taken into account to provide an overall "impedance match".

Although specific wiring implementations for power generation tiles are described above with reference to FIGS. 4d and 4e, any of a variety of wiring implementations can be utilized as appropriate to the requirements of specific applications in accordance with embodiments of the invention including (but not limited to) utilizing more than two layers of PCB material and metallization can be used to facilitate routing or provide increased flexibility. In addition, connection lines for RF or high-speed signals can utilize any one of the many well-known techniques for routing RF or high-speed AC signals such as, but not limited to, microstrip transmission lines, coplanar transmission lines, striplines. For high speed digital signals, frequently interconnections employing nearby ground reference routing are employed to increase the through-put of the interconnection.

Furthermore, although specific integrated circuit and power generation tile implementations are described above with reference to FIGS. 4a-4e, power generation tiles and power generation tile control circuitry can be implemented using any of a variety of techniques including (but not limited to) different types of integrated circuits and computing platforms in accordance with various embodiments. Furthermore, satellite modules can be implemented without providing computational capabilities on each power generation tile and/or without utilizing the computational capabilities of a power generation tile to determine locations and/or phase shifts for the purposes of generating an RF signal to feed a power generation tile antenna. Indeed, in several embodiments, power generation tiles within a satellite module (or between modules) may be different. The number of distinct combinations of photovoltaic cells, transmission modules and control electronics may be as large as the number of power generation tiles in the satellite modules. Further, even where each of the power generation tiles on a satellite module are the same, each of the satellite modules 1A through NM or a group of satellite modules may have different solar radiation collection or transmission characteristics and/or may have arrays of power generation tiles of different sizes, shapes and configurations. As can readily be appreciated, the design and function of individual tiles utilized within a space-based solar power station is only limited by the requirements of specific applications. The use of power generation tiles to wirelessly transmit power from a space-based solar power station in accordance with various embodiments of the invention is discussed further below.

Power Transmission Using Steerable Beams

Figure 5A:
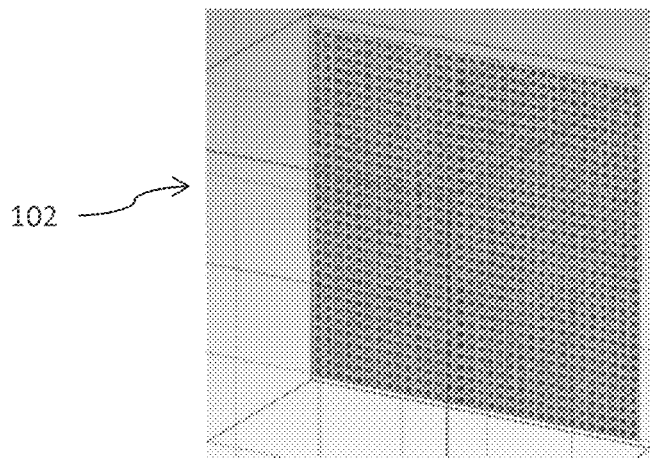
FIGS. 5a-5c conceptually illustrates an array of power generation tiles in which the antenna elements of the power generation tiles are configured as a phased array, according to one embodiment.
Figure 5B:
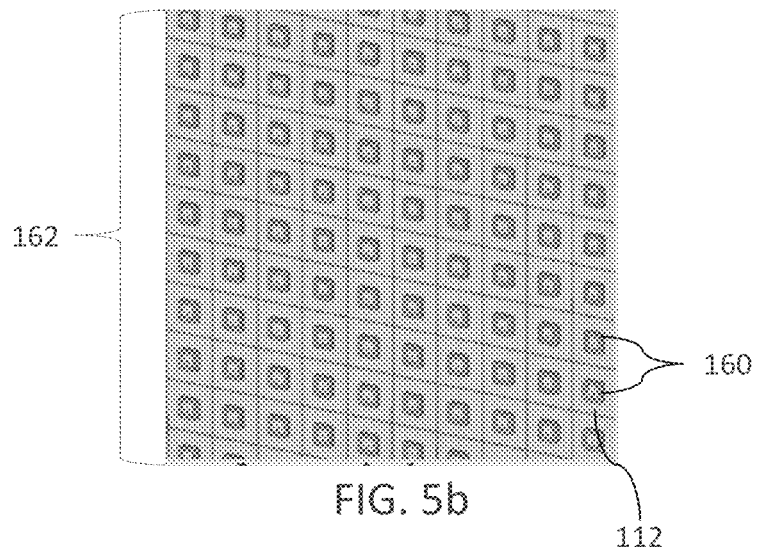
Figure 5C:
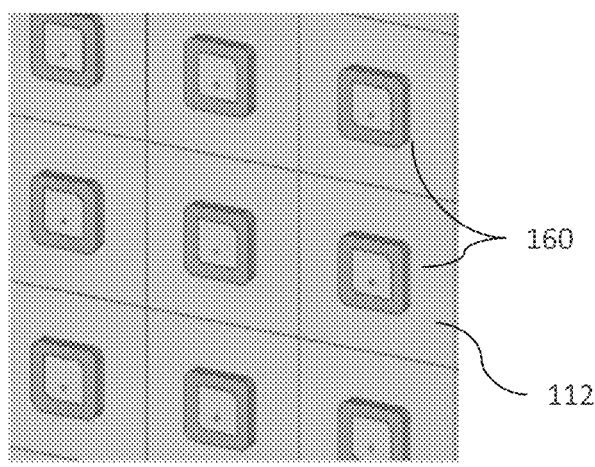

In many embodiments, as illustrated conceptually in FIGS. 5a-5c, a plurality of power generation tiles 112 on each satellite module may each form a panel 160 in which the antenna elements of the power generation tiles form part of an array 162 that can be utilized for wireless power transmission. In several embodiments, the amplitude and/or phase of RF signals transmitted by the antennas in the array 162 are controllable to provide a steerable beam of power.

In a number of embodiments, coordination of the power generation tiles 112 to form an array 162 for the transmission of wireless power involves distribution of a reference signal to the power generation tiles. As noted above, control circuitry on power generation tiles 112 can shift the phase and/or modulate the amplitude of the reference signal. Therefore, reference signals may be generated locally on each power generation tile or satellite module and propagated via wired or wireless intra and inter-module communication links, or may be generated centrally from a single source on a single satellite module and propagated via wired or wireless intra and/or inter-module communication links across each of the satellite modules and power generation tiles. In addition, one or multiple reference signals may be generated from outside the space-based solar power station system such as one or more satellites flying in close proximity or even in different orbits; as well as from one or more ground stations.

The phase offset and/or amplitude modulation applied to the reference signal by the control circuitry at an individual power generation tile to achieve a steerable beam is dependent upon the position of the power generation tile 112 relative to other power generation tiles within the array 162. Accordingly, the efficiency of wireless power transmissions generated by an array 162 can be significantly increased by precisely determining the location of the power generation tiles 112 within the array and modifying phase offsets and/or amplitude modulations accordingly. In many embodiments, the positional information of each tile is received from partially redundant systems, such as, but not limited to, gyroscopes, accelerometers, electronic ranging radar, electronic positioning systems, phase and/or timing information from beacons, as well as employing a priori knowledge from system steering and flight control commands. In several embodiments, electronic systems are located on the ground, and/or in space on satellites deployed for this purpose (and, possibly, other purposes, e.g. in the case of using GPS satellites). The generation and distribution of reference signals and the determination of the locations of power generation tiles within a spaced-based solar power station in accordance with various embodiments of the invention is discussed further below.

Distribution of Reference Signals within a Space-Based Solar Power Station

Figure 5D:
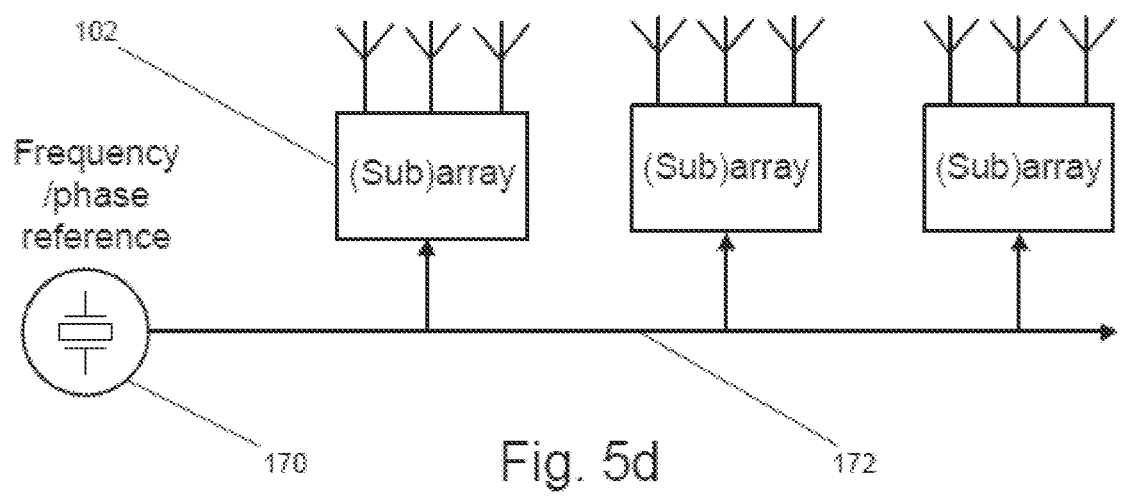
FIG. 5d conceptually illustrates a process for distributing a reference signal between the sub-arrays formed by each of the satellite modules in a space-based solar power station, according to one embodiment.
Figure 5E:
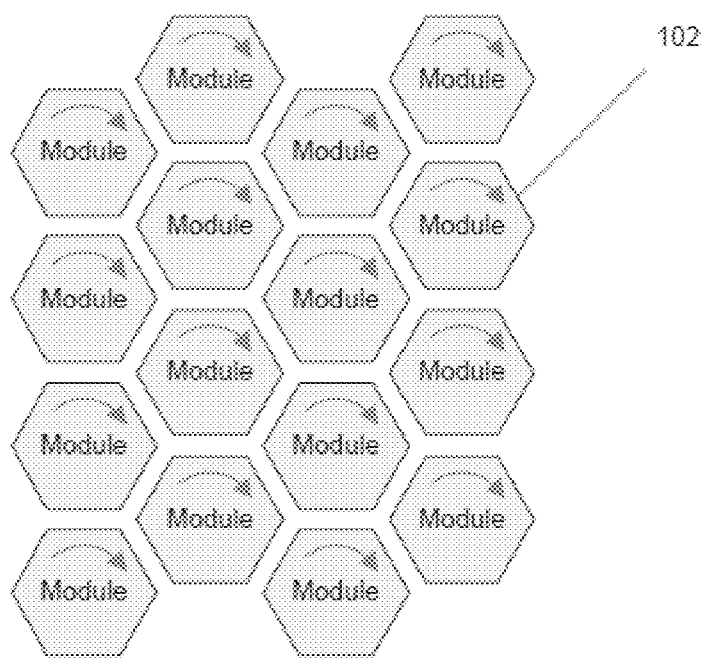
FIG. 5e conceptually illustrates movement and/or rotation of individual satellite modules in a space-based solar power station.
Figure 5F:
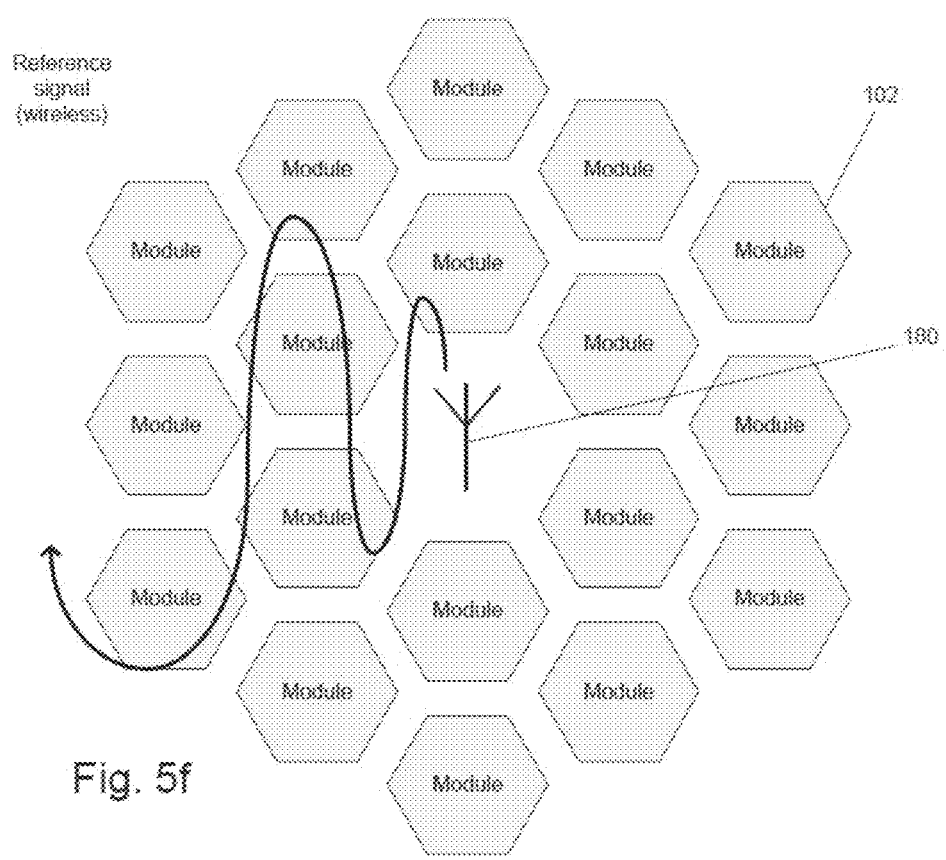
FIG. 5f conceptually illustrates the transmission of a reference signal to satellite modules within a space-based solar power station by a transmitter, according to one embodiment.

The process of distributing a reference signal between the sub-arrays formed by each of the satellite modules in a space-based solar power station in accordance with an embodiment of the invention is conceptually illustrated in FIG. 5d. A reference signal 170 is distributed 172 to each of the satellite modules 102 within the space-based solar power station. When a space-based solar power station is implemented using a plurality of independently orbiting satellite modules in the manner illustrated in FIG. 1, wired connections between the satellite modules of a space-based solar power station are not feasible. As is conceptually illustrated in FIG. 5e, movement and/or rotation of individual satellite modules 102 makes wired connections between the satellite modules difficult to implement. Furthermore, local wireless connections between the satellite modules can also be problematic due to the potential for continuous changes in the relative orientation of the satellite modules 102. Accordingly, reference signals can be distributed to the satellite modules of a space-based solar power station by a transmitter. The transmission of a reference signal to satellite modules 102 within a space-based solar power station by a transmitter 180 in accordance with an embodiment of the invention is conceptually illustrated in FIG. 5f. The wireless signal can then be propagated to the tiles on the panels of a satellite module using wired and/or wireless connections. In other embodiments, each panel within a satellite module can wirelessly receive the reference signal and/or individual power generation tiles within panels can wirelessly receive the reference signal.

Transmitters used to provide reference signals to space-based solar power stations in accordance with various embodiments of the invention can be located in space and/or on Earth. The transmissions can be implemented using communication technologies including (but not limited to) transmitters and receivers that establish RF and/or optical communication channels.

Figure 5G:
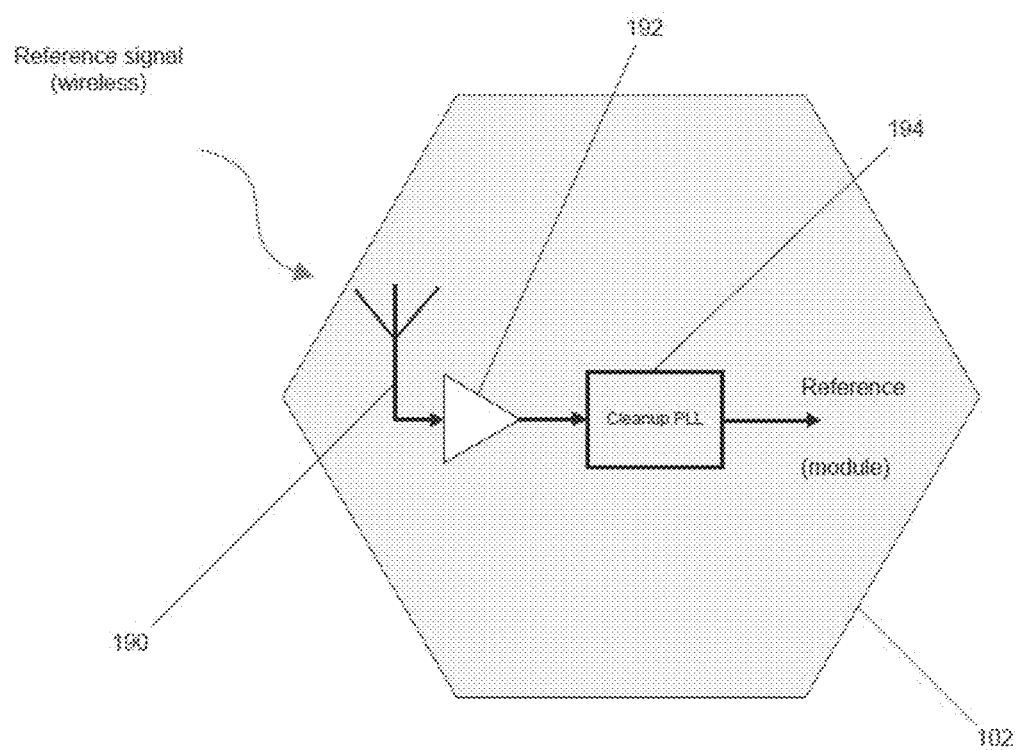
FIG. 5g conceptually illustrates a satellite module including an antenna to receive a transmitted reference signal, a low noise amplifier to increase the amplitude of the received reference signal, and a clean-up PLL to generate a low noise reference signal that is output to the power generation tiles within the satellite module, according to one embodiment.

In many embodiments, the received power of a transmitted reference signal is relatively weak compared to the signal strength of the reference signal distributed within a satellite module, and/or panel of the space-based solar power station. In a number of embodiments, satellite modules that receive the transmitted reference signal utilize a low bandwidth clean-up phase locked loop (PLL) to lower the noise component of the incoming reference signal. A satellite module 102 including an antenna 190 to receive a transmitted reference signal, a low noise amplifier 192 to increase the amplitude of the received reference signal, and a clean-up PLL 192 to generate a low noise reference signal that is output to the power generation tiles within the satellite module in accordance with an embodiment of the invention is conceptually illustrated in FIG. 5g.

Figure 5H:
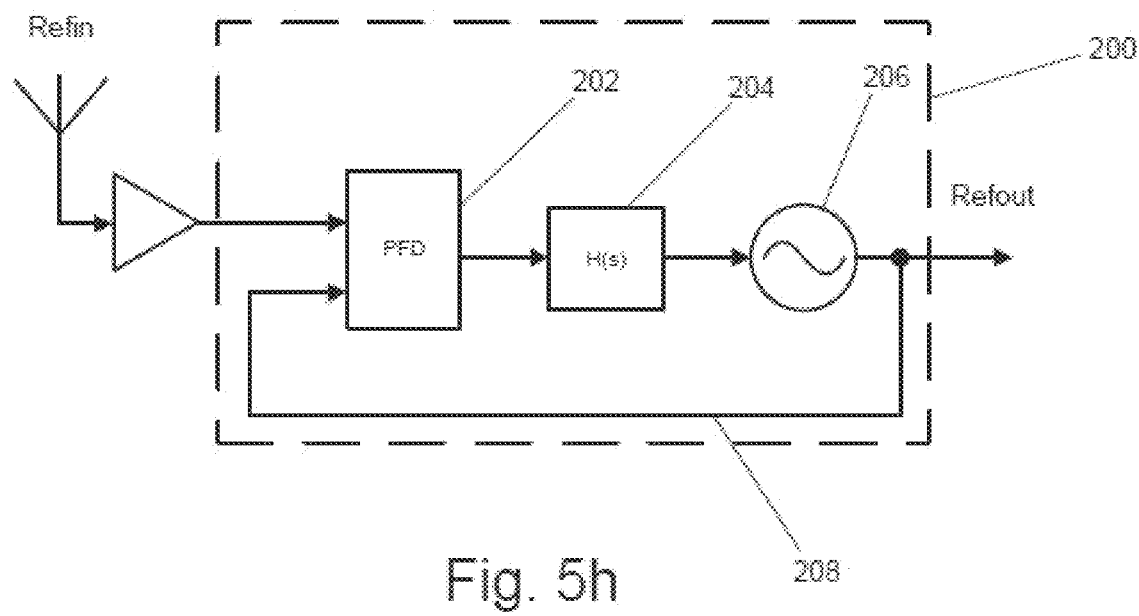
FIG. 5h conceptually illustrates an implementation of a clean-up PLL incorporating a low-noise voltage controlled oscillator, according to one embodiment.
Figure 5I:
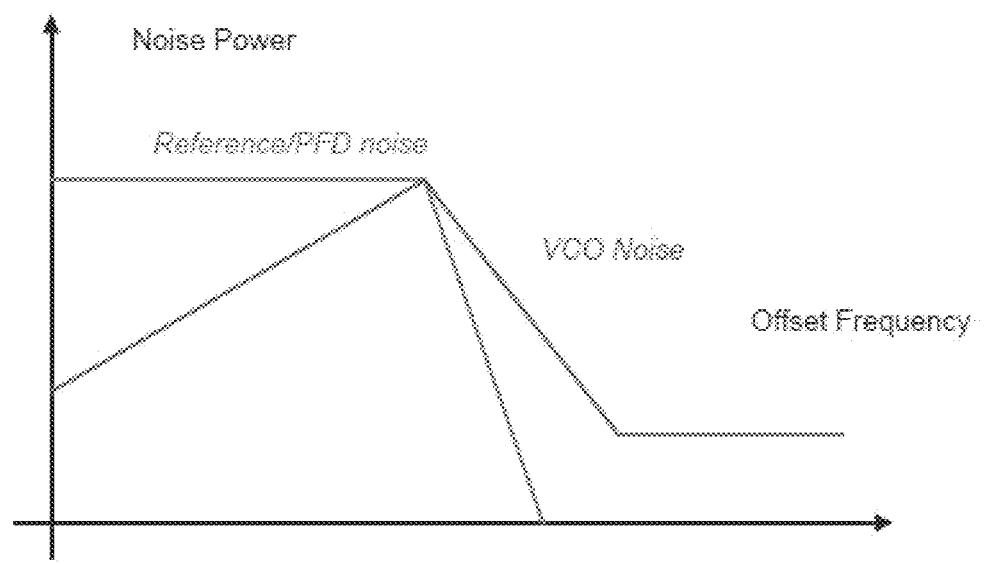
FIG. 5i conceptually illustrates the manner in which a clean-up PLL can band limit noise from a received reference signal thereby improving signal-to-noise ratio of the reference signal.

An implementation of a clean-up PLL incorporating a low-noise voltage controlled oscillator in accordance with an embodiment of the invention is conceptually illustrated in FIG. 5h. The clean-up PLL 200 includes a phase-frequency detector (PFD) 202 that outputs a digital pulse with a width proportional to a sampled phase error. The digital pulse is provided to a control circuit 204 that generates a control voltage provided to a voltage controlled oscillator (VCO) 206. A feedback loop 208 enables the PFD to perform a phase comparison between the output generated by the VCO 206 and the received reference signal. As noted above, the clean-up PLL band limits the noise from the received reference signal and the remaining VCO noise should be lower than the reference noise as conceptually illustrated in FIG. 5i. Although specific circuits for receiving transmitted reference signals are described above with reference to FIGS. 5g-5i, any of a variety of receivers can be utilized to receive a reference signal at a spaced-based solar power station for the purposes of coordinating the operation of power generation tiles as an antenna array as appropriate to the requirements of specific applications in accordance with embodiments of the invention.

Ideally, noise in the received reference signal correlates among all receivers within a space-based solar power station in accordance with embodiments of the invention. In practice, however, differences in the receiver electronics (e.g. slightly different loop bandwidths of clean-up PLLs) in different receivers will de-correlate noise. In addition, different receivers will receive different background noise. Receive antennas can receive noise from the Earth, the Sun, and cosmic background. In embodiments that utilize a space-based reference transmitter (e.g. a transmitter located on a satellite orbiting with the space-based solar power station), the dominant noise sources include the Earth (angle dependent) and cosmic background radiation. Accordingly, the receive antenna can have high gain resulting in better signal-to-noise ratio of the received reference signal, assuming that the relative position of the reference transmitter and receiver on the module or tile does not vary appreciably. When an Earth-based reference transmitter is utilized, dominant sources of noise include noise from the Earth, the Sun, and cosmic background radiation. Accordingly, the receive antenna will have low gain. The transmitter power required to obtain a desired reference signal strength at a space-based solar power station can be determined using Friis' equation, which is as follows:

$$\frac{P_{received}}{P_{transmitted}} = \left(\frac{\lambda}{4\pi R}\right) G_{tr} G_{rc}$$

Figure 5J:
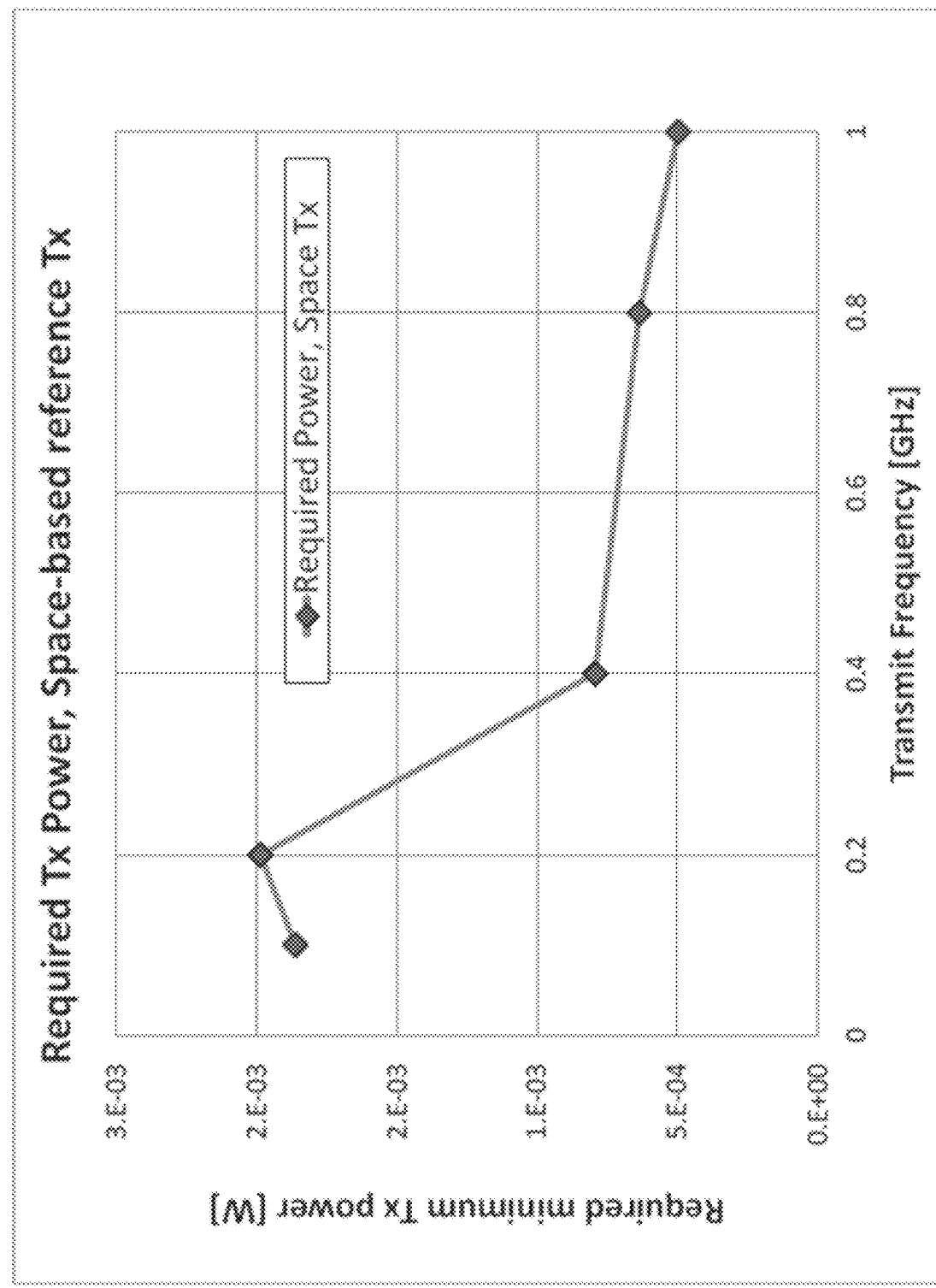
FIG. 5j conceptually illustrates the minimum transmitter power required when utilizing a space-based reference transmitter to transmit a reference signal, according to one embodiment.

Minimum transmitter power required when utilizing a space-based reference transmitter in accordance with various embodiments of the invention is illustrated in FIG. 5j. Below 1 GHz, background noise power grows somewhat faster than the square of the wavelength of the transmitter reference signal. Friis' equation also suggests a shrinking absolute receive antenna size in a manner that is inversely proportional to the square of the wavelength of the transmitted signal. When utilizing a space-based reference transmitter, it is worthwhile noting that centrally locating the transmitter relative to the satellite modules of the space-based solar power station can create a system that is sensitive to movement of the satellite modules relative to the transmitter. Accordingly, locating the transmitter a distance that is sufficiently large that relative movement of the transmitter and the satellite modules of the space-based solar power station impacts each of the receivers on the space-based solar power station approximately equally can be desirable.

Figure 5K:
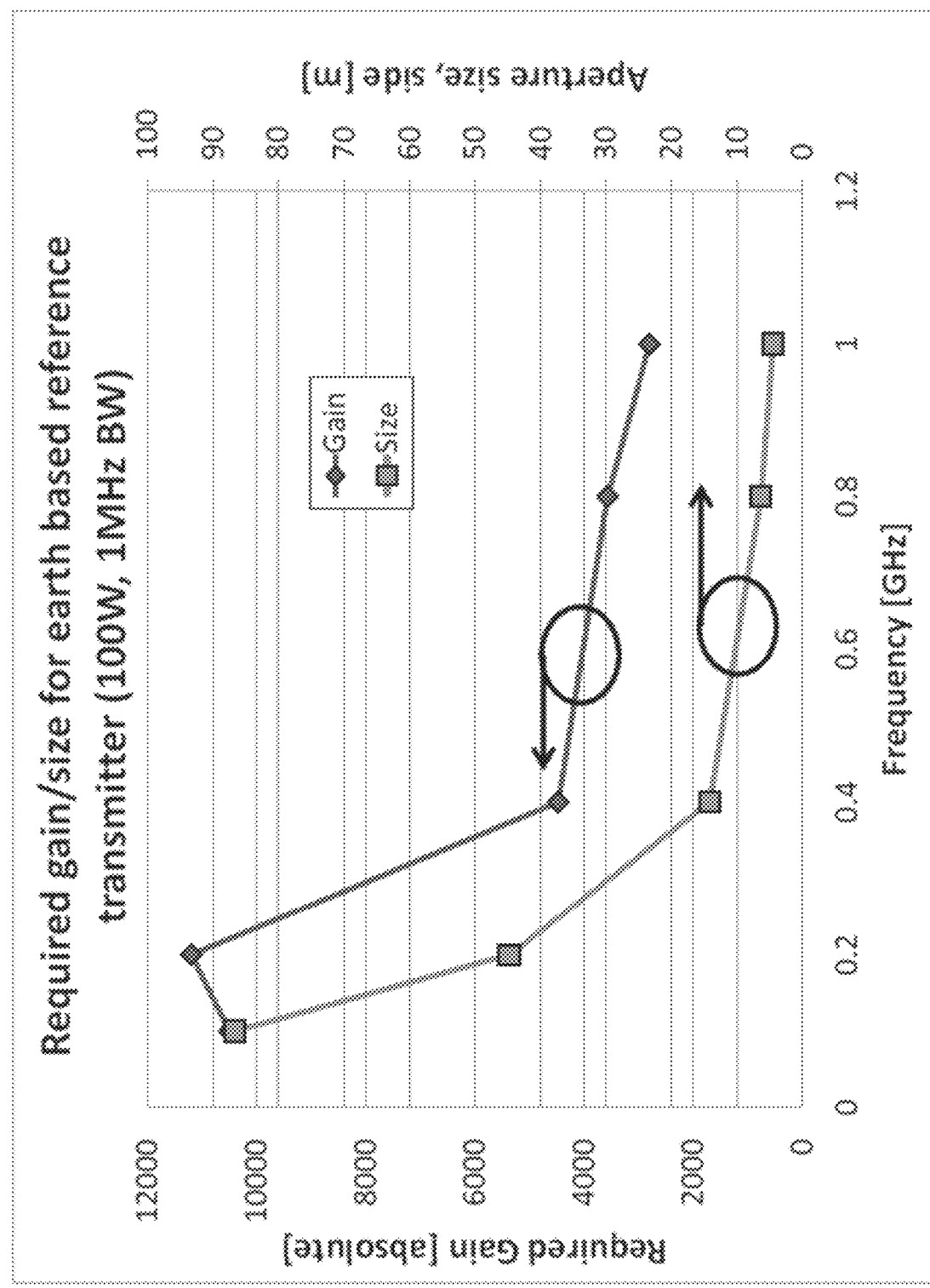
FIG. 5k conceptually illustrates the required gain and aperture size for a receiver that receives a reference signal transmitted by an Earth-based transmitter, according to one embodiment.

Transmitting a reference signal from Earth can be comparatively more robust to the relative motion of the satellite modules of a space-based solar power station. However, the transmitted signal can be more prone to jamming and interference. Required gain and aperture size for a receiver that receives a reference signal transmitted by an Earth-based transmitter in accordance with various embodiments of the invention is illustrated in FIG. 5k.

Figure 5L:
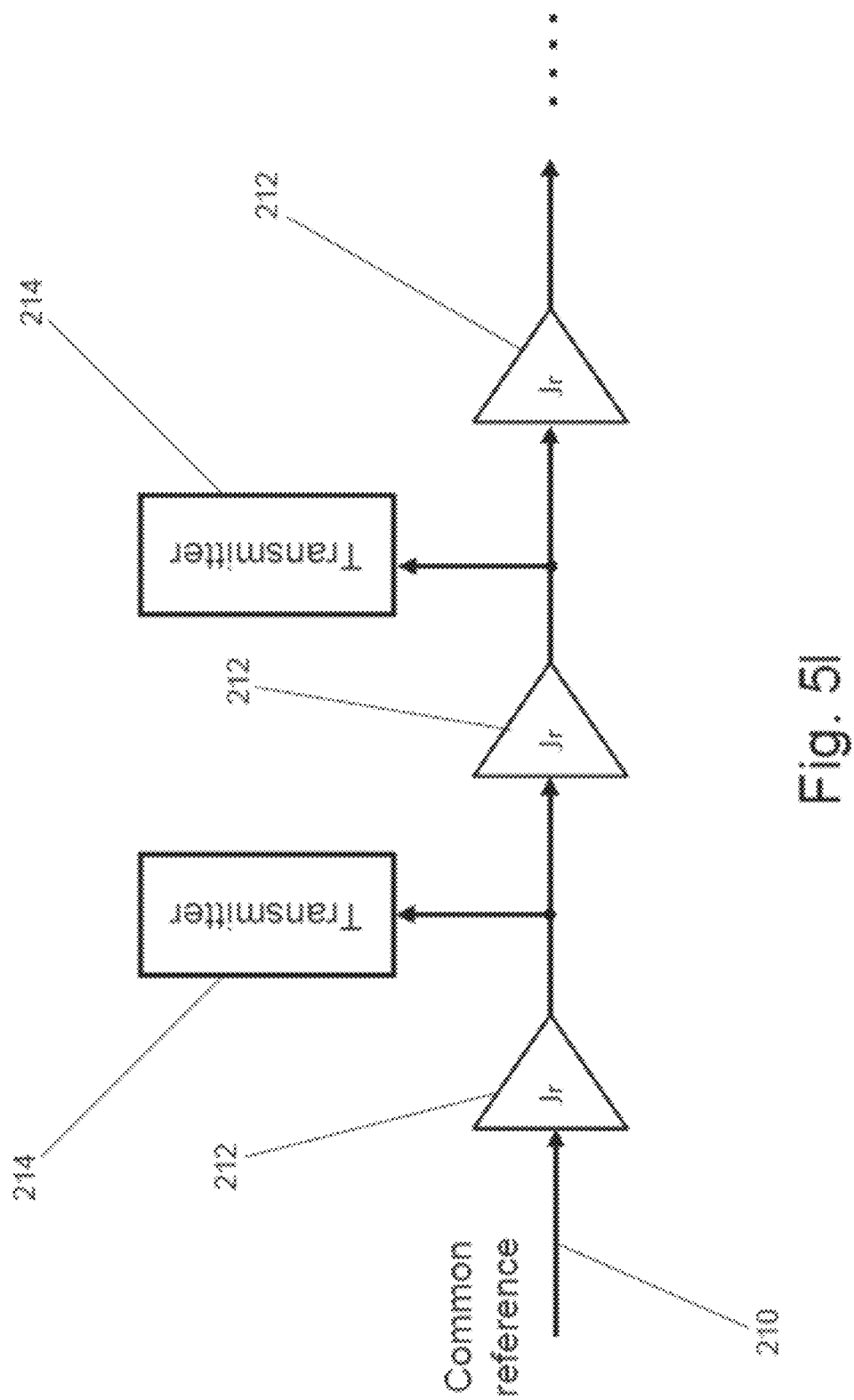
FIG. 5l conceptually illustrates the redistribution of a reference signal and the cascading of jitter.
Figure 5M:
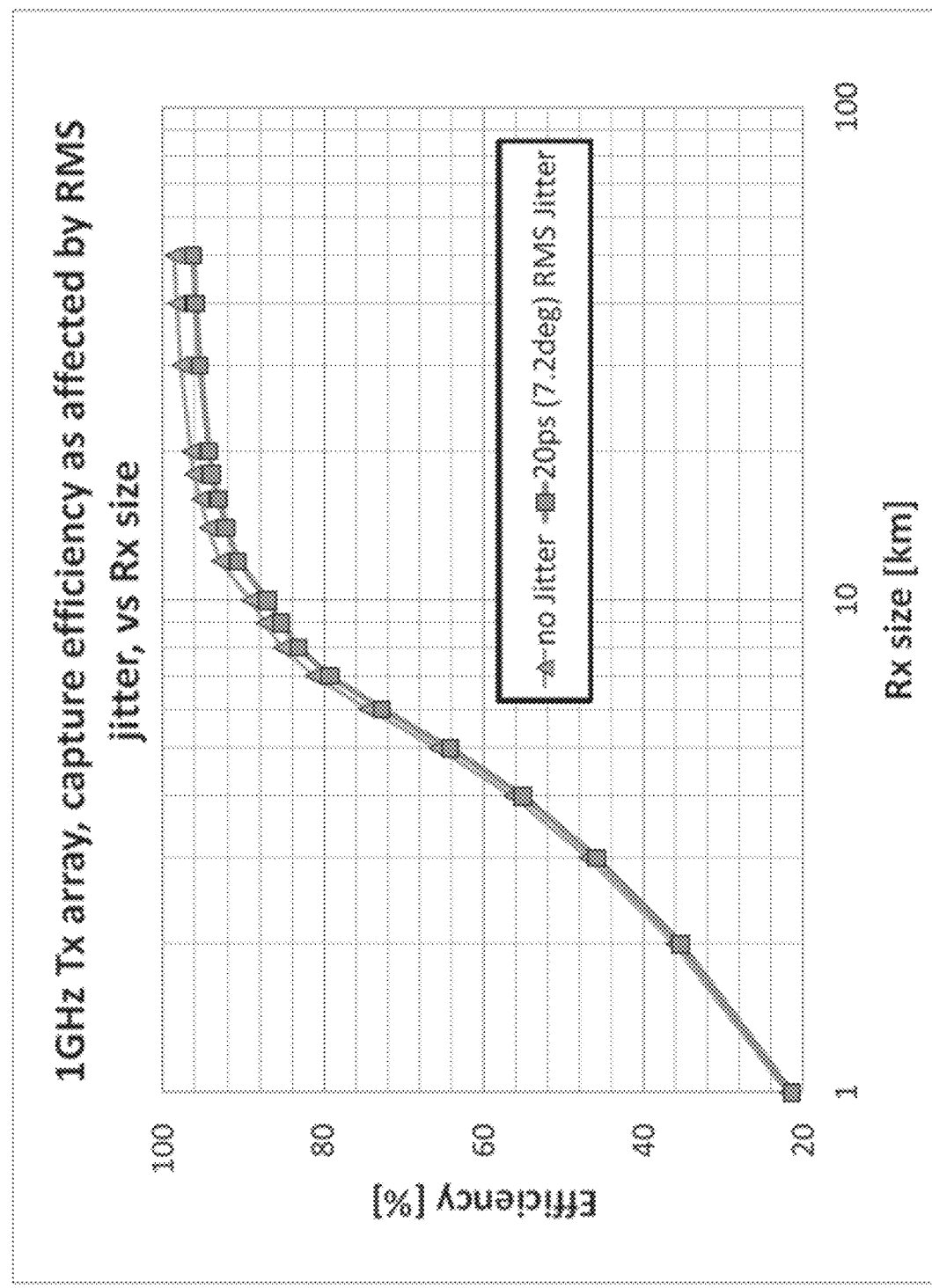
FIG. 5m illustrates the results of simulations of the effect of jitter on the efficiency of power transmission by a 75 m×60 m space-based solar array at 1 GHz based upon the size of the rectenna array receiver.
Figure 5N:
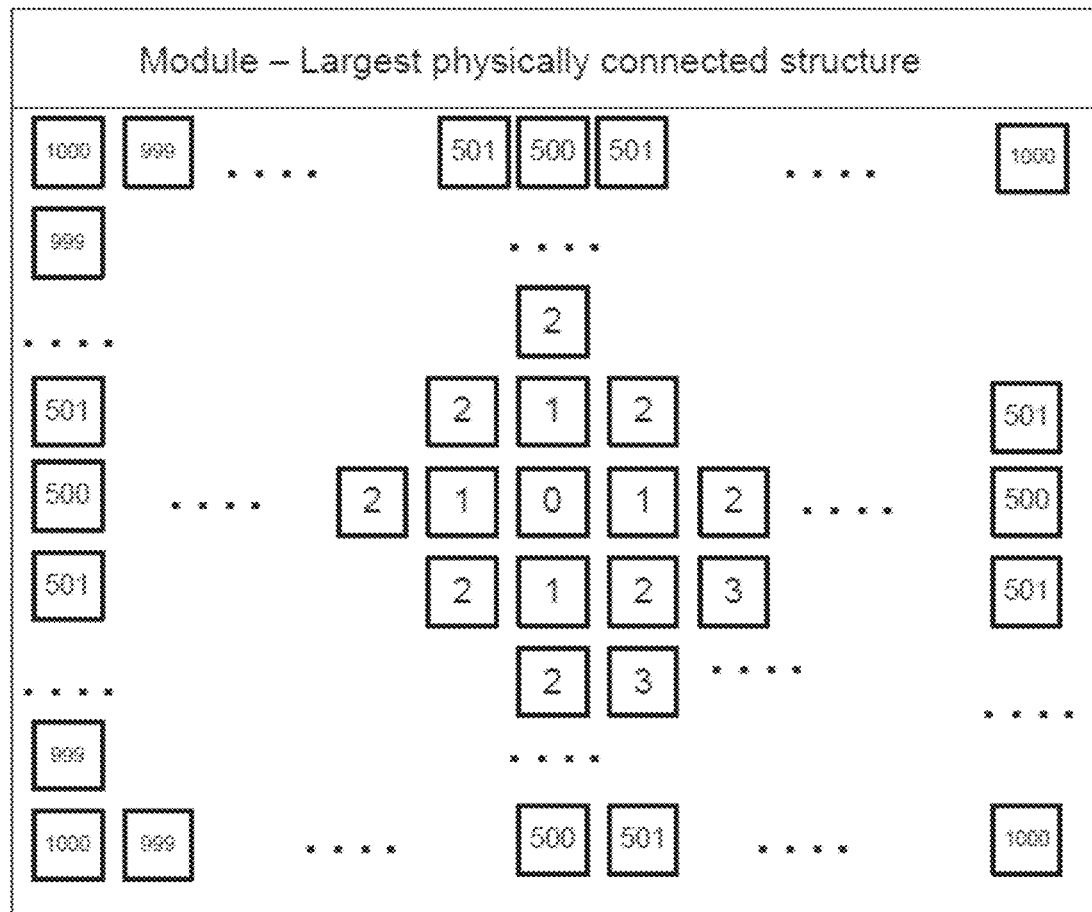
FIG. 5n conceptually illustrates the routing of a reference signal amongst power generation tiles, according to one embodiment.

Once a reference signal is received at a space-based solar power station, distribution of the reference signal between control circuits of power generation tiles can result in increased jitter in the reference signal with increased redistribution of the reference signal. The redistribution of a reference signal typically involves the buffering and retransmission of the reference signal, which increases jitter. The cascading of jitter in this manner in conceptually illustrated in FIG. 5l. A common reference signal 210 is provided to control circuitry that introduces jitter 212 in the synthesis of an RF signal transmitted by a transmitter 214. The jitter introduced by the control circuitry is compounded in each cascaded redistribution of the common reference signal. Efficiency can be shown to degrade proportionally to the root of the sum of the squared jitter contributions. Simulations of the effect of jitter on the efficiency of power transmission by a 75 m×60 m space-based solar array at 1 GHz based upon the size of the rectenna array receiver are illustrated in FIG. 5m. In many embodiments, the received reference signal can be routed to the power generation tiles within a satellite module in such a way as to reduce and/or minimize the average number of stages of reference signal distribution prior to the reference signal being received by the control circuitry of a power generation tile. In several embodiments, the received reference signal is routed in a manner conceptually illustrated in FIG. 5n in which the reference signal is provided by a power generation tile to its immediately adjacent power generation tiles (i.e. power generation tiles that are adjacent, but not diagonally adjacent) that do not already receive the reference signal from another power generation tile.

Although specific techniques for distributing a reference signal between control circuitry of power generation tiles within a panel and/or satellite module of a space-based solar power station are described above with reference to FIGS. 5l-5n, any of a variety of techniques can be utilized to distribute a common reference to control circuitry of power generation tiles including (but not limited to) separately transmitting the common reference to each power generation tile, wirelessly transmitting the common reference signal to power generation tiles within the satellite module, and/or utilizing different routings to reduce the average number of redistributions of the common reference as appropriate to the requirements of specific applications in accordance with embodiments of the invention. As discussed above, the phase shifts and/or amplitude modulations applied to the reference signal by the control circuitry of a specific power generation tile typically depends upon the location of the power generation tile relative to other power generation tiles in the array. Processes for determining the locations of power generation tiles within a space-based solar power station for the purposes of modifying the phase and/or amplitude of a reference signal received by the power generation tiles in accordance with various embodiments of the invention are discussed further below.

Processes for Determining Location of Elements in a Space-Based Solar Power Station The phase shift and/or amplitude modulation applied to a reference signal by the control circuitry of a specific power generation tile ideally should depend upon both the path length travelled by the reference signal to reach the control circuitry and the relative position of the antenna of the power generation tile relative the other antennas within the antenna array. In a conventional phased array, antennas within the array are fixed statically relative to each other and can be calibrated accordingly. The freedom of movement of satellite modules, panels, and/or power generation tiles within a space-based solar power station in accordance with various embodiments of the invention increases the complexity of determining the phase shift to be applied in order to coordinate the activity of the array of antennas to create a steerable beam of transmitted power. Shifts in the relative positions of the satellite modules, panels, and/or power generation tiles can alter the distance travelled by a reference signal to reach a specific power generation tile. In addition, the shifts can change the baseline and orientation of the antenna of a specific power generation tile relative to the antennas of other power generation tiles within the array. In a number of embodiments, the location of the antennas of the power generation tiles is determined and the locations utilized to determine a phase shift and/or an amplitude modulation to apply to a reference signal received by the power generation tiles.

Various approaches can be taken with respect to the determination of location including approaches that involve centralized computation, a hierarchy of computations and/or distributed computations to determine location. As noted above, location information can include a fixed location and/or one or more relative locations with respect to a reference point. Locations can be specified with respect to both displacement and rotation. In many embodiments, location can be determined using partially redundant systems, such as, but not limited to, gyroscopes, accelerometers, electronic ranging radar, electronic positioning systems, phase and/or timing information from beacons, as well as employing a priori knowledge from system steering and flight control commands. In several embodiments, electronic systems are located on the ground, and/or in space on satellites deployed for this purpose (and, possibly, other purposes, e.g. in the case of using GPS satellites).

Figure 5O:
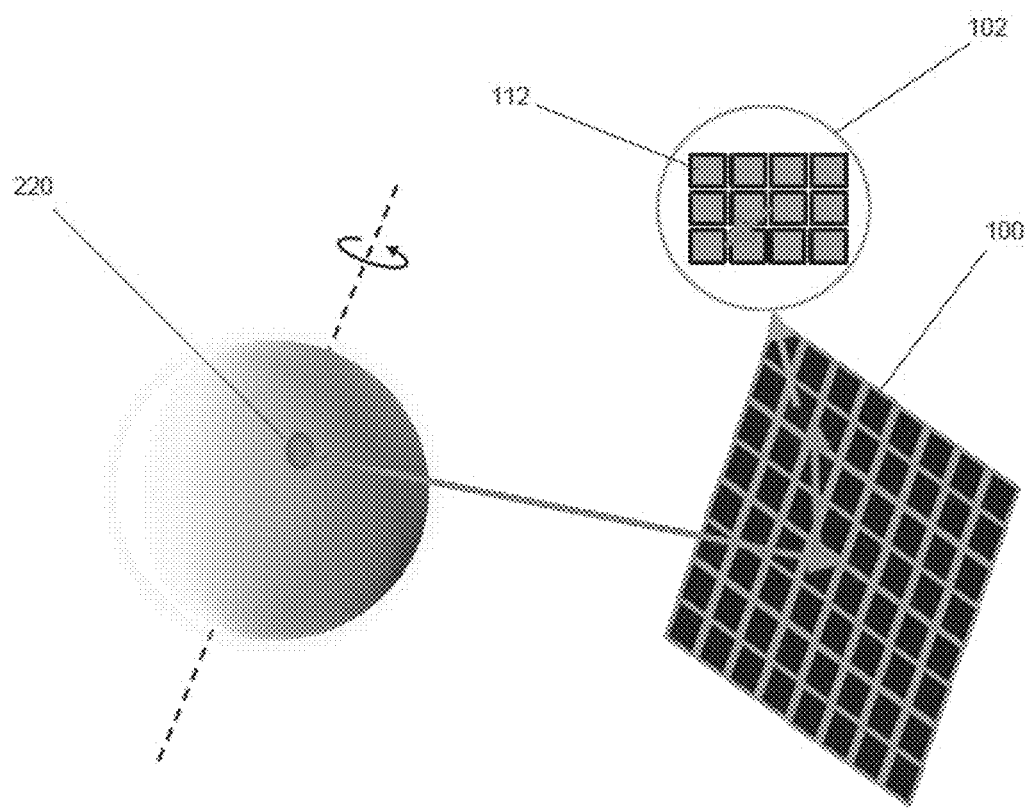
FIG. 5o conceptually illustrates determination of location using a signal or signals transmitted by an Earth-based transmitter or transmitters, according to one embodiment.
Figure 5P:
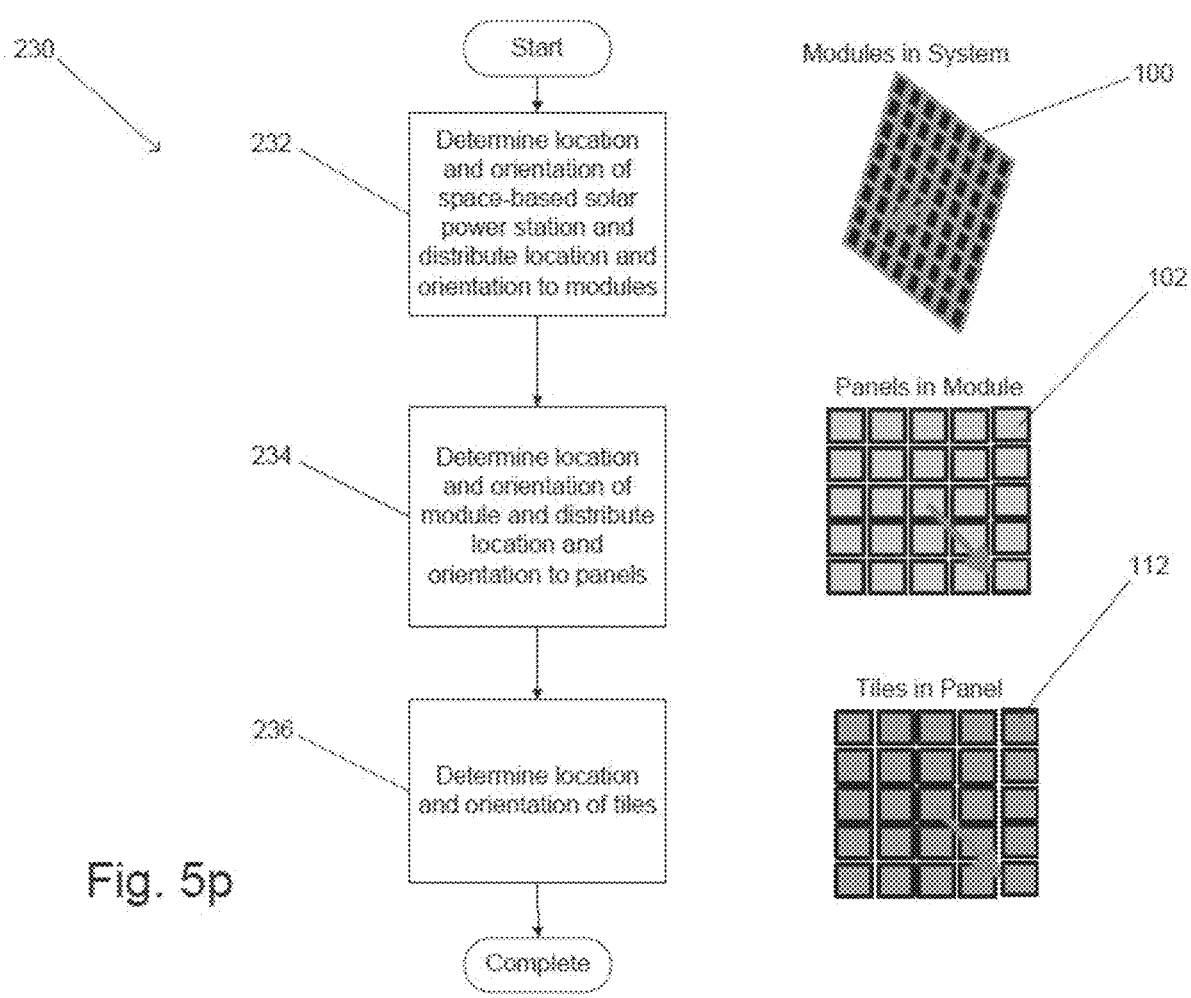
FIG. 5p conceptually illustrates a process for distributing location information in a hierarchical fashion between satellite modules, panels and/or tiles within the space-based solar power station according to one embodiment.

Determination of location using a signal or signals transmitted by an Earth-based transmitter or transmitters in accordance with an embodiment of the invention is conceptually illustrated in FIG. 5o. In the illustrated embodiment, the terrestrial transmitter 220 transmits a ranging signal to a space-based solar power station 100 and the space-based solar power station 100 utilizes a hierarchical approach to determine the locations of the antennas of the power generation tiles 112 in each of its satellite modules 102. As is illustrated in FIG. 5p, the process 230 of distributing location information in a hierarchical fashion between satellite modules, panels and/or tiles within the space-based solar power station, such that a central processing unit determines (232) location based upon the received signal and relays a determined location, which can include (but is not limited to) the location and orientation of the entire space-based solar power station with respect to a ground station and/or other suitable known locations to satellite modules within the system. The relayed information can be expressed as an absolute and/or differential location(s), and/or orientation(s) as appropriate to the requirements of specific applications. In a similar fashion, the location and/or orientation of each satellite module with respect to the center of the space-based solar power station or other suitable reference point can be determined (234) at each satellite module using processes similar to those outlined above. Furthermore, going down a hierarchical level, the position and orientation information of individual panels and tiles can be determined (234) in a similar fashion by the control circuitry of individual power generation tiles. The entirety or any useful part of this information can be used at the tile-level, the panel-level, the module-level, the system-level and/or any combination thereof to control the phase and/or amplitude of the RF signal provided to the antennas of each power generation tile to form a beam or focal spot on the ground. The aggregate computational power of the computational resources of each tile, panel and/or satellite module can be utilized since each tile (and/or panel or satellite module) can utilize its local computational power available from a DSP, microcontroller or other suitable computational resource to control its operation such that the system in aggregate generates the desired or close-to desired beam and/or focused transmission.

Although specific hierarchical approaches and hierarchical processes for determining location information are described above with respect to FIGS. 5o and 5p, any of a variety of approaches can be utilized to determine location as appropriate to the requirements of specific applications in accordance with embodiments of the invention including (but not limited to) approaches that rely upon spaced-based transmission to determine position and/or orientation and/or approaches that utilize a variety of sources of information to determine position and/or orientation.

Figure 5Q:
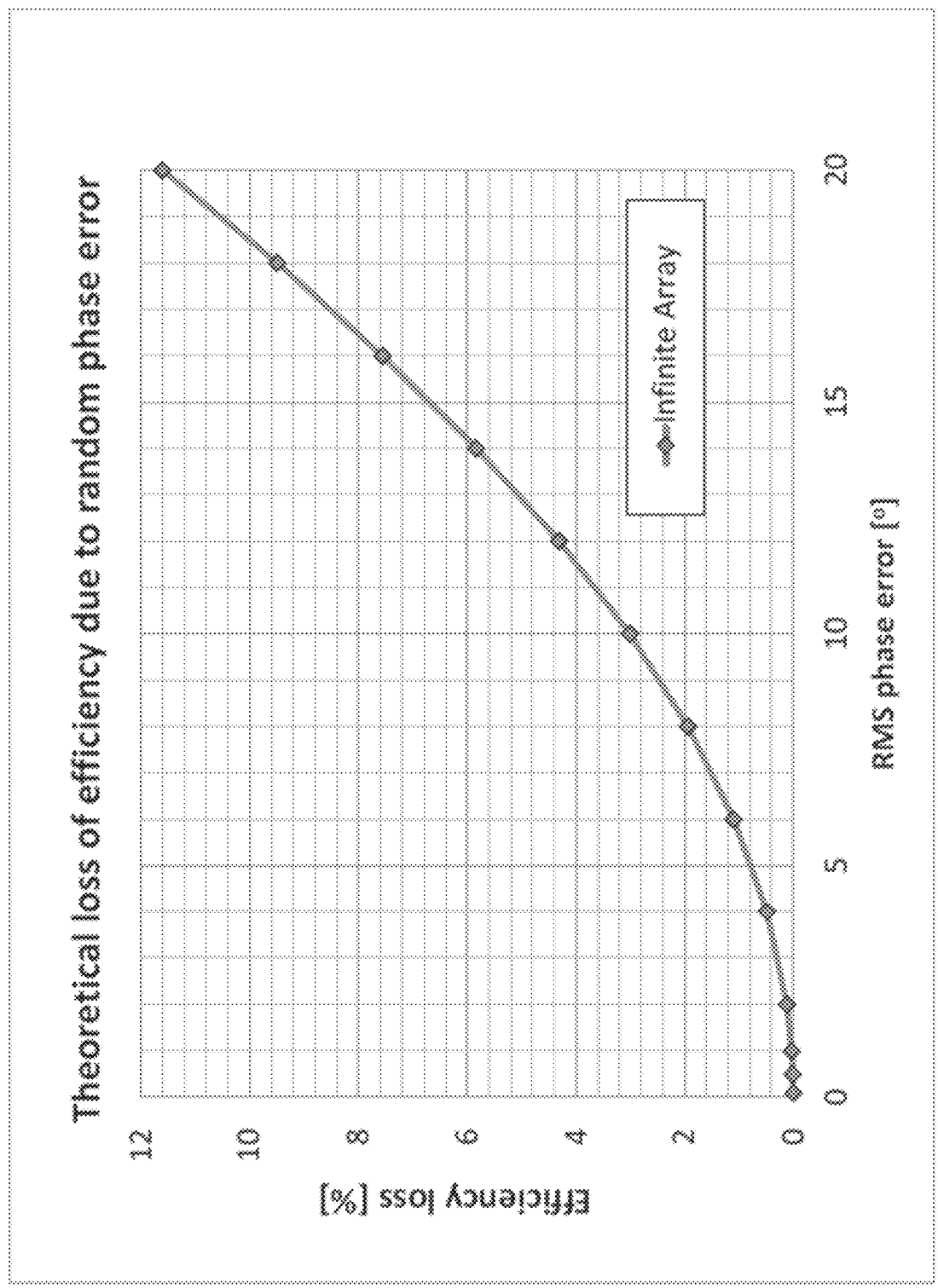
FIG. 5q conceptually illustrates the impact of the RMS phase error in an antenna array on efficiency, according to one embodiment.

As noted above, the precision with which location of various elements within a space-based solar power station is determined can be a factor that contributes to the phase error. The impact of the RMS phase error in an antenna array on efficiency is illustrated in FIG. 5q. Accordingly, the specific techniques utilized to determine location in space-based solar power array systems will typically depend upon the efficiency requirements of a specific application. The hierarchical distribution of reference signals, location information, and command and control information in accordance with various embodiments of the invention is discussed further below.

Coordinating Communication Between Elements of a Space-Based Solar Power Station A variety of processes are described above for distribution of reference signals and hierarchical calculation and distribution of location information between satellite modules, panels and/or tiles within a space-based solar power station implemented in accordance with various embodiments of the invention. In a number of embodiments, space-based solar power stations include satellite modules, panels and/or tiles with specialized functions to assist in the receipt and coordination of the distribution of different types of information to other elements of the space-based solar power station.

Figure 5R:
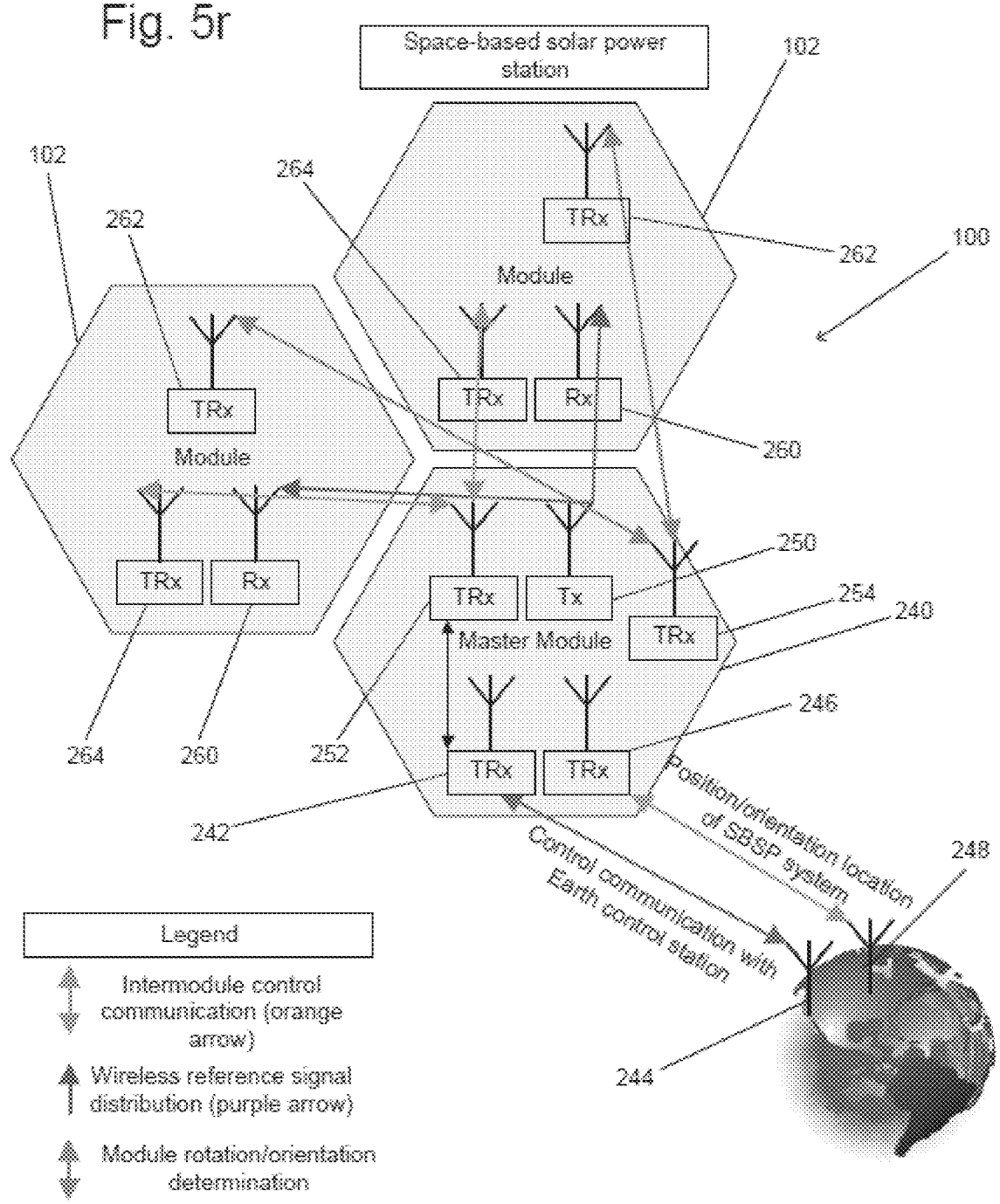
FIG. 5r conceptually illustrates a space-based solar power station that includes at least one master satellite module configured to coordinate the receipt and distribution of a reference signal, location information, and command and control information, according to one embodiment.

A space-based solar power station that includes at least one master satellite module configured to coordinate the receipt and distribution of a reference signal, location information, and command and control information in accordance with an embodiment of the invention is illustrated in FIG. 5r. The space-based solar power station 100 includes a master satellite module 240 that includes a first transceiver 242 configured to receive a reference signal from an Earth-based transmitter 244. The master satellite module 240 also includes a second transceiver 246 configured to receive at least one ranging signal that can be utilized to determine the location of the space-based solar power station from at least one Earth-based transmitter 248. Although Earth-based transmitters are shown, space based transmitters and/or a combination of Earth-based and space-based transmitters can be utilized as appropriate to the requirements of specific applications in accordance with embodiments of the invention.

In the illustrated embodiment, the master satellite module 240 includes an additional transmitter 250 configured to wirelessly transmit the reference signal to other satellite modules 102 within the space-based solar power station. Data can also be wirelessly transmitted between the satellite modules using at least one transceiver located on each satellite module. In the illustrated embodiments, a first transceiver 252 is utilized to wirelessly transmit location information describing the location of the space-based solar power station to other satellite modules. As noted above, the location information can be absolute location and/or relative location information. In many embodiments, the location of the space-based solar power station is expressed as a position and an orientation. The master satellite module 240 also includes a second transceiver 254 that is utilized as a separate channel via which command and control information can be communicated. As can readily be appreciated, both location and command and control information may alternatively be transmitted on the same communication links. Alternatively the first transceiver can be implemented as a beacon that can be utilized by receivers on other satellite modules to determine position relative to the master satellite module. When the first transceiver is a beacon, the second transceiver can communicate location information describing the location of the space-based satellite array and/or the master satellite module to the other satellite modules.

When a satellite module 102 is equipped with appropriate receiver technology, the satellite module can receive the reference signal, location information, and/or command and control information transmitted by the master satellite module. In addition, various satellite modules 102 can provide data to the master satellite module including (but not limited to) location information describing the location of a specific satellite module, and command and control data. In the illustrated embodiment, the satellite modules 102 include a receiver 260 for receiving a reference signal. As noted above, the satellite module 102 can distribute the received wireless reference signal via wired connections to different power generation tiles within satellite module. The satellite modules 102 can also include a first transceiver 262 for exchanging location information with other satellite modules including (but not limited to) master satellite module(s) and a second transceiver 264 for exchanging command and control information with other satellite modules. As noted above, space-based solar power stations can use a single transceiver to exchange both location information, and command and control data with other satellite modules.

Figure 5S:
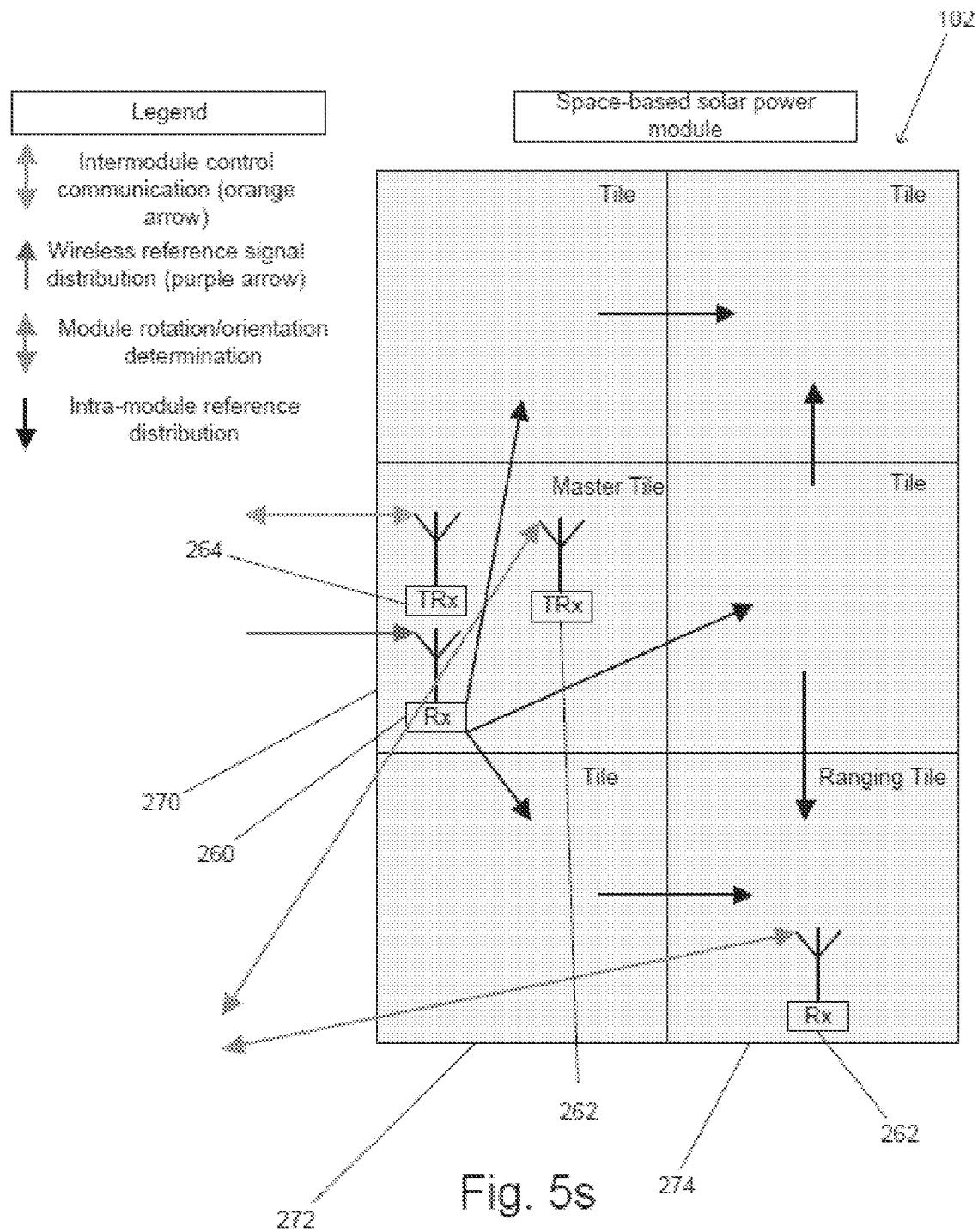
FIG. 5s conceptually illustrates the use of different classes of power generation tiles to coordinate distribution of reference signals, location information, and/or command and control information within a satellite module, according to one embodiment.

The use of different classes of power generation tiles to coordinate distribution of reference signals, location information, and/or command and control information within a satellite module in accordance with an embodiment of the invention is illustrated in FIG. 5s. A satellite module 102 can include a master tale 270 that includes the receiver 260 for receiving a reference signal, the first transceiver 262 for exchanging location information with other satellite modules and the second transceiver 264 for exchanging command and control information with other satellite modules. Using the transceivers, the master power generation tile 270 can obtain a reference signal wirelessly transmitted from another satellite module and distribute the reference signal to other power generation tiles 272 within the satellite module. In many embodiments, the received reference signal is amplified and noise removed using a circuitry such as (but not limited to) the clean-up PLL described above. In addition, the master tile 270 can act as a hub for the exchange of location information, and command and control information within the satellite module. As can readily be appreciated, the various receiver and transceivers incorporated within the master power generation tile 270 can be distributed across multiple tiles within a satellite module. Furthermore, additional specialized tiles that may or may not perform power generation functions can be incorporated within a satellite module in accordance with various embodiments of the invention including (but not limited to) ranging tiles 276 that include a receiver or transceiver 262 capable of receiving location information and/or at least one ranging signal from which additional location information can be determined. Distributing the capability of determining location across multiple tiles within a satellite module can enable a more precise determination of the location of the satellite module and/or individual power generation tiles within the satellite module. Other functions that specialized tiles within a satellite module could accomplish are communication with a specialized system module (or separate control satellite) that coordinates operation over all satellite modules as well as communicating with the panels and tiles in the particular module. A specialized tile can also provide ranging or beacon functionality to allow tracking the satellite module position and orientation with respect to one or more reference locations such as co-orbiting satellites. Furthermore, a satellite module may contain more than one of these specialized tiles to facilitate measurement of the orientation and location of the satellite module as a whole and all of its tiles therein. The specialized tile or tiles may be of somewhat different dimension as the numerous power generation tiles to provide the necessary footprint for receive and transmit antennas since different frequencies requiring different footprints may be employed to facilitate communication. If the specialized tiles are sufficiently sparsely located within a module, these specialized tiles will result in negligible loss in microwave beam fidelity and minimal overhead. The specialized tiles can themselves be powered by PV cells operated for this particular purpose.

Although various types of specialized satellite modules, panels, and tiles for coordinating the distribution of reference signals and information throughout a space-based solar power station are described above with reference to FIGS. 5r and 5s, any of a variety of specialized elements can be utilized in the construction of space-based solar power stations as appropriate to the requirements of specific applications in accordance with embodiments of the invention. A variety of additional factors that can impact efficiency of received power transmitted by a space-based solar power station constructed in accordance with various embodiments of the invention is discussed further below.

Factors Impact Efficiency of Power Transmissions from a Space-Based Solar Power Station In many embodiments, the space-based solar power station is designed as a modular array where a plurality of satellite modules and power generating tiles located thereon form the elements of an antenna array. As can readily be appreciated, many factors can impact the efficiency of a given space-based solar power station constructed in accordance with various embodiments of the invention including (but not limited to) the size of the space-based solar power station, the number of satellite modules, number of panels per satellite module, number of power generation tiles per panel, antenna spacing, transmitted frequency of the wireless power transmission, and size of the rectenna array utilized to receive the transmitter power. The manner in which various design decisions can impact the performance of a space-based solar power stations in accordance with various embodiments of the invention is discussed further below.

Figure 6A:
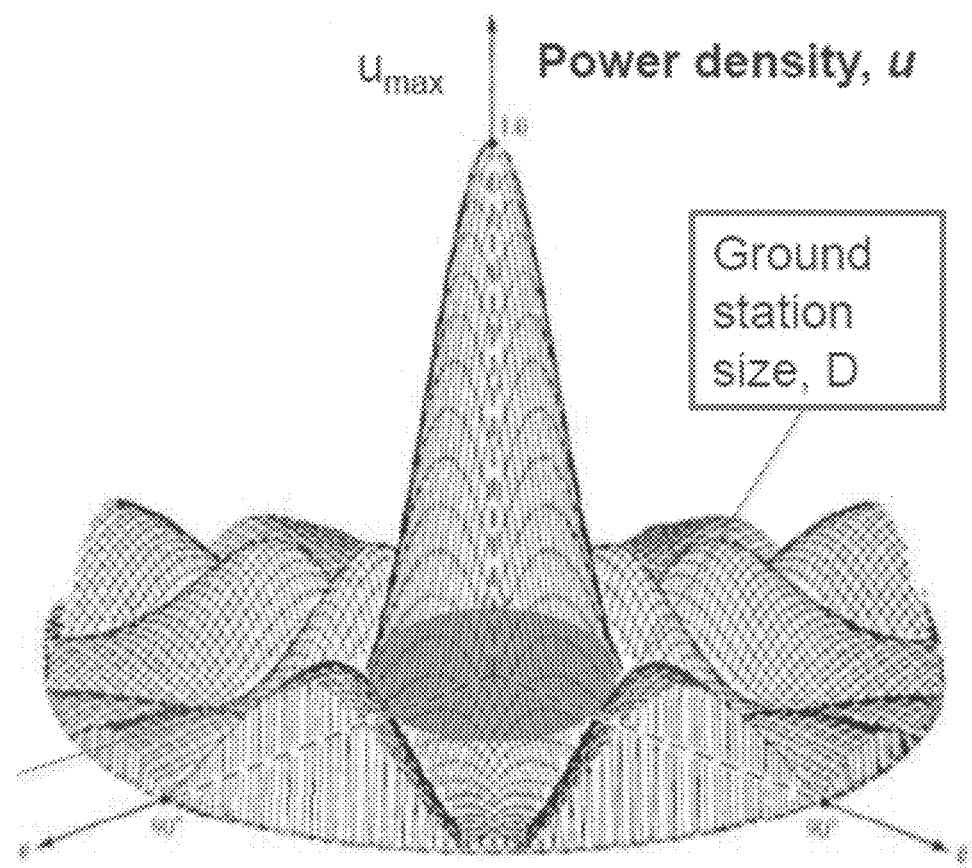
FIG. 6a conceptually illustrates the power density distribution at a ground receiver from a transmission of power from a phased array of antennas on a solar power station, according to embodiments.
Figure 6B:
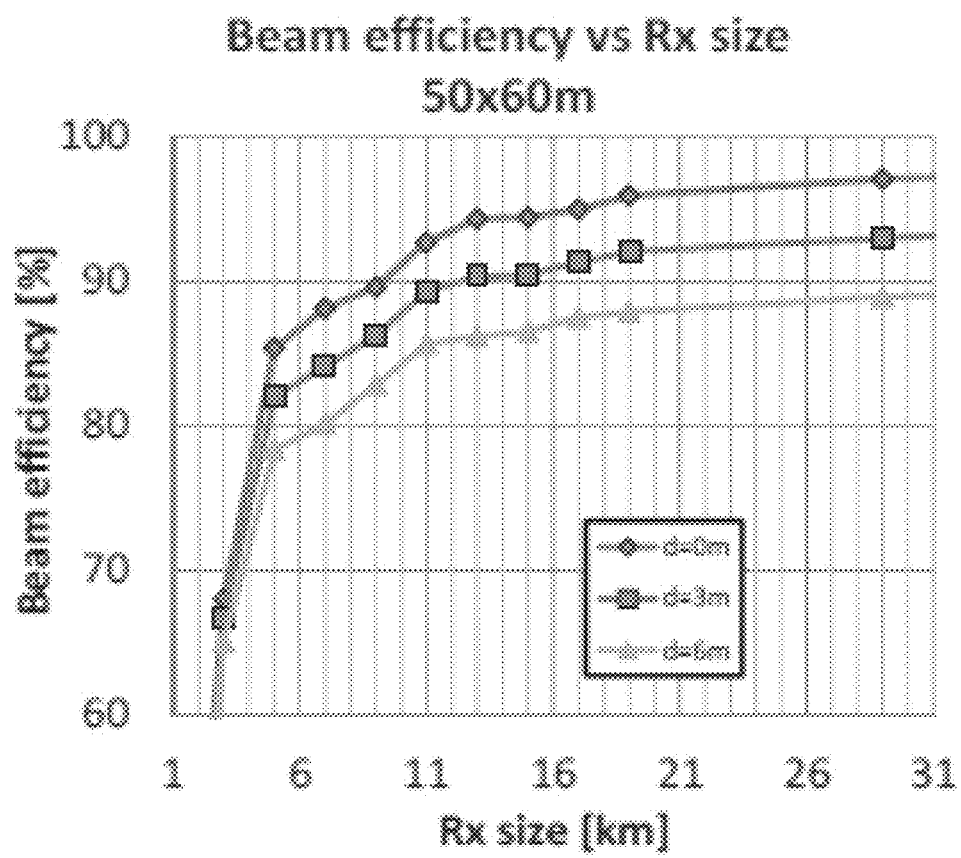
FIG. 6b conceptually illustrates the increase in efficiency of power transmission systems that utilize different spacing of transmit antennas with the increased size of the receiver array.
Figure 6C:
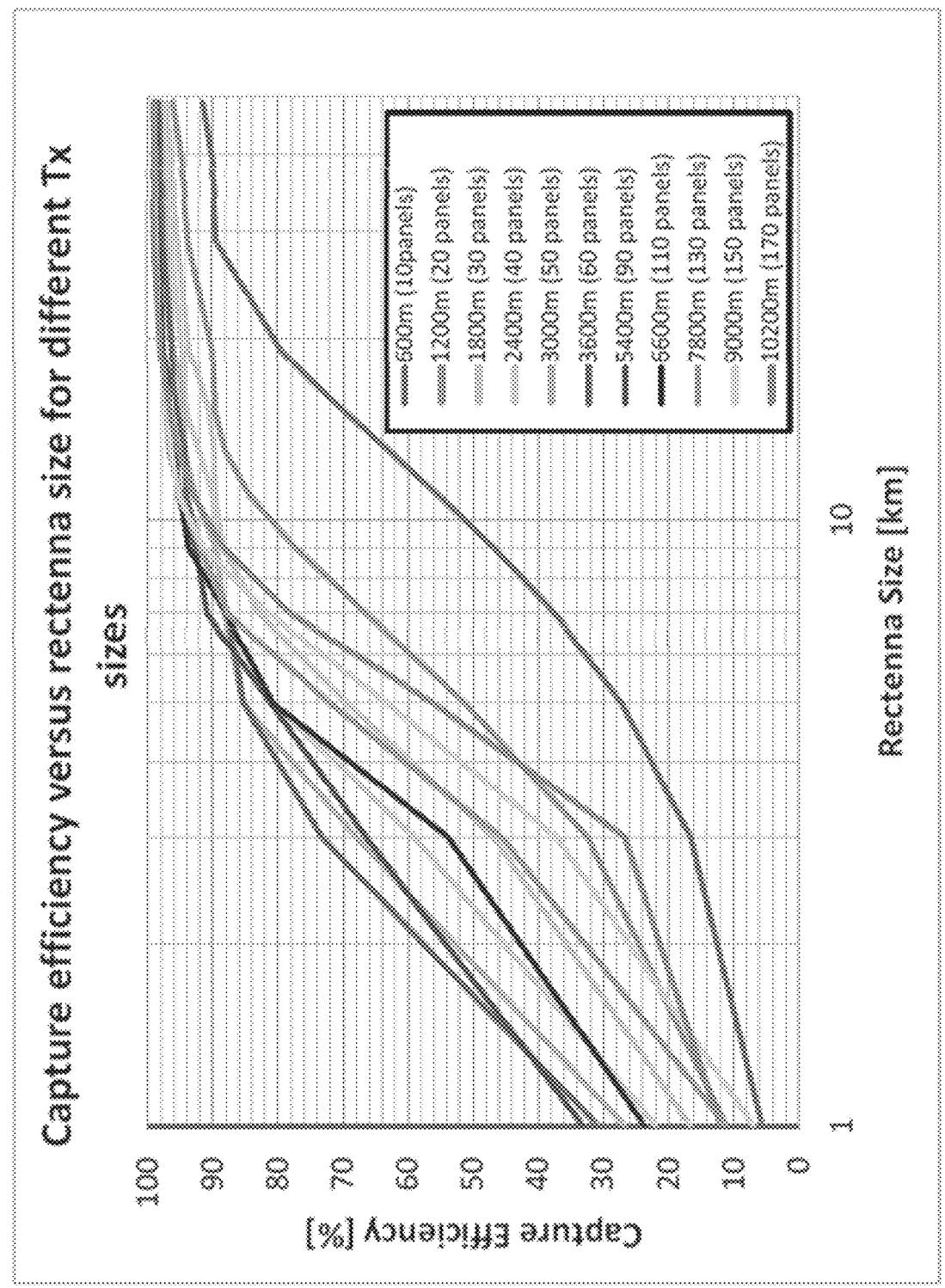
FIG. 6c conceptually illustrates the manner in which the efficiency of power transmission is impacted by both the size of the array of antenna elements utilized to form the ground spot and the size of the rectenna array utilized to receive the transmitted power.

A space-based solar power station can include N×N satellite modules, each satellite module including power generation tiles of $M/N^2$. The number of power generation tiles in each satellite module, and the number of satellite modules in the solar power station may be determined based on, among other factors, power requirements, and/or payload restrictions. A factor that can impact the size of an overall solar power station is the power to be generated at the power receiving rectenna. As illustrated in FIG. 6a, the power incident on the ground using a far-field RF emission can have a maximum power lobe ($u_{max}$) that is dependent on factors including (but not limited to) the size of the array, the wavelength of the RF transmission, and the phase offset error tolerated within the phased array. For example, in embodiments of a 50×50 array of satellite modules in a solar power station formed by 60×60 m satellite modules a maximum power lobe of 926 W/m² is estimated to be generated on the ground with a sidelobe level of 44 W/m². The incident area of the maximum power lobe with a 1 GHz emission is estimated to have a diameter of 6.6 km, while the incident area is estimated to have a diameter of 2.8 km for a 2.4 GHz emission. From a power transmission point of view, the preferred number of elements in the antenna array formed by a space-based solar power station and the wavelength of the transmission will depend on the size of the receiving rectenna and/or array of receiving rectennas. As shown in FIG. 6b, the efficiency of power transmission systems using different spacing of transmit antennas increases with the increased size of the receiver array. In many embodiments it is desirable to have the maximum power lobe on the ground coextensive with the rectenna area. In other embodiments, a rectenna area that is larger or smaller than the maximum power lobe can be utilized as appropriate to the requirements of specific applications. The manner in which the efficiency of power transmission is impacted by both the size of the array of antenna elements utilized to form the ground spot and the size of the rectenna array utilized to receive the transmitted power in accordance with various embodiments of the invention is illustrated in FIG. 6c. As can also be expected, the efficiency of the power transmission system increases with decreased spacing of the elements in the rectenna array.

Figure 6D:
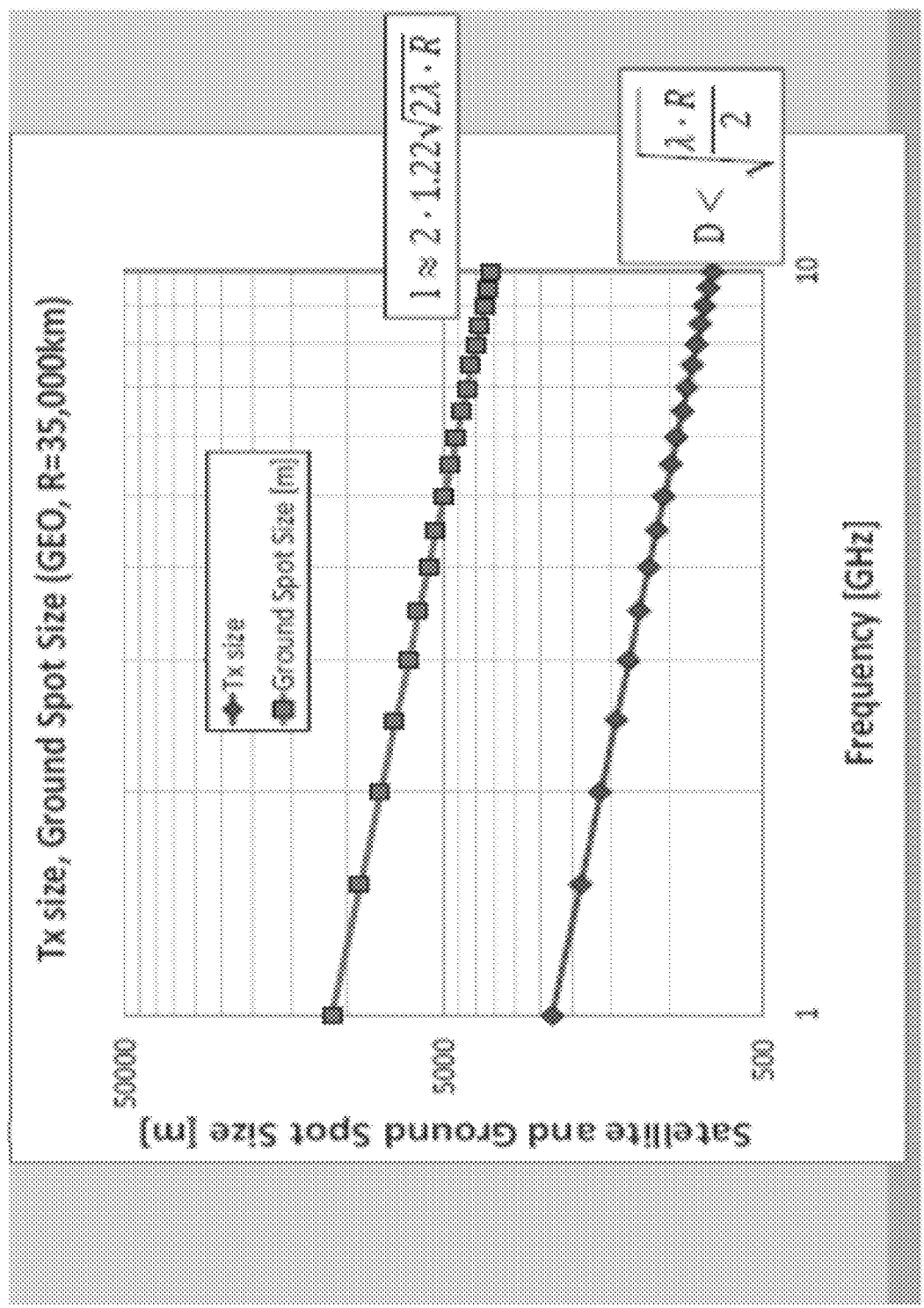
FIGS. 6d and 6e conceptually illustrate the manner in which the frequency of the transmitted power signal impacts the spot size of the maximum power lobe generated by space-based solar power stations located in geosynchronous and Low Earth Orbits (LEO).
Figure 6E:
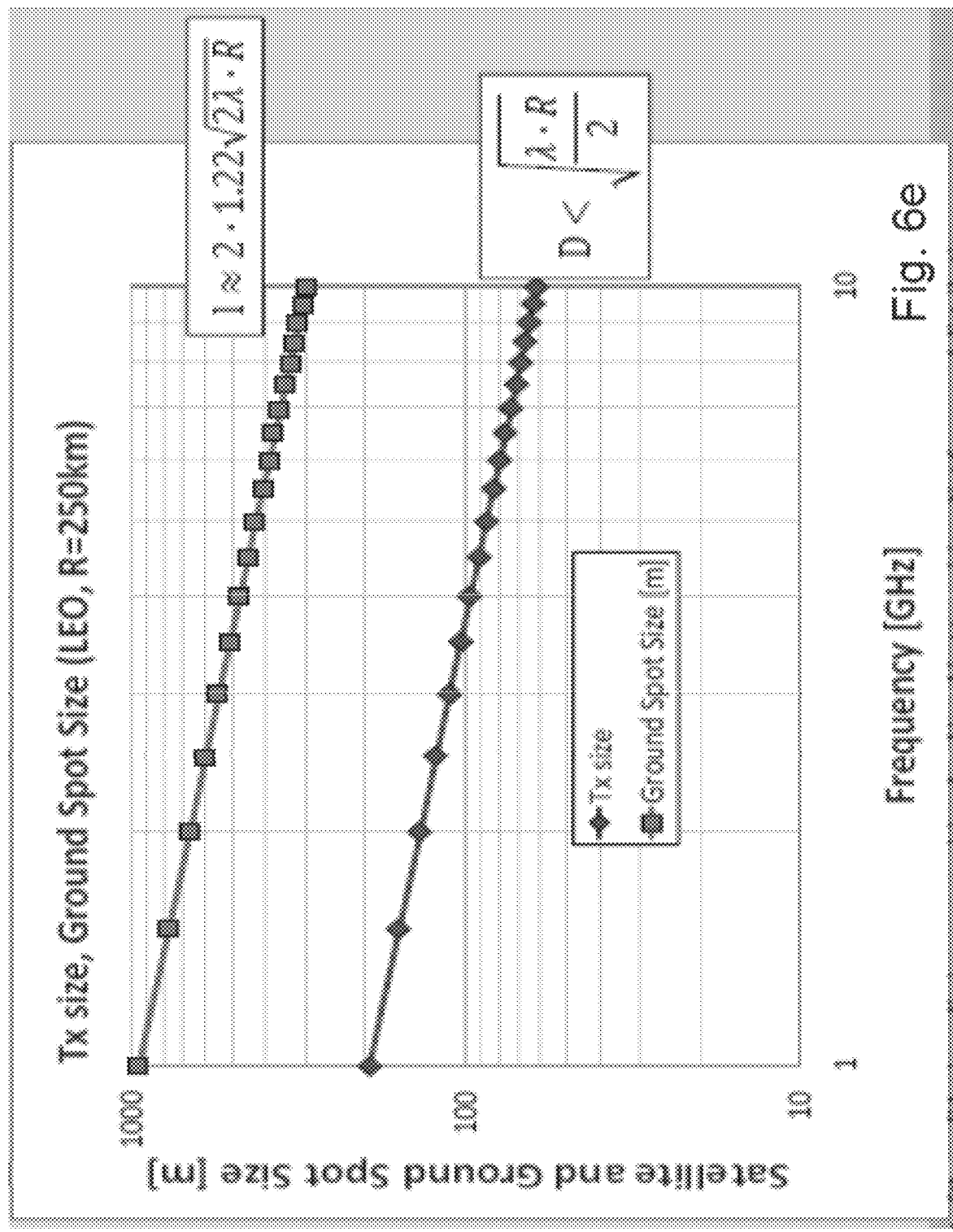

The manner in which the frequency of the transmitted power signal impacts the spot size of the maximum power lobe generated by space-based solar power stations constructed in accordance with embodiments of the invention and located in geosynchronous and Low Earth Orbits (LEO) is illustrated in FIGS. 6d and 6e. As can readily be appreciated ground spot size decreases with increased transmission frequency.

Figure 6F:
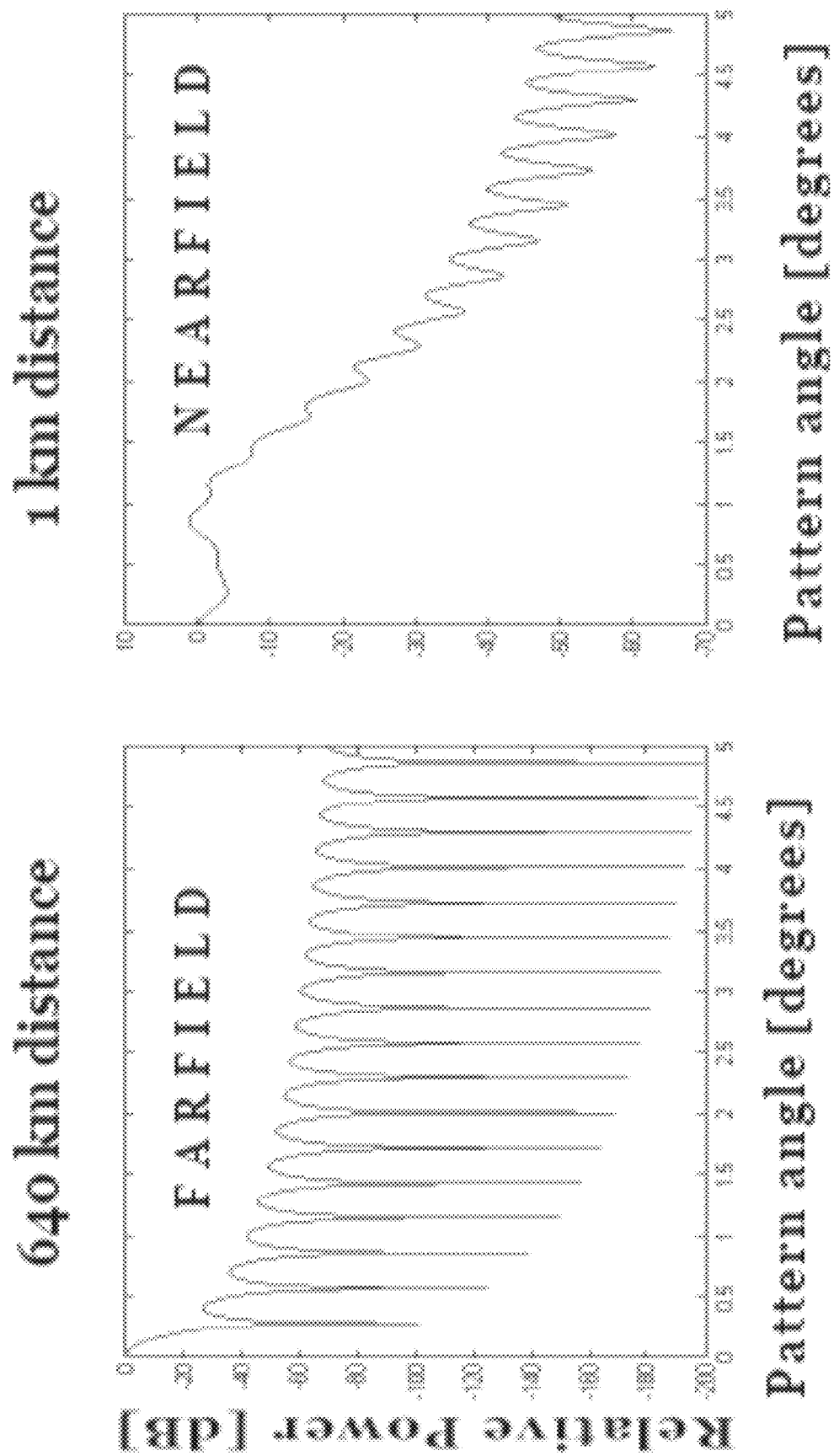
FIG. 6f conceptually illustrates that the pattern angle of the radiation pattern of an antenna in the near-field is much larger than the pattern angle of the radiation pattern of the antenna array in the far-field.
Figure 6G:
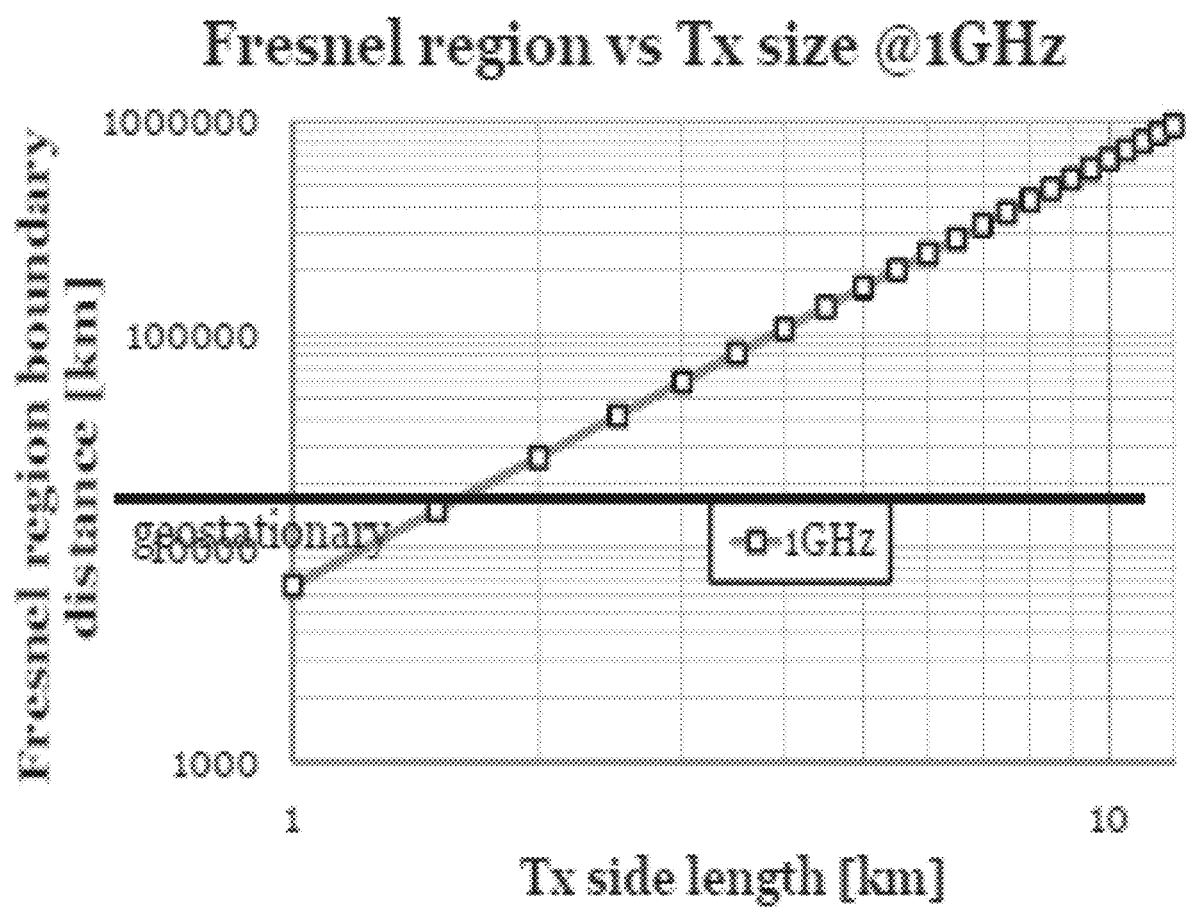
FIG. 6g conceptually illustrates the relationship between the Fresnel region boundary and the size of the transmitter array at 1 GHz.

The frequency of the transmitted power can also impact the distance of the Fresnel region boundary of the antenna array. The Fresnel region on an antenna or antenna array is the radiative near-field region of the transmitted RF signal. The Fresnel region boundary defines the boundary between the near-field and the far-field of the antenna or antenna array. As is illustrated in FIG. 6f, the pattern angle of the radiation pattern of an antenna in the near-field is much larger than the pattern angle of the radiation pattern of the antenna array in the far-field. Therefore, greater power transmission efficiency can be achieved using smaller rectenna arrays by designing an antenna array with a Fresnel region boundary that is less than the distance between the space-based solar power station and the receiver array. The relationship between the Fresnel region boundary and the size of the transmitter array at 1 GHz is illustrated in FIG. 6g. The altitude of a geostationary orbit is indicated on the chart shown in FIG. 6g, which suggests that arrays with side lengths exceeding 2 km will be less efficient than arrays having side lengths that are 1.5 km or less.

Comparative Performance

A number of alternative space-based solar power generation satellites have been proposed. Table 1 compares the published performance of various proposed solar power generation satellites with the estimated performance of a 60 m×60 m space-based solar power station constructed in accordance with various embodiments of the invention.

TABLE 1

| | | SPS Configuration Parameters | | | |
|---|---|---|---|---|---|
| Efficiency Standards | | SPS Configuration | W/kg | Max Size | Exemplary Phased Array System Performance* |
| Solar Cell Efficiency | 35% | | | | |
| DC-Microwave Conversion | 78% | USEF | 41 | 100 × 95 m | Power Received 12 GW |
| Collection Efficiency | 86% | JAXA | 98 | 3.5 km | Power Received/Module 1.72 MW |
| Transmission Efficiency | 77% | ESA | 132 | 15 km | Power Received Rectenna 1.34 GW |
| Atmospheric Absorption | <2% | Alpha | 33 | 6 km | Rectenna size: 6.65 km |
| Overall | 14% | Space-Based Solar Power Station | 2270 | 60 × 60 m | Total mass (avg: 100 g/m$^2$) 900000 kg |

*Assuming a Solar Power Station having a 50 × 50 array of 60 × 60 m satellite modules in a geosynchronous orbit with a 1 GHz power transmission having a a/λ = 0.5, and a solar irradiance of 1400 W/m$^2$.

The Exemplary Phased Array System Performance in Table 1 are estimates and may differ based on the actual design parameters implemented. As can readily be appreciated, however, the performance of the 60 m×60 m space-based solar power station constructed in accordance with embodiments of the invention provides a vastly improved W/kg performance relative to other proposed systems.

Generating Multiple Power Transmission Beams

Figure 7:
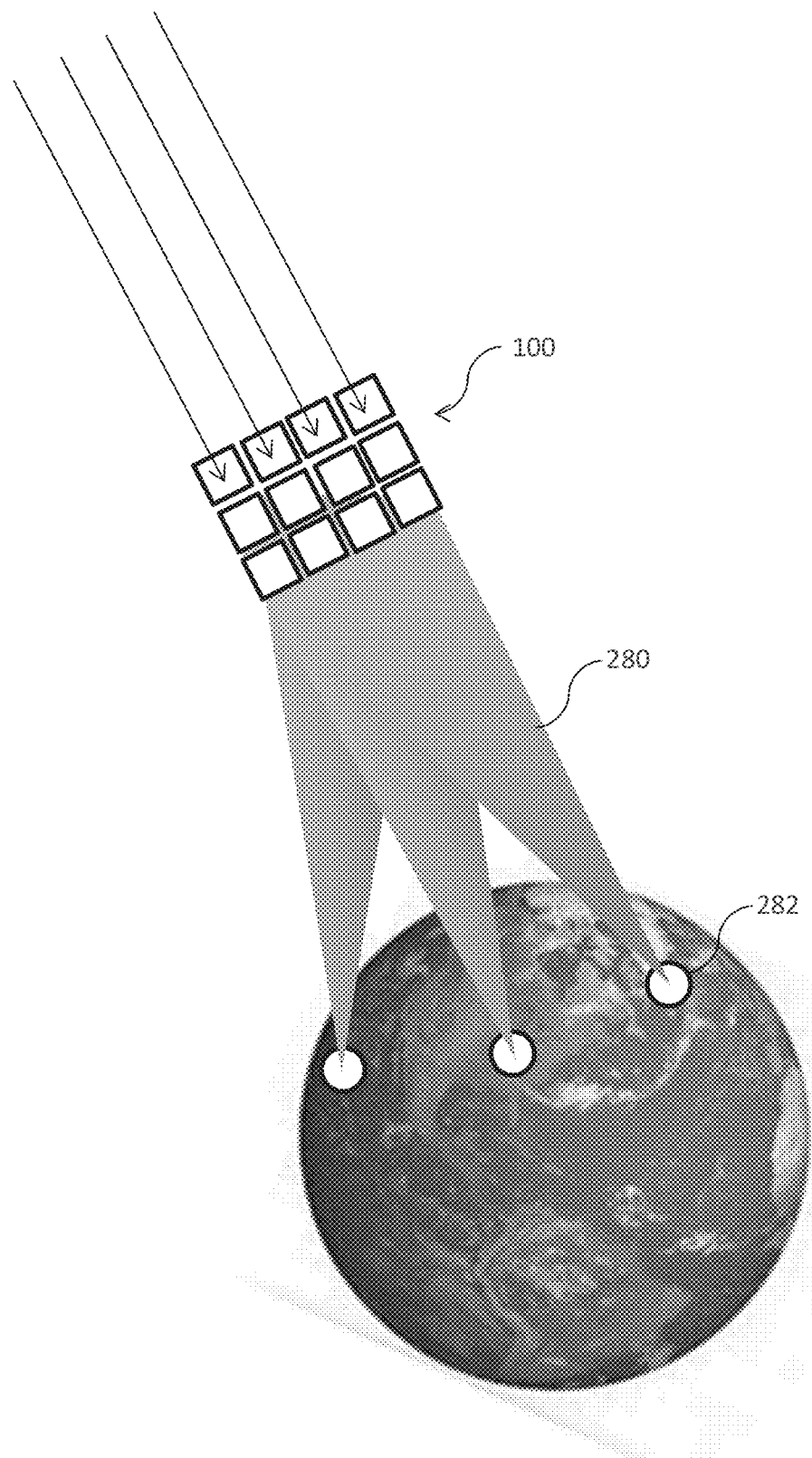
FIG. 7 conceptually illustrates dynamic power allocation from a large-scale space-based solar power system, according to one embodiment.
Figure 8A:
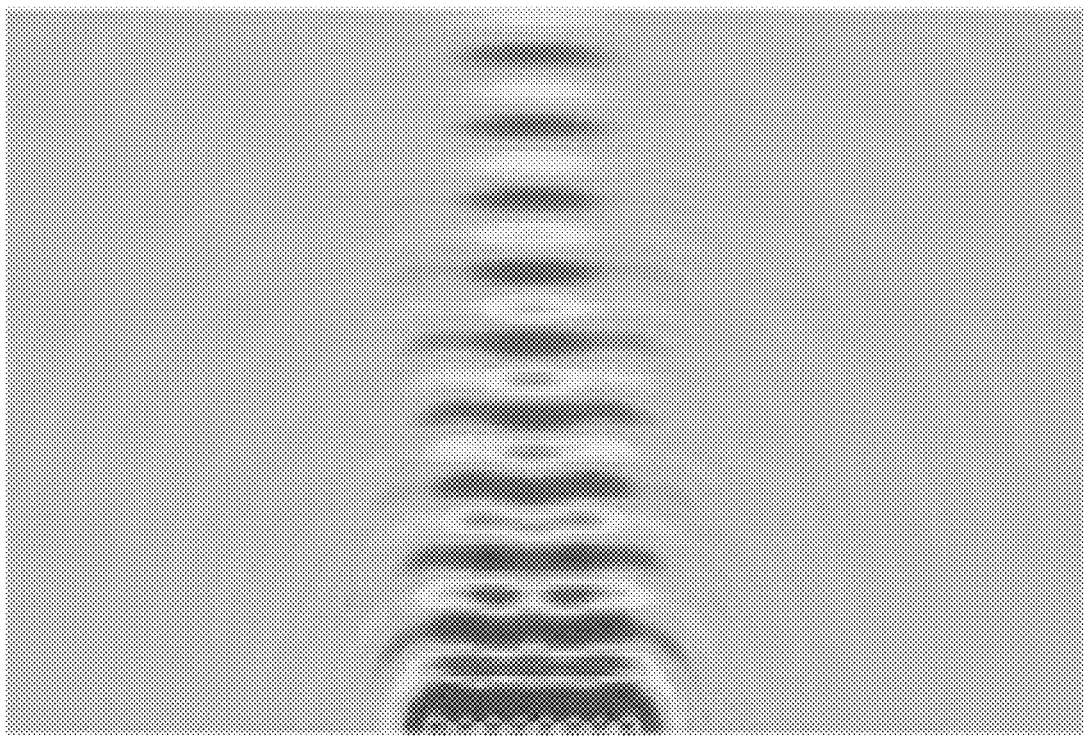
FIGS. 8a and 8b conceptually illustrate electronic beam steering using relative phase offset between elements of a phased array, according to one embodiment.
Figure 8B:
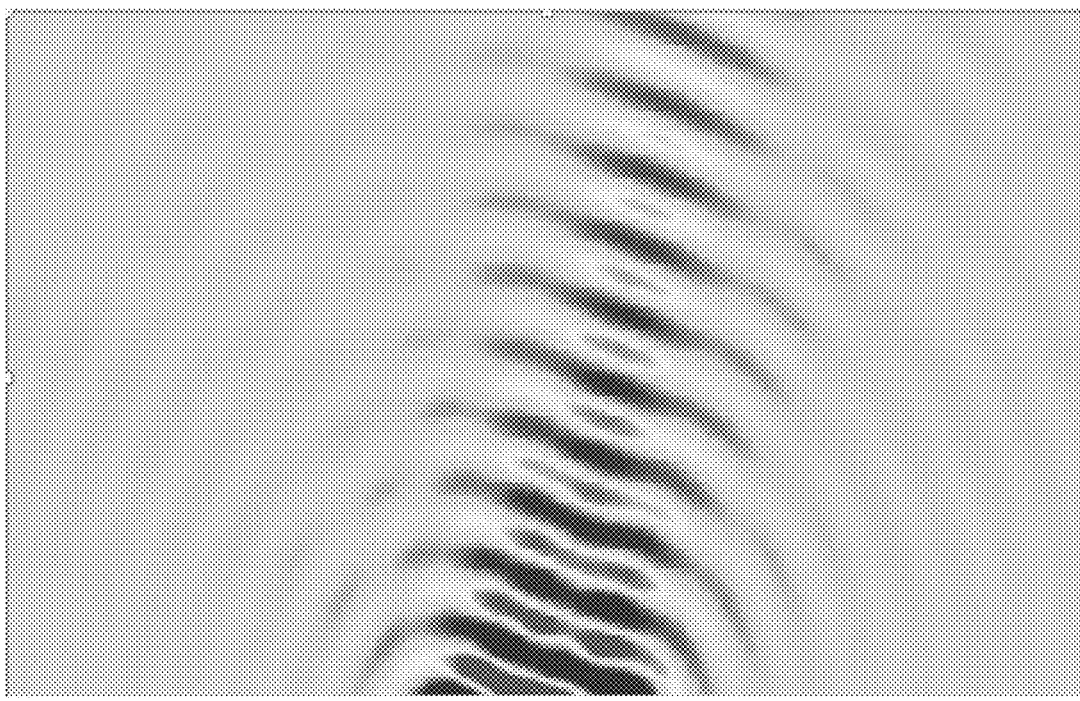

The power transmission output 280 of the space-based solar power station 100 can be split between different rectenna power receivers 282, as illustrated conceptually in FIG. 7. In many embodiments, different collections of elements (e.g., satellite modules and/or power generation tiles) forming part of the space-based solar power station 100 may be configured into different phased arrays that may be simultaneously directed at different rectenna power receivers 282 thus potentially reducing the individual incident areas radiated by the solar power station. In some embodiments additional control circuitry is provided either within the satellite module or within each of the power generation tiles to allow for dynamic electronic steering of the transmission beam, either from the collective power generation tiles of a satellite module or from each power generation tile independently. In some embodiments, the power steering circuitry may allow for the control of the relative timing (phase) of the various power transmitters on the power generation tile array elements, as illustrated conceptually in FIGS. 8a and 8b, such that each transmission beam may be redirected electronically at micro- and/or nano-second time scales. The power transmission from such dynamically steerable phased array on a solar power station allows for the entire phased array or portions thereof to be dynamically redirected in different directions dependent on demand at one or more rectenna power receivers. Embodiments of such dynamically directable phased arrays on power solar stations, may be used to redirect the power transmission in different directions at micro and nano-second time scales by electronic steering. Embodiments also allow for power transmissions to be dynamically distributed to various ground stations either simultaneously or sequentially based on instantaneous local demand. Power levels at each of such rectenna receivers may also be dynamically adjusted. Rapid time domain switching of power amongst rectenna receivers can also be used to control duty cycle and alleviate large scale AC synchronization issues with respect to an overall power grid.

A second factor that may constrain the number of array elements in any satellite module is the issue of payload size and weight. Current payload delivery technologies for geosynchronous orbits range from 2,000 to 20,000 kg. Accordingly, the limit to the size of any single satellite module is the actual lift capacity of available payload delivery vehicles. Based on an assumption of 100 g/m$^2$ for the phased array satellite modules according to embodiments, a 60×60 m satellite module would have a weight of 360 kg, well within the limits of current delivery technologies. Larger satellite modules could be produced provided they are within the lift capacity of available lift vehicles.

Figure 9A:
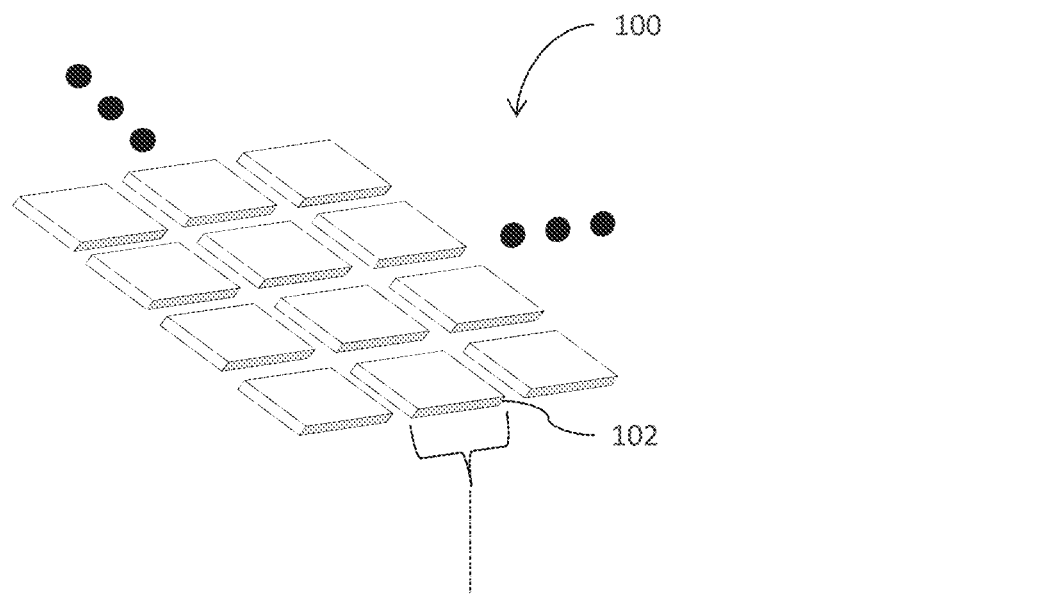
FIG. 9a conceptually illustrates a large-scale space-based solar power station and a compactable satellite module in a deployed configuration, according to embodiments.
Figure 9B:
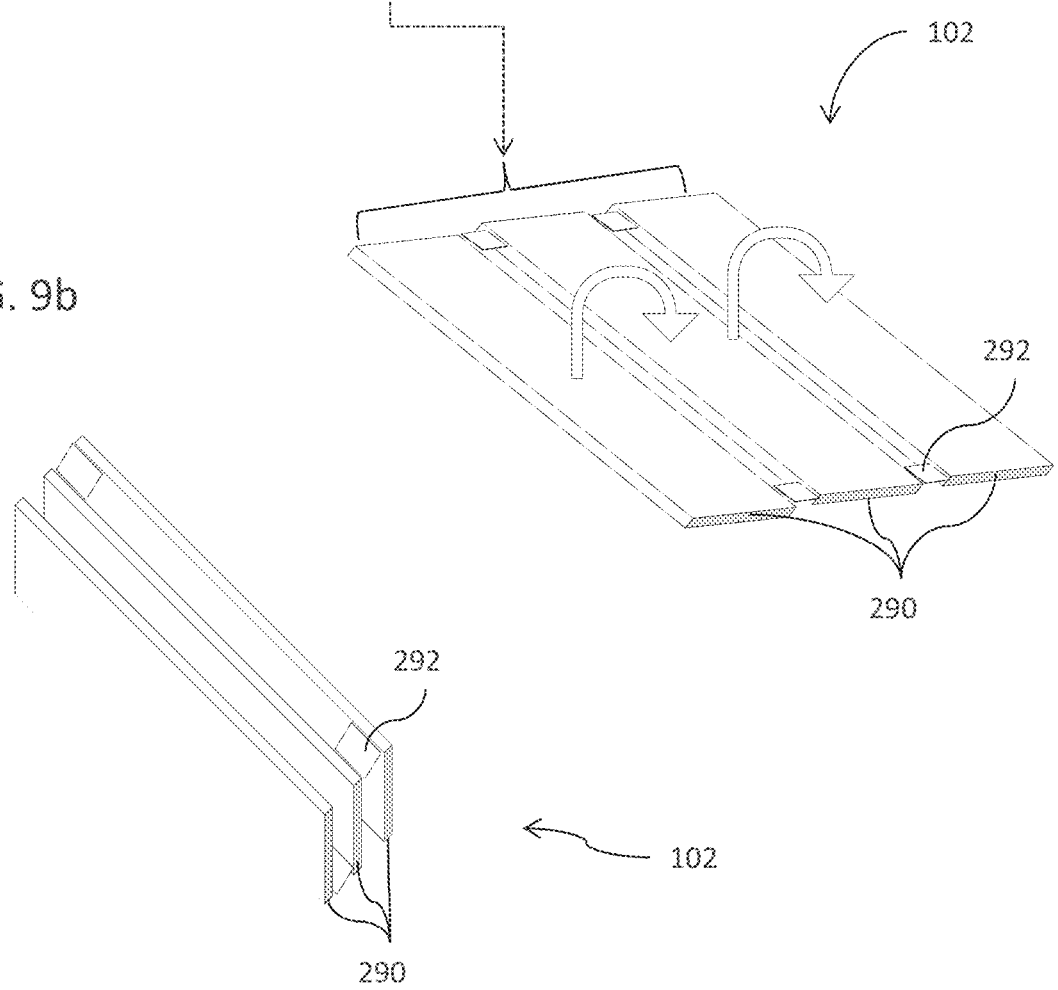
FIG. 9b conceptually illustrates a retracted compactable satellite module, according to FIG. 9a in a retracted configuration.

In some embodiments, satellite modules are compactable such that the size of the satellite module in one or more dimensions may be reduced during delivery to overcome payload space constraints and then expanded into its final operating configuration. As illustrated in FIGS. 9a and 9b, in many embodiments the solar power station 100 includes an array of satellite modules 102, each satellite module comprising a plurality of structural elements 290 that are movably interconnected such that the plurality of structural elements may be moved between at least two configurations: a deployed configuration (FIG. 9a) and a compacted configuration (9b), such that the ratio of the packaged volume to the material volume is larger in the deployed configuration when compared to the compacted or packaged configuration. In a number of embodiments, the structural elements 290 may be hinged, tessellated, folded or otherwise interconnected 292 such that the structural elements can move in relation to each other between the compacted and deployed configurations. Each satellite module of a solar power station may be configured to compact to the same or different sizes. In addition, different compacting methods may be used to compact one or more satellite modules of a solar space station, including, among others, one and two-dimensional compaction structures. In some embodiments, one or a combination of z-folding, wrapping, rolling, fan-folding, double z-folding, Miura-ori, slip folding and symmetric wrapping may be used, among others.

In many embodiments, the power generation tiles may have further compactible and expandable features and structures disposed thereon. In some embodiments of power generation tiles, the photovoltaic cell and power transmitter may be movably interrelated through a compactable structure, such that when in a compacted or packaged configuration the elements of the power generating cell are compressed together to occupy a total volume lower than when in a deployed configuration. In some deployed configurations the photovoltaic cell and power transmitter are separated by a gap (e.g., to create a vertical offset therebetween). Embodiments of compactable structure include motorized interconnections and resilient members such as spring or tension arms that are bent or under compression, among others. Such compactable structures may also incorporate packaging techniques such as one or a combination of z-folding, wrapping, rolling, fan-folding, double z-folding, Miura-ori, slip folding and symmetric wrapping may be used, among others.

The power generation tiles and/or satellite modules may include other structures to enhance the collection of solar radiation or transmission of power from the power generation tiles and/or satellite modules. Embodiments of structures that may be incorporated into power generation tiles and/or satellite modules may include, among others, thermal radiators for controlling the thermal profile of the power generation tiles, light-collecting structures (e.g., radiators, reflectors and collectors) to enhance the efficiency of solar radiation collection to the photovoltaic cell, and radiation shielding to protect the photovoltaic cells, power transmitters and/or control electronics from space radiation. Such structures may also be independently compactible, between packaged and deployed configurations, as described above in relation to other elements of the power generation tiles.

A design for a satellite module or power generation tile may be applied to different satellite modules or power generation tiles. Other variables in the solar power station such as spatial distances, photovoltaics, power transmitter, control electronics and combinations with may be modified to produce a phased array with differing power collection and transmission characteristics. In this way, a diverse mix of solar power stations may be produced while maintaining the benefits of the modular solar power station described.

Although various designs of compatible satellite modules are described above, any of a variety of compactible space structures can be utilized in the construction of space-based solar power stations as appropriate to the requirements of specific applications in accordance with embodiments of the invention including (but not limited to) the various compactible space structures disclosed in U.S. patent application Ser. No. 14/712812. The disclosure of U.S. patent application Ser. No. 14/712812, is hereby incorporated by reference in its entirety, and more specifically the disclosure relevant to compactible space structures is incorporated herein by reference in its entirety.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A space-based solar power station comprising:
a plurality of unconnected satellite modules disposed in space in an orbital array formation;
wherein a plurality of power generation tiles is disposed on and forms an independent array on each of the plurality of satellite modules, wherein each of the plurality of power generation tiles has a position relative to that of other power generation tiles in the independent array;
wherein the plurality of power generation tiles, disposed on and forming the independent array, on each of the plurality of satellite modules comprises:
at least one photovoltaic cell disposed on each of the power generation tiles; and
at least one power transmitter collocated with the at least one photovoltaic cell on each of the power generation tiles and in signal communication therewith such that an electrical current generated by the collection of solar radiation by the at least one photovoltaic cell powers the at least one power transmitter,
where each of the at least one power transmitters comprises:

an antenna; and separate control electronics that independently controls at least the phase of a radio frequency power signal by applying a phase offset with respect to a received reference signal to form a phased array configured to provide a steerable beam of transmitted power, wherein the reference signal is received by the power generation tile, wherein the phase offset applied to the reference signal by the separate control electronics is determined by a path length travelled by the reference signal to reach the separate control electronics and the relative position between the antenna of a power generation tile which received the reference signal and the position of the antenna on at least one of the other power generation tiles within the same independent array, wherein the reference signal is used to coordinate the at least one power transmitter with at least one other power transmitter on at least one other power generation tile of the plurality of power generation tiles on the same satellite module.

2. The space-based solar power station of claim 1, wherein the separate control electronics further controls the amplitude of the radio frequency power signal that feeds the antenna so that the power transmitter is coordinated with power transmitters on other power generation tiles.

3. The space-based solar power station of claim 1, wherein at least one of the plurality of satellite modules comprises a receiver to wirelessly receive the reference signal.

4. The space-based solar power station of claim 3, wherein the receiver of the at least one of the plurality of satellite modules is configured to wirelessly receive the reference signal from an Earth-based transmitter.

5. The space-based solar power station of claim 3, further comprising:
a reference signal transmitter satellite comprising a transmitter that transmits the reference signal; and
wherein the receiver of the at least one of the plurality of satellite modules is configured to wirelessly receive the reference signal from transmitter on the reference signal transmitter satellite.

6. The space-based solar power station of claim 3, wherein the receiver to wirelessly receive the reference signal comprises an amplifier, and a cleanup phase locked loop.

7. The space-based solar power station of claim 3, wherein each of the at least one of the plurality of satellite modules also includes transmission lines that route the reference signal to at least one power transmitter on a given satellite module of the at least one of the plurality of satellite modules.

8. The space based solar power station of claim 7, wherein the transmission lines comprise transmission lines that route the reference signal between immediately adjacent power transmitters that do not receive the reference signal from another power transmitter of the at least one other power transmitter.

9. The space-based solar power station of claim 1, wherein the separate control electronics determines a phase shift to apply with respect to a received reference signal based upon location information.

10. The space-based solar power station of claim 9, wherein the location information is selected from the group consisting of absolute location information, and relative location information.

11. The space-based solar power station of claim 9, wherein the location information defines a position in space and an orientation.

12. The space-based solar power station of claim 9, wherein the separate control electronics is configured to receive the location information.

13. The space-based solar power station of claim 12, wherein a first satellite module of the plurality of satellite modules comprises a receiver to receive at least one ranging signal and determine location information indicating the location of the space-based solar power station.

14. The space-based solar power station of claim 13, wherein:
a second satellite module of the plurality of satellite modules comprises a receiver configured to:
receive the location information indicating the location of the space-based solar power station;
receive at least one ranging signal; and
determine location information indicating the location of the second satellite module.

15. The space-based solar power station of claim 14, wherein:
at least one of the plurality of satellite modules comprises a plurality of power generation tiles that form a panel; and
the panel comprises a receiver configured to:
receive the location information including information indicating the location of a given satellite module in the at least one of the plurality of satellite modules to which the panel belongs;
receive at least one ranging signal;
determine location information indicating the location of the panel; and
provide the location information indicating the location of the panel to the power transmitters on the plurality of power generation tiles that form the panel.

16. The space-based solar power station of claim 13, wherein the at least one ranging signal is transmitted from at least one Earth-based transmitter.

17. The space-based solar power station of claim 13, wherein the at least one ranging signal is transmitted from at least one space-based transmitter.

18. The space-based solar power station of claim 1, wherein the separate control electronics is contained within an integrated circuit comprising:
an RF synthesizer configured to generate an RF signal based upon a received reference signal;
a phase adjuster configured to phase shift an RF signal received from the RF synthesizer by an amount determined by a control signal;
a power amplifier configured to amplify a phase shifted RF signal received from the phase adjuster; and
a digital signal processor configured by software stored in memory to generate the control signal for the phase adjuster.

19. A satellite module, comprising:
a plurality of power generation tiles disposed on and forming an independent array on the satellite module, wherein each of the plurality of power generation tiles has a position relative to that of other power generation tiles in the independent array, wherein the plurality of power generation tiles disposed on and forming the independent array on the satellite module comprises:
at least one photovoltaic cell disposed on each of the power generation tiles; and
at least one power transmitter collocated with the at least one photovoltaic cell on each of the power generation tiles and in signal communication therewith such that an electrical current generated by the collection of solar radiation by the at least one photovoltaic cell powers the at least one power transmitter, where each of the at least one power transmitters comprises:

an antenna; and separate control electronics that independently controls at least the phase of a radio frequency power signal by applying a phase offset with respect to a received reference signal to form a phased array configured to provide a steerable beam of transmitted power, wherein the reference signal is received by the power generation tile, wherein the phase offset applied to the reference signal by the separate control electronics is determined by a path length travelled by the reference signal to reach the separate control electronics and the relative position between the antenna of a power generation tile which received the reference signal and the position of the antenna on at least one of the other power generation tiles within the same independent array, wherein the reference signal is used to coordinate the at least one power transmitter with at least one other power transmitter on at least one other power generation tile of the plurality of power generation tiles.

20. A power generation tile, comprising:

at least one photovoltaic cell disposed on the power generation tile; and at least one power transmitter on the power generation tile and collocated with the at least one photovoltaic cell and in signal communication therewith such that an electrical current generated by the collection of solar radiation by the at least one photovoltaic cell powers the at least one power transmitter, where each of the at least one power transmitters comprises:

an antenna; and separate control electronics that independently controls at least the phase of a radio frequency power signal by applying a phase offset with respect to a received reference signal that feeds the antenna based on the reference signal received by the power generation tile, wherein the phase offset applied to the reference signal by the separate control electronics is determined by a path length travelled by the reference signal to reach the separate control electronics and a relative position between the antenna of the power generation tile which received the reference signal and a position of an antenna on at least one other power generation tile within a same independent array.

* * * * *